United States Patent
Fukami et al.

(10) Patent No.: US 11,912,808 B2
(45) Date of Patent: Feb. 27, 2024

(54) CURABLE COMPOSITION, CURED PRODUCT, COLOR FILTER, SOLID-STATE IMAGING ELEMENT, AND IMAGE DISPLAY DEVICE

(71) Applicant: FUJIFILM Corporation, Tokyo (JP)

(72) Inventors: Yutaro Fukami, Shizuoka (JP); Junichi Ito, Shizuoka (JP); Yushi Kaneko, Shizuoka (JP); Hiromu Koizumi, Shizuoka (JP); Kazuya Oota, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 157 days.

(21) Appl. No.: 17/482,422

(22) Filed: Sep. 23, 2021

(65) Prior Publication Data

US 2022/0010049 A1    Jan. 13, 2022

Related U.S. Application Data

(63) Continuation of application No. PCT/JP2020/012141, filed on Mar. 18, 2020.

(30) Foreign Application Priority Data

Mar. 27, 2019 (JP) .................. 2019-061005
Jan. 22, 2020 (JP) .................. 2020-008312

(51) Int. Cl.

| | | |
|---|---|---|
| *C08F 299/02* | (2006.01) | |
| *C08F 220/28* | (2006.01) | |
| *C08F 220/30* | (2006.01) | |
| *C08F 2/50* | (2006.01) | |
| *C08F 220/58* | (2006.01) | |
| *C08K 5/00* | (2006.01) | |
| *C08K 5/33* | (2006.01) | |
| *C08K 5/3415* | (2006.01) | |
| *G02F 1/1335* | (2006.01) | |

(52) U.S. Cl.
CPC .......... *C08F 299/028* (2013.01); *C08F 2/50* (2013.01); *C08F 220/283* (2020.02); *C08F 220/303* (2020.02); *C08F 220/58* (2013.01); *C08K 5/0041* (2013.01); *C08K 5/33* (2013.01); *C08K 5/3415* (2013.01); *G02F 1/133514* (2013.01)

(58) Field of Classification Search
CPC ...... C08F 2/48; C08F 2/50; C08F 8/18; C08F 220/283; C08F 220/303; C08F 220/58; C08F 290/061; C08F 290/126; C08F 293/005; C08F 299/00; C08F 299/028; C08F 2438/01; C08F 2438/03; C08K 5/0041; C08K 5/33; C08K 5/3415; C09J 133/068; G02B 5/20; G02F 1/133514; G03F 7/004; G03F 7/038
See application file for complete search history.

(56) References Cited

U.S. PATENT DOCUMENTS

| | | |
|---|---|---|
| 6,514,644 B2 | 2/2003 | Yamagata et al. |
| 2019/0300694 A1 | 10/2019 | Takahashi et al. |
| 2020/0369810 A1 | 11/2020 | Ito et al. |
| 2021/0382388 A1* | 12/2021 | Ito .................. H01L 27/146 |

FOREIGN PATENT DOCUMENTS

| | | |
|---|---|---|
| JP | 2001343517 | 12/2001 |
| JP | 2009084450 | 4/2009 |
| WO | 2018142804 | 8/2018 |
| WO | 2018159458 | 9/2018 |
| WO | 2019163505 | 8/2019 |

OTHER PUBLICATIONS

"International Search Report (Form PCT/ISA/210) of PCT/JP2020/012141," dated May 26, 2020, with English translation thereof, pp. 1-5.
"Written Opinion of the International Searching Authority (Form PCT/ISA/237)" of PCT/JP2020/012141, dated May 26, 2020, with English translation thereof, pp. 1-11.
"Office Action of Japan Counterpart Application" with English translation thereof, dated Apr. 19, 2022, p. 1-p. 5.

* cited by examiner

*Primary Examiner* — Sanza L. McClendon
(74) *Attorney, Agent, or Firm* — JCIPRNET

(57) ABSTRACT

Provided are a curable composition including, a block copolymer including a block A which has a constitutional unit having an ethylenically unsaturated group in a side chain of a polymer compound, a pigment, and, a photopolymerization initiator, in which a content of a polymerizable compound is 15 mass % or less with respect to a total solid content of the curable composition; a cured product of the curable composition; a color filter including the cured product; and a solid-state imaging element or an image display device including the color filter.

15 Claims, No Drawings

CURABLE COMPOSITION, CURED PRODUCT, COLOR FILTER, SOLID-STATE IMAGING ELEMENT, AND IMAGE DISPLAY DEVICE

CROSS-REFERENCE TO RELATED APPLICATIONS

This application is a Continuation of International Application No. PCT/JP2020/012141 filed on Mar. 18, 2020, which claims priority to Japanese Patent Application No. 2019-061005 filed on Mar. 27, 2019 and Japanese Patent Application No. 2020-008312 filed on Jan. 22, 2020. The entire contents of these applications are incorporated herein by reference.

BACKGROUND OF THE INVENTION

1. Field of the Invention

The present disclosure relates to a curable composition, a cured product, a color filter, a solid-state imaging element, and an image display device.

2. Description of the Related Art

A color filter is an indispensable component for a solid-state imaging element and an image display device. The solid-state imaging element and the image display device may generate noise due to the reflection of visible light. Therefore, a light shielding film may be provided on the solid-state imaging element or the image display device to suppress the generation of noise.

As a method for producing such a color filter or a light shielding film, a method in which a coloring composition layer is formed using a curable composition including a colorant, a polymerizable compound, a photopolymerization initiator, and an alkali-soluble resin, and the coloring composition layer is exposed and developed to form a pattern has been known.

As a known pigment dispersion composition in the related art, a pigment dispersion composition disclosed in JP2009-84450A or JP2001-343517A has been known.

JP2009-84450A discloses a pigment dispersion composition containing a polymer compound (A) having one or more partial structures selected from a lactone structure and an acid anhydride structure, having a weight-average molecular weight of 1,000 to 100,000, and having a block type, graft type, or terminal-modified type structure, and a pigment (B).

JP2001-343517A discloses a pigment dispersion composition for a color filter containing at least a pigment, a pigment dispersing agent, a binder resin, a reactive compound, and a solvent, in which the binder resin is a compound having a pigment adsorption block including a pigment adsorbing group and not including a reactive group, and having a reactive block including a reactive group and not including a pigment adsorbing group.

SUMMARY OF THE INVENTION

An object to be achieved by the embodiment according to the present disclosure is to provide a curable composition having excellent developability and adhesiveness of a cured product to be obtained.

Another object to be achieved by the embodiment according to the present disclosure is a cured product of the above-described curable composition, a color filter including the cured product, and a solid-state imaging element or an image display device including the color filter.

Methods for achieving the objects described above include the following aspects.

<1> A curable composition comprising:
a block copolymer including a block A which has a constitutional unit having an ethylenically unsaturated group in a side chain;
a pigment; and
a photopolymerization initiator,
in which a content of a polymerizable compound is 15 mass % or less with respect to a total solid content of the curable composition.

<2> The curable composition according to <1>, in which the pigment is a pigment having a maximal absorption wavelength in a wavelength range of 400 nm to 2,000 nm.

<3> The curable composition according to <1> or <2>, in which the pigment is a pigment having a maximal absorption wavelength in a wavelength range of 400 nm to 700 nm.

<4> The curable composition according to any one of <1> to <3>,
in which the pigment includes a red pigment.

<5> The curable composition according to any one of <1> to <4>,
in which a content of the block A is 40 mass % to 95 mass % with respect to a total mass of the block copolymer.

<6> The curable composition according to any one of <1> to <5>,
in which the constitutional unit having an ethylenically unsaturated group in a side chain in the block A includes a constitutional unit represented by Formula (1).

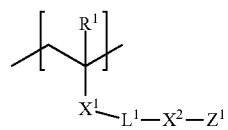

(1)

In Formula (1), $R^1$ represents a hydrogen atom, a halogen atom, or an alkyl group, $X^1$ and $X^2$ each independently represent a single bond or a divalent linking group, $L^1$ represents a polyether chain, a polyester chain, a polyamide chain, a polyimide chain, a polyimine chain, a polyurethane chain, or a resin chain in which two or more of these resin chains are combined, and $Z^1$ represents an ethylenically unsaturated group.

<7> The curable composition according to <6>,
in which a content of the constitutional unit represented by Formula (1) is 0.1 mass % to 50 mass % with respect to a total mass of the block A.

<8> The curable composition according to any one of <1> to <7>,
in which the ethylenically unsaturated group in the constitutional unit having an ethylenically unsaturated group in a side chain is an acryloxy group.

<9> The curable composition according to any one of <1> to <8>,
in which the block copolymer further includes a block B which has a constitutional unit having a steric repulsive group in a side chain.

<10> The curable composition according to <9>, in which the block B includes an acrylic resin chain.

<11> The curable composition according to any one of <1> to <10>, in which a weight-average molecular weight of the block copolymer is 8,000 to 30,000.

<12> The curable composition according to any one of <1> to <11>, in which an acid value of the block copolymer is 20 mgKOH/g to 200 mgKOH/g.

<13> The curable composition according to any one of <1> to <12>, in which an ethylenically unsaturated bonding value of the block copolymer is 0.1 mmol/g to 1.0 mmol/g.

<14> A cured product obtained by curing the curable composition according to any one of <1> to <13>.

<15> A color filter comprising:
the cured product according to <14>.

<16> A solid-state imaging element comprising:
the color filter according to <15>.

<17> An image display device comprising:
the color filter according to <15>.

According to the embodiment according to the present disclosure, a curable composition having excellent developability and adhesiveness of a cured product to be obtained is provided.

According to another embodiment according to the present disclosure, a cured product of the above-described curable composition, a color filter including the cured product, and a solid-state imaging element or an image display device including the color filter are provided.

DESCRIPTION OF THE PREFERRED EMBODIMENTS

Hereinafter, the content of the present disclosure will be described in detail. The configuration requirements will be described below based on the representative embodiments of the present disclosure, but the present disclosure is not limited to such embodiments.

In the present disclosure, a term "to" showing a range of numerical values is used as a meaning including a lower limit value and an upper limit value disclosed before and after the term.

In a range of numerical values described in stages in the present disclosure, the upper limit value or the lower limit value described in one range of numerical values may be replaced with an upper limit value or a lower limit value of the range of numerical values described in other stages. In addition, in a range of numerical values described in the present disclosure, the upper limit value or the lower limit value of the range of numerical values may be replaced with values shown in the examples.

Further, in the present disclosure, in a case where a plurality of substances corresponding to each component in a composition is present, the amount of each component in the composition means the total amount of the plurality of substances present in the composition, unless otherwise specified.

In addition, regarding a term, group (atomic group) of this present disclosure, a term with no description of "substituted" and "unsubstituted" includes both a group not including a substituent and a group including a substituent. For example, "alkyl group" denotes not only an alkyl group having no substituent (unsubstituted alkyl group) but also an alkyl group having a substituent (substituted alkyl group).

In the present disclosure, unless otherwise specified, "Me" represents a methyl group, "Et" represents an ethyl group, "Pr" represents a propyl group, "Bu" represents a butyl group, and "Ph" represents a phenyl group.

In the present disclosure, the concept of "(meth)acryl" includes both acryl and methacryl, and the concept of "(meth)acryloyl" includes both acryloyl and methacryloyl.

In addition, in the present disclosure, a term "step" includes not only the independent step but also a step in which intended purposes are achieved even in a case where the step cannot be precisely distinguished from other steps.

In the present disclosure, a "total solid content" refers to a total mass of components obtained by removing a solvent from the whole composition of the composition. In addition, a "solid content" is a component obtained by removing a solvent as described above, and for example, the component may be solid or may be liquid at 25° C.

In addition, in the present disclosure, "mass %" is identical to "weight %" and "part by mass" is identical to "part by weight".

Further, in the present disclosure, a combination of two or more preferred aspects is a more preferred aspect.

In addition, the weight-average molecular weight (Mw) and the number-average molecular weight (Mn) in the present disclosure are molecular weights in terms of polystyrene used as a standard substance, which are detected by using a solvent tetrahydrofuran (THF), a differential refractometer, and a gel permeation chromatography (GPC) analyzer using TSKgel GMHxL, TSKgel G4000HxL, and TSKgel G2000HxL (all trade names manufactured by Tosoh Corporation) as columns, unless otherwise specified.

Hereinafter, the present disclosure will be described in detail.

(Curable Composition)

The curable composition according to the embodiment of the present disclosure includes a block copolymer including a block A which has a constitutional unit having an ethylenically unsaturated group in a side chain, a pigment, and a photopolymerization initiator, in which a content of a polymerizable compound is 15 mass % or less with respect to a total solid content of the curable composition.

In recent years, as the number of pixels of an image sensor has increased, the pattern has been finer and thinner. Along with this, in a case where the pigment concentration in the color filter increases relatively and the curable component decreases, the present inventors have found that, in the curable composition in the related art, a cured product to be obtained may not have sufficient adhesiveness to a substrate or the like.

Therefore, as a result of intensive studies, the present inventors have found that, by including the block copolymer which includes the block A having a constitutional unit having an ethylenically unsaturated group in the side chain, in which the content of the polymerizable compound is 15 mass % or less with respect to the total solid content of the curable composition, a cured product having excellent adhesiveness is obtained, and developability is also excellent.

By including the block copolymer which includes the block A having a constitutional unit having an ethylenically unsaturated group in the side chain, due to the block copolymer structure and the above-described block A structure, it is presumed that the ethylenically unsaturated group is less susceptible to the steric influence of other portions, than a resin having an ethylenically unsaturated group in the related art. In addition, since the ethylenically unsaturated group is polymerized together in the vicinity in at least one block (block A) of the block copolymer, it is presumed that the curable composition has excellent polymerizability. Further, it is presumed that the adhesiveness of the obtained cured product is excellent even in an aspect in which the content of the polymerizable compound is small, which is 15 mass % or less with respect to the total solid content of the curable composition.

In addition, since the curable composition according to the embodiment of the present disclosure contains the above-described block copolymer, it is considered that the curable composition according to the embodiment of the present disclosure is excellent in dispersion stability of the pigment, so that storage stability of the curable composition is also excellent.

Further, in the curable composition according to the embodiment of the present disclosure, by containing the above-described block copolymer, due to the block copolymer structure and the above-described block A structure, it is presumed that the ethylenically unsaturated group is less susceptible to the steric influence of a portion other than the ethylenically unsaturated group, than a resin having an ethylenically unsaturated group in the related art. In addition, since the ethylenically unsaturated group is polymerized together in the vicinity in at least one block (block A) of the block copolymer, it is presumed that boundaries between exposed portion and unexposed portion are clearer. Further, it is presumed that the developability is also excellent even in an aspect in which the content of the polymerizable compound is small, which is 15 mass % or less with respect to the total solid content of the curable composition.

Hereinafter, details of each component included in the curable composition according to the embodiment of the present disclosure will be described.

<Block Copolymer Including Block A>

The curable composition according to the embodiment of the present disclosure includes a block copolymer (hereinafter, also referred to as a "specific block copolymer") including a block A which has a constitutional unit having an ethylenically unsaturated group in a side chain.

In the present disclosure, the "main chain" represents a relatively longest binding chain in a molecule of a polymer compound constituting a resin, and the "side chain" represents an atomic group branched from the main chain.

<<Block A>>

The specific block copolymer includes a block A which has a constitutional unit having an ethylenically unsaturated group in the side chain.

A resin chain constituting the block A is not particularly limited, and examples thereof include an acrylic resin chain, a polyester chain, a polyether chain (preferably, a polyalkyleneoxy chain), a polyurethane chain, a polyurea chain, a polyamide chain, a polyimide chain, and a polyimine chain. In addition, the resin chain constituting the block A may be a resin chain in which two or more of these resin chains are combined.

Among these, from the viewpoint of storage stability, developability, and adhesiveness of a cured product to be obtained, the block A is preferably an acrylic resin chain, a polyester chain, or a polyether chain, and more preferably an acrylic resin chain or a polyester chain.

—Constitutional Unit Having Ethylenically Unsaturated Group in Side Chain—

The block A has a constitutional unit having an ethylenically unsaturated group in the side chain.

The constitutional unit having an ethylenically unsaturated group in the side chain may have only one ethylenically unsaturated group or two or more ethylenically unsaturated groups in one constitutional unit, but from the viewpoint of developability and adhesiveness of a cured product to be obtained, it is preferable to have one or two ethylenically unsaturated groups.

In addition, from the viewpoint of curability and developability, the above-described ethylenically unsaturated group is preferably a terminal ethylenically unsaturated group.

Further, from the viewpoint of curability and developability, the above-described ethylenically unsaturated group is preferably a mono- or di-substituted ethylenically unsaturated group, and more preferably a monosubstituted ethylenically unsaturated group or a geminally disubstituted ethylenically unsaturated group.

The above-described ethylenically unsaturated group is not particularly limited, and examples thereof include a (meth)acryloxy group, a (meth)acrylamide group, an allyl group, a styryl group (vinylphenyl group), a vinyl ether group, and a vinyl ester group.

Among these, from the viewpoint of storage stability, developability, curability, and adhesiveness of a cured product to be obtained, a (meth)acryloxy group or a (meth)acrylamide group is preferable, a (meth)acryloxy group is more preferable, and an acryloxy group is particularly preferable.

From the viewpoint of storage stability and developability, the above-described constitutional unit having an ethylenically unsaturated group in the side chain preferably has an ester bond, more preferably has 2 or more ester bonds, still more preferably has 3 or more ester bonds, and particularly preferably has 3 to 10 ester bonds.

In addition, from the viewpoint of storage stability and developability, the above-described constitutional unit having an ethylenically unsaturated group in the side chain preferably has a hydroxy group.

Further, from the viewpoint of storage stability, developability, and adhesiveness of a cured product to be obtained, the above-described constitutional unit having an ethylenically unsaturated group in the side chain preferably has an ether bond, and more preferably has a hydroxy group and an ether bond.

In the block A, the above-described constitutional unit having an ethylenically unsaturated group in the side chain preferably includes a constitutional unit represented by Formula (1), and is more preferably a constitutional unit represented by Formula (1).

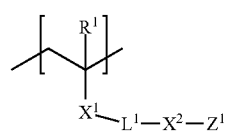

(1)

In Formula (1), $R^1$ represents a hydrogen atom, a halogen atom, or an alkyl group, $X^1$ and $X^2$ each independently represent a single bond or a divalent linking group, $L^1$ represents a polyether chain, a polyester chain, a polyamide chain, a polyimide chain, a polyimine chain, a polyurethane chain, or a resin chain in which two or more of these resin chains are combined, and $Z^1$ represents an ethylenically unsaturated group.

$R^1$ in Formula (1) is preferably a hydrogen atom or an alkyl group, more preferably a hydrogen atom or a methyl group, and particularly preferably a methyl group.

X$^1$ in Formula (1) is preferably a single bond, an arylene group, —COO—, or —CONR—, more preferably —COO— or —CONR—, and particularly preferably —COO—.

R is preferably a hydrogen atom or an alkyl group and more preferably a hydrogen atom.

From the viewpoint of storage stability and developability, L$^1$ in Formula (1) is preferably a polyether chain, a polyester chain, a polyurethane chain, or a resin chain in which two or more of these resin chains are combined, more preferably a polyether chain, a polyester chain, or a resin chain in which two or more of these resin chains are combined, and particularly preferably a polyester chain.

From the viewpoint of storage stability and developability, X$^2$ in Formula (1) is preferably a divalent linking group, more preferably a divalent linking group having 3 to 20 carbon atoms, still more preferably a divalent linking group having 3 to 20 carbon atoms and having a hydroxy group, and particularly preferably a divalent linking group represented by Formula (L1) or Formula (L2).

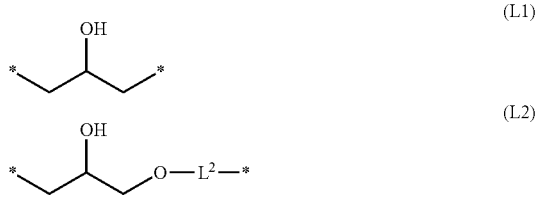

In Formulae (L1) and (L2), L$^2$ represents an alkylene group, and * represents a bonding position with L$^1$ or Z$^1$.

The alkylene group in L$^2$ of Formula (L2) may be linear, may have a branch, or may have a ring structure, but a linear alkylene group is preferable.

In addition, L$^2$ in Formula (L2) is preferably an alkylene group having 2 to 10 carbon atoms, more preferably an alkylene group having 3 to 8 carbon atoms, and particularly preferably an alkylene group having 4 to 8 carbon atoms.

In addition, in Formula (L2), it is preferable that L$^2$ is bonded to Z$^1$ in Formula (1).

From the viewpoint of storage stability, developability, curability, and adhesiveness of a cured product to be obtained, Z$^1$ in Formula (1) is preferably a (meth)acryloxy group or a (meth)acrylamide group, more preferably a (meth)acryloxy group, and particularly preferably an acryloxy group.

The block A may have only one kind of the above-described constitutional unit having an ethylenically unsaturated group in the side chain, or may have two or more kinds thereof.

In the block A, from the viewpoint of storage stability, developability, and adhesiveness of a cured product to be obtained, the content of the constitutional unit having an ethylenically unsaturated group in the side chain is preferably 5 mass % to 80 mass %, more preferably 10 mass % to 65 mass %, and particularly preferably 15 mass % to 50 mass % with respect to the total mass of the block A.

In addition, in the block A, from the viewpoint of storage stability, developability, and adhesiveness of a cured product to be obtained, the content of the constitutional unit having an ethylenically unsaturated group in the side chain is preferably 1 mol % to 80 mol %, more preferably 5 mol % to 60 mol %, and particularly preferably 10 mol % to 40 mol % with respect to the total of the block A.

In the present disclosure, in a case where the content of the constitutional unit is expressed in mol %, the constitutional unit is synonymous with the monomer unit.

In the block A, from the viewpoint of storage stability, developability, and adhesiveness of a cured product to be obtained, the content of the constitutional unit represented by Formula (1) is preferably 0.1 mass % to 80 mass %, more preferably 0.1 mass % to 65 mass %, still more preferably 0.1 mass % to 50 mass %, and particularly preferably 5 mass % to 50 mass % with respect to the total mass of the block A.

In the specific block copolymer, from the viewpoint of storage stability, developability, and adhesiveness of a cured product to be obtained, the content of the constitutional unit having an ethylenically unsaturated group in the side chain is preferably 1 mass % to 70 mass %, more preferably 2 mass % to 50 mass %, and particularly preferably 5 mass % to 25 mass % with respect to the total mass of the specific block copolymer.

In addition, in the specific block copolymer, from the viewpoint of storage stability, developability, and adhesiveness of a cured product to be obtained, the content of the constitutional unit having an ethylenically unsaturated group in the side chain is preferably 1 mol % to 80 mol %, more preferably 5 mol % to 50 mol %, and particularly preferably 10 mol % to 30 mol % with respect to the total of the specific block copolymer.

Preferred examples of the above-described constitutional unit having an ethylenically unsaturated group in the side chain include the following structures, but it is needless to say that the constitutional unit is not limited thereto.

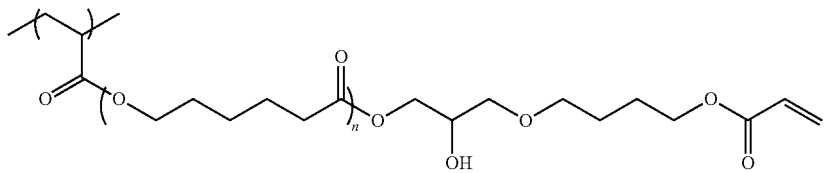

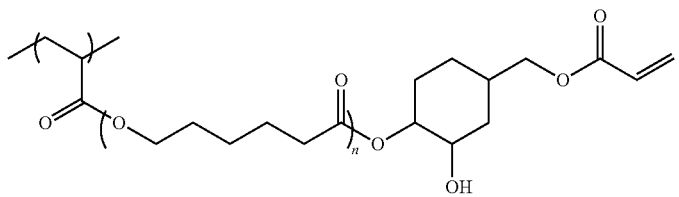

-continued
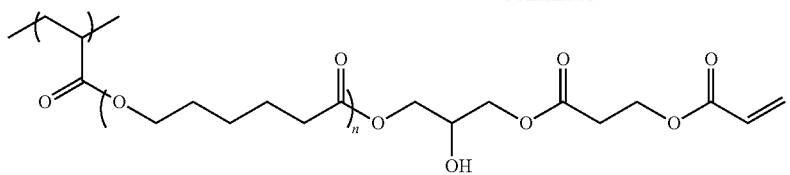
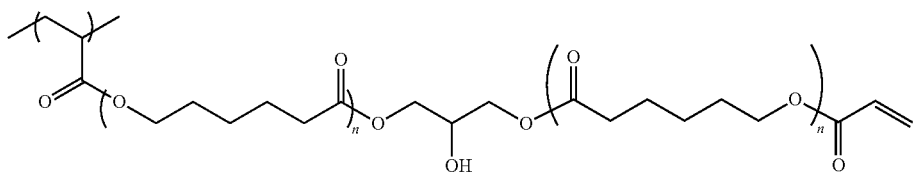
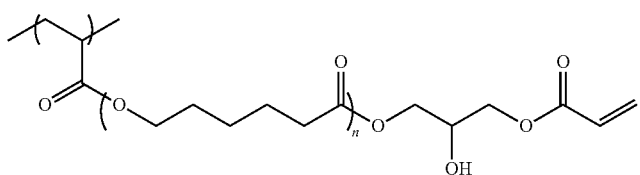
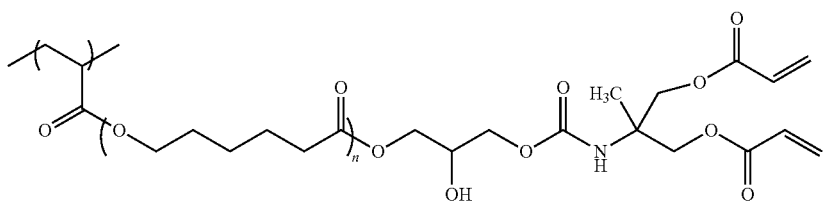
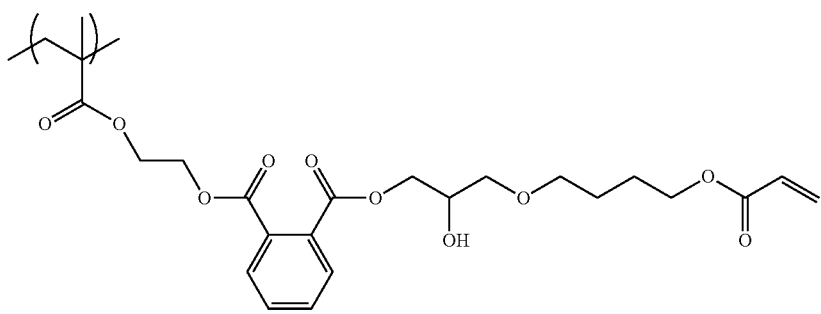
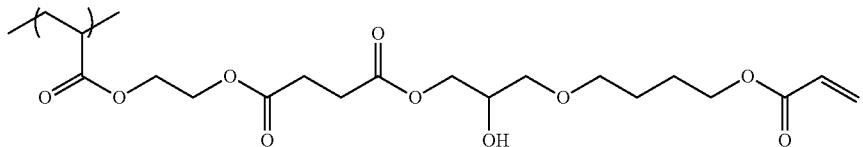
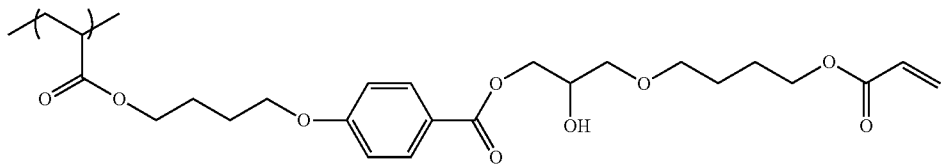
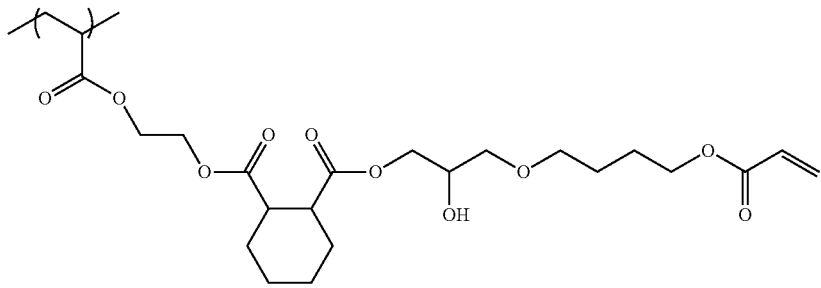

-continued
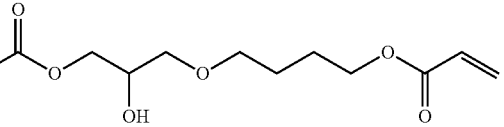
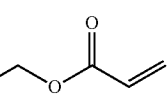
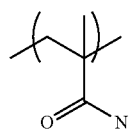 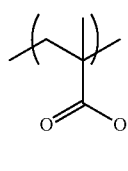
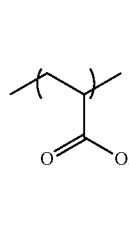 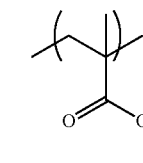
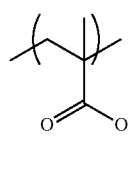 
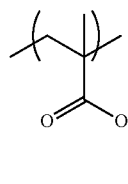 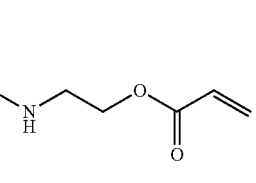
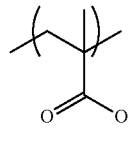 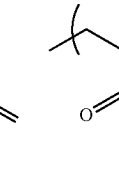
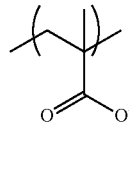 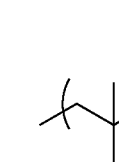
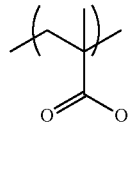 

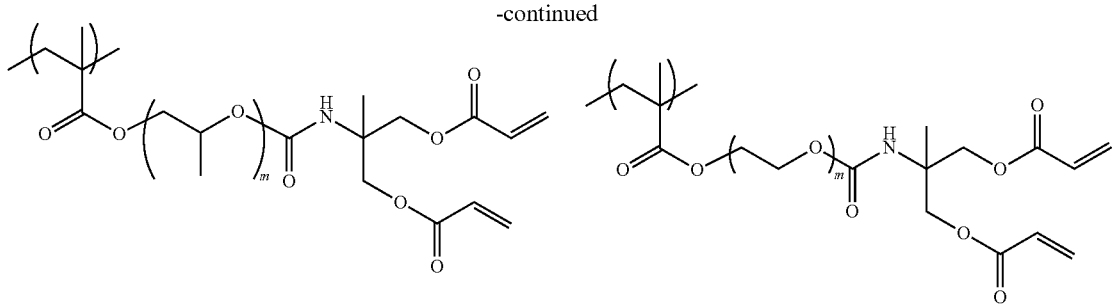

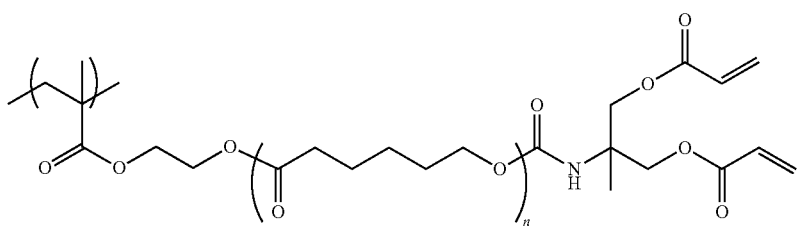

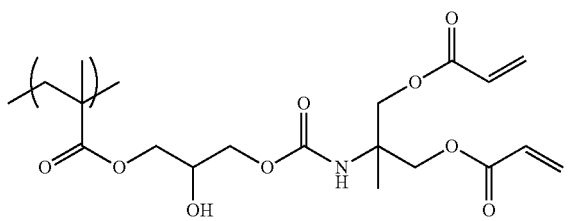

m represents an integer of 2 or more, and n represents an integer of 1 or more. In addition, m and n are each independently preferably 20 or less and more preferably 10 or less.

—Constitutional Unit Having Acid Group—

From the viewpoint of storage stability and developability, the block A preferably further has a constitutional unit having an acid group.

Examples of the acid group include a carboxy group, a sulfo group, a phosphonic acid group, and a phosphoric acid group.

Among these, from the viewpoint of storage stability, developability, and adhesiveness of a cured product to be obtained, a carboxy group is preferable.

From the viewpoint of storage stability, developability, and adhesiveness of a cured product to be obtained, the above-described constitutional unit having an acid group is preferably a constitutional unit having an acid group in the side chain.

For example, a constitutional unit derived from (meth) acrylic acid is not the constitutional unit having an acid group in the side chain because it is a constitutional unit in which the carboxy group is directly bonded to the main chain.

From the viewpoint of storage stability and developability, the above-described constitutional unit having an acid group is preferably a constitutional unit represented by Formula (2), and more preferably a constitutional unit represented by Formula (3).

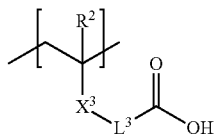 (2)

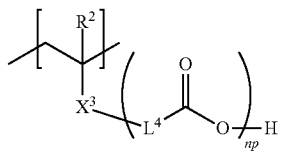 (3)

In Formulae (2) and (3), $R^2$ represents a hydrogen atom or an alkyl group, $X^3$ represents —COO—, —CONR$^B$—, or an arylene group, where $R^B$ represents a hydrogen atom, an alkyl group, or an aryl group, and $L^3$ represents an aliphatic hydrocarbon group having 1 to 10 carbon atoms, an aromatic hydrocarbon group having 6 to 20 carbon atoms, or a group in which two or more groups selected from the group consisting of aliphatic hydrocarbon groups having 1 to 10 carbon atoms and aromatic hydrocarbon groups having 6 to 20 carbon atoms are bonded to one or more groups selected from the group consisting of ether bonds and ester bonds. Further, in a case where $X^3$ is an arylene group, $L^3$ may be a single bond, $L^4$'s each independently represent an alkylene group, and np represents an integer of 1 or more.

$R^2$ in Formula (2) is preferably a hydrogen atom or a methyl group and more preferably a methyl group.

From the viewpoint of storage stability, $X^3$ in Formula (2) is preferably —COO— or —CONR$^B$— and more preferably —COO—.

$R^B$ is preferably a hydrogen atom or an alkyl group and more preferably a hydrogen atom.

From the viewpoint of storage stability, $L^3$ in Formula (2) is preferably an aliphatic hydrocarbon group having 1 to 10 carbon atoms, or a group in which two or more aliphatic hydrocarbon groups having 1 to 10 carbon atoms are bonded to one or more ester bonds, still more preferably an aliphatic hydrocarbon group having 1 to 10 carbon atoms, and particularly preferably an alkylene group having 1 to 10 carbon atoms.

$R^2$ and $X^3$ in Formula (3) have the same meanings as $R^2$ and $X^3$ in Formula (2), respectively, and the preferred aspects thereof are also the same.

The alkylene group in $L^4$ of Formula (3) may be linear, may have a branch, or may have a ring structure, but a linear alkylene group is preferable.

In addition, $L^4$'s in Formula (3) are each independently preferably an alkylene group having 2 to 10 carbon atoms, more preferably an alkylene group having 3 to 8 carbon atoms, and particularly preferably an alkylene group having 4 to 8 carbon atoms.

Further, it is preferable that np pieces of $L^4$'s in Formula (3) are the same group.

np in Formula (3) is preferably an integer of 1 to 20, more preferably an integer of 1 to 10, and particularly preferably an integer of 2 to 4.

The block A may have only one kind of the above-described constitutional unit having an acid group, or may have two or more kinds thereof.

In the block A, from the viewpoint of storage stability, developability, and adhesiveness of a cured product to be obtained, the content of the constitutional unit having an acid group is preferably 20 mass % to 90 mass %, more preferably 30 mass % to 80 mass %, and particularly preferably 40 mass % to 75 mass % with respect to the total mass of the block A.

In addition, in the block A, from the viewpoint of storage stability, developability, and adhesiveness of a cured product to be obtained, the content of the constitutional unit having an acid group is preferably 20 mol % to 90 mol %, more preferably 30 mol % to 80 mol %, and particularly preferably 50 mol % to 75 mol % with respect to the total of the block A.

In the specific block copolymer, from the viewpoint of storage stability, developability, and adhesiveness of a cured product to be obtained, the content of the constitutional unit having an acid group is preferably 10 mass % to 80 mass %, more preferably 20 mass % to 75 mass %, and particularly preferably 30 mass % to 70 mass % with respect to the total mass of the specific block copolymer.

In addition, in the specific block copolymer, from the viewpoint of storage stability, developability, and adhesiveness of a cured product to be obtained, the content of the constitutional unit having an acid group is preferably 15 mol % to 80 mol %, more preferably 30 mol % to 80 mol %, and particularly preferably 50 mol % to 75 mol % with respect to the total of the specific block copolymer.

Preferred examples of the above-described constitutional unit having an acid group include the following structures, but it is needless to say that the constitutional unit is not limited thereto.

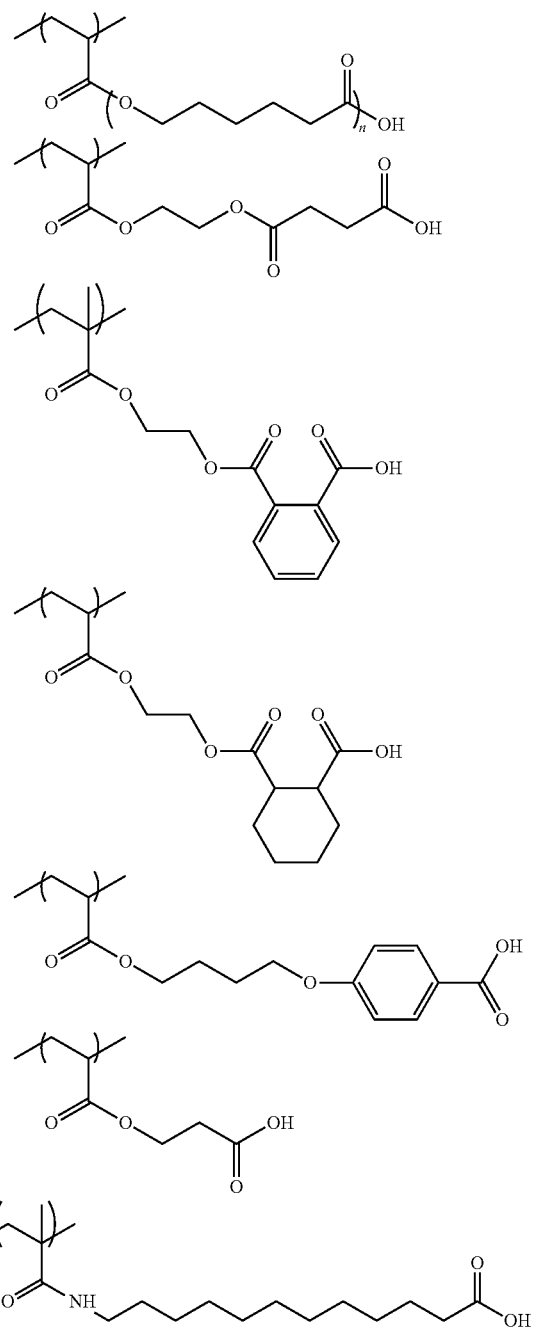

n represents an integer of 1 or more. In addition, n is preferably 20 or less and more preferably 10 or less.

—Other Constitutional Units—

The block A may have other constitutional units other than the above-described constitutional units.

The other constitutional units are not particularly limited, and a known constitutional unit may be used.

Only one kind of other constitutional units may be included, two or more kinds thereof may be included, or the other constitutional units may not be included.

The content of the other constitutional units in the block A is preferably 20 mass % or less, more preferably 10 mass % or less, still more preferably 5 mass % or less, and particularly preferably 0 mass % with respect to the total mass of the block A.

In addition, the content of the other constitutional units in the block A is preferably 20 mol % or less, more preferably 10 mol % or less, still more preferably 5 mol % or less, and particularly preferably 0 mass % with respect to the total of the block A.

<<Block B>>

From the viewpoint of storage stability and developability, the specific block copolymer preferably further includes a block B which has a constitutional unit having a steric repulsive group in a side chain.

In addition, it is preferable that the block B does not have the above-described constitutional unit having an ethylenically unsaturated group in the side chain.

A resin chain constituting the block B is not particularly limited, and examples thereof include an acrylic resin chain, a polyester chain, a polyether chain (preferably, a polyalkyleneoxy chain), a polyurethane chain, a polyurea chain, a polyamide chain, a polyimide chain, and a polyimine chain. In addition, the resin chain constituting the block B may be a resin chain in which two or more of these resin chains are combined.

Among these, from the viewpoint of storage stability and developability, the block B is preferably an acrylic resin chain, a polyester chain, or a polyether chain, and more preferably an acrylic resin chain or a polyester chain.

From the viewpoint of storage stability, the above-described steric repulsive group is preferably a group having 20 or more carbon atoms, more preferably a group having 30 or more carbon atoms, still more preferably a group having 50 or more carbon atoms, and particularly preferably a group having 50 to 200 carbon atoms.

In addition, from the viewpoint of storage stability and developability, the above-described steric repulsive group preferably has a polyether chain, a polyester chain, a polyamide chain, or an acrylic resin chain, more preferably has a polyether chain, a polyester chain, or an acrylic resin chain, still more preferably has a polyester chain or an acrylic resin chain, and particularly preferably has a polyester chain.

In addition, from the viewpoint of storage stability, the above-described steric repulsive group preferably has an aliphatic hydrocarbon group having 4 to 40 carbon atoms or an aromatic hydrocarbon group having 6 to 20 carbon atoms, more preferably has an aliphatic hydrocarbon group having 4 to 40 carbon atoms, still more preferably has an alkyl group having 4 to 40 carbon atoms, particularly preferably has an alkyl group having 6 to 30 carbon atoms, and most preferably has an aliphatic hydrocarbon group having 8 to 20 carbon atoms.

The above-described alkyl group may be linear, may have a branch, or may have a ring structure, but from the viewpoint of storage stability, a linear alkyl group or a branched alkyl group is preferable, and a branched alkyl group is more preferable.

From the viewpoint of storage stability and developability, the above-described constitutional unit having a steric repulsive group in the side chain preferably further has a constitutional unit represented by Formula (4) or Formula (5), and more preferably further has a constitutional unit represented by Formula (4).

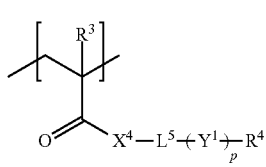

(4)

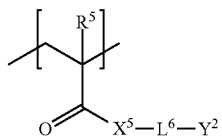

(5)

In Formulae (4) and (5), $R^3$ represents a hydrogen atom or an alkyl group, $R^4$ represents an aliphatic hydrocarbon group having 1 to 20 carbon atoms or an aromatic hydrocarbon group having 6 to 20 carbon atoms, $R^5$ represents a hydrogen atom or an alkyl group, $X^4$ and $X^5$ represent an oxygen atom or —$NR^C$—, where $R^C$ represents a hydrogen atom, an alkyl group, or an aryl group, $L^5$ and $L^6$ represent a divalent linking group, $Y^1$ represents an alkylenecarbonyloxy group, $Y^2$ represents an acrylic resin chain, and p's each independently represent an integer of 1 or more.

$R^3$ in Formula (4) is preferably a hydrogen atom or a methyl group and more preferably a methyl group.

From the viewpoint of dispersion stability, $X^4$ in Formula (4) is preferably an oxygen atom.

$R^C$ is preferably a hydrogen atom or an alkyl group and more preferably a hydrogen atom.

From the viewpoint of dispersion stability, $L^5$ in Formula (4) is preferably a group having a total of 2 to 30 atoms, more preferably a group having a total of 3 to 20 atoms, and particularly preferably a group having a total of 4 to 10 atoms.

In addition, from the viewpoint of dispersion stability, $L^5$ in Formula (4) is preferably a group having a urethane bond or a urea bond, more preferably a group having a urethane bond, and particularly preferably a group in which an alkylene group and a urethane bond are bonded to each other.

From the viewpoint of dispersion stability, the number of carbon atoms in the alkylenecarbonyloxy group in $Y^1$ of Formula (4) is preferably 2 to 30, more preferably 3 to 10, and particularly preferably 5 to 8.

From the viewpoint of dispersion stability, p in Formula (4) is preferably an integer of 3 or more, more preferably an integer of 5 to 50, still more preferably an integer of 7 to 30, and particularly preferably an integer of 8 to 20.

From the viewpoint of dispersion stability, $R^4$ in Formula (4) is preferably an aliphatic hydrocarbon group having 1 to 20 carbon atoms, more preferably an alkyl group having 4 to 20 carbon atoms, still more preferably an alkyl group having 6 to 20 carbon atoms, and particularly preferably an alkyl group having 8 to 20 carbon atoms.

In addition, from the viewpoint of dispersion stability, the above-described alkyl group in $R^4$ is preferably a branched alkyl group.

$R^5$ in Formula (5) is preferably a hydrogen atom or a methyl group and more preferably a methyl group.

From the viewpoint of dispersion stability, $X^5$ in Formula (5) is preferably an oxygen atom.

$R^C$ is preferably a hydrogen atom or an alkyl group and more preferably a hydrogen atom.

From the viewpoint of dispersion stability, $L^6$ in Formula (5) is preferably a group having a total of 2 to 30 atoms, more preferably a group having a total of 3 to 20 atoms, and particularly preferably a group having a total of 4 to 10 atoms.

In addition, from the viewpoint of dispersion stability, $L^6$ in Formula (5) is preferably a group having an ester bond.

Further, from the viewpoint of dispersion stability, $L^6$ in Formula (5) is preferably a group having a hydroxy group.

Furthermore, from the viewpoint of dispersion stability, $L^6$ in Formula (5) is preferably a group having a sulfide bond.

From the viewpoint of dispersion stability, the molecular weight (in a case of having a distribution, the weight-average molecular weight) of the acrylic resin chain in $Y^2$ of Formula (5) is preferably 500 to 10,000, more preferably 700 to 5,000, and particularly preferably 1,000 to 3,000.

In addition, the above-described acrylic resin chain in $Y^2$ is preferably an acrylic resin chain derived from an alkyl (meth)acrylate compound.

In addition, the above-described acrylic resin chain derived from an alkyl (meth)acrylate compound may be an acrylic resin chain derived from only one kind of alkyl (meth)acrylate compound, or an acrylic resin chain derived from two or more kinds of alkyl (meth)acrylate compounds, but from the viewpoint of dispersion stability, the above-described acrylic resin chain derived from an alkyl (meth)acrylate compound is preferably an acrylic resin chain derived from 2 to 4 kinds of alkyl (meth)acrylate compounds, and more preferably an acrylic resin chain derived from two kinds of alkyl (meth)acrylate compounds.

From the viewpoint of dispersion stability, the alkyl group in the above-described alkyl (meth)acrylate compound is preferably an alkyl group having 1 to 20 carbon atoms, more preferably an alkyl group having 1 to 10 carbon atoms, still more preferably an alkyl group having 1 to 8 carbon atoms, and particularly preferably an alkyl group having 1 to 4 carbon atoms.

The block B may have only one kind of the above-described constitutional unit having a steric repulsive group in the side chain, or may have two or more kinds thereof.

In the block B, from the viewpoint of storage stability and developability, the content of the constitutional unit having a steric repulsive group in the side chain is preferably 50 mass % to 100 mass %, more preferably 70 mass % to 100 mass %, and particularly preferably 90 mass % to 100 mass % with respect to the total mass of the block B.

In addition, in the block B, from the viewpoint of storage stability and developability, the content of the constitutional unit having a steric repulsive group in the side chain is preferably 50 mol % to 100 mol %, more preferably 70 mol % to 100 mol %, and particularly preferably 90 mol % to 100 mol % with respect to the total of the block B.

In the specific block copolymer, from the viewpoint of storage stability and developability, the content of the constitutional unit having a steric repulsive group in the side chain is preferably 1 mass % to 70 mass %, more preferably 5 mass % to 60 mass %, and particularly preferably 10 mass % to 50 mass % with respect to the total mass of the specific block copolymer.

In addition, in the specific block copolymer, from the viewpoint of storage stability and developability, the content of the constitutional unit having a steric repulsive group in the side chain is preferably 1 mol % to 50 mol %, more preferably 5 mol % to 40 mol %, and particularly preferably 10 mol % to 30 mol % with respect to the total of the specific block copolymer.

In a case where the above-described constitutional unit having a steric repulsive group in the side chain is formed of a macromonomer, the constitutional unit derived from the macromonomer is treated as one monomer unit, and the molar content of the constitutional unit is calculated.

Preferred examples of the above-described constitutional unit having a steric repulsive group in the side chain include the following structures, but it is needless to say that the constitutional unit is not limited thereto.

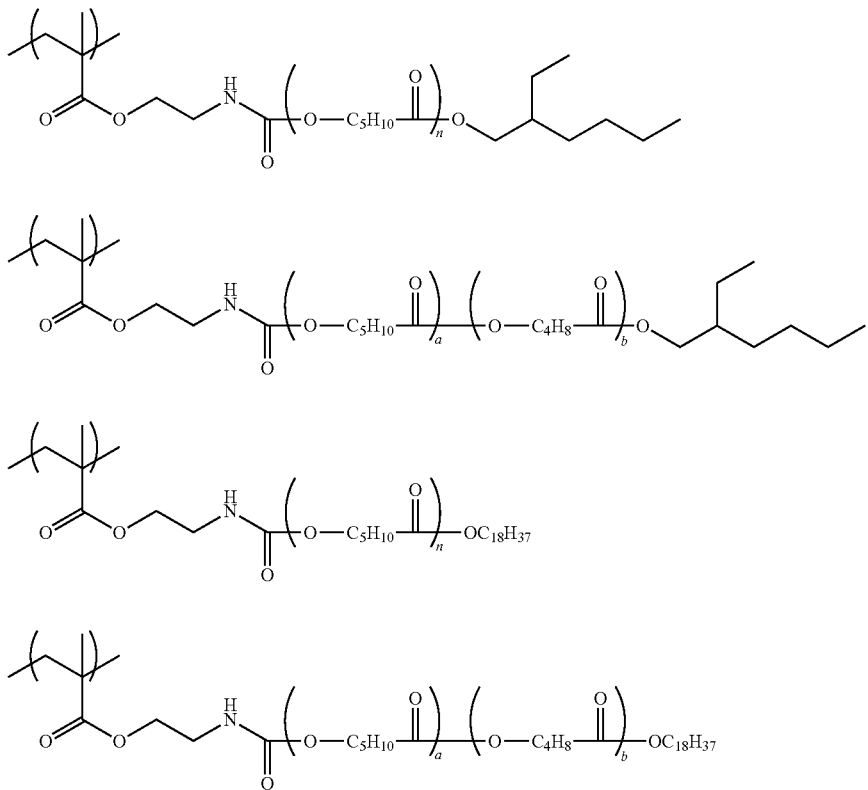

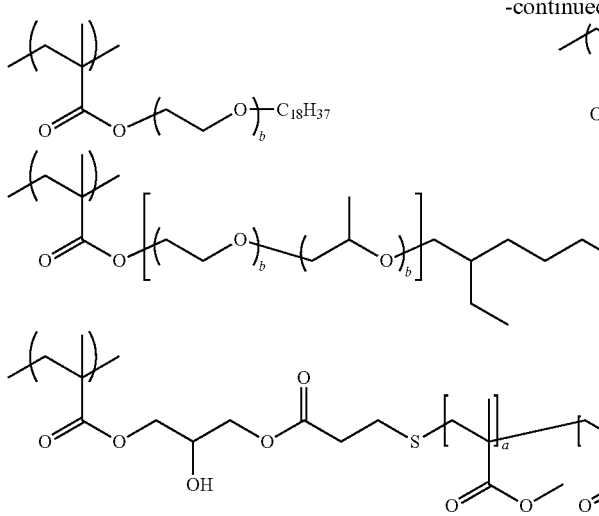
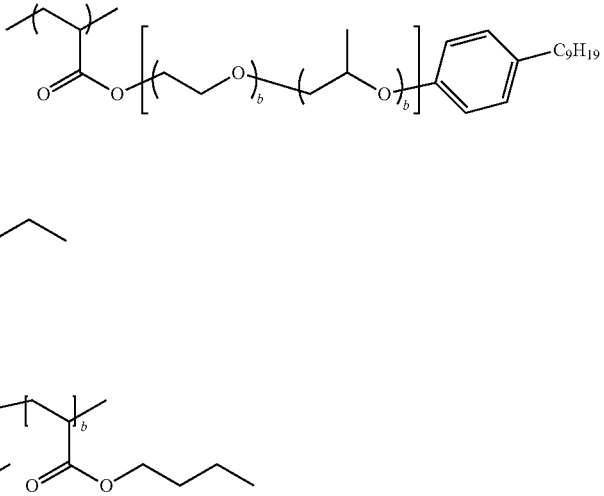

n represents an integer of 1 or more, and a and b each independently represent an integer of 1 or more.

—Other Constitutional Units—

The block B may have other constitutional units other than the above-described constitutional units.

In addition, the block B may have the above-described constitutional unit having an acid group as the other constitutional units, but it is preferable not to have the above-described constitutional unit having an acid group.

The other constitutional units are not particularly limited, and a known constitutional unit may be used.

Only one kind of other constitutional units may be included, two or more kinds thereof may be included, or the other constitutional units may not be included.

The content of the other constitutional units in the block B is preferably 50 mass or less, more preferably 20 mass % or less, still more preferably 10 mass % or less, and particularly preferably 0 mass % with respect to the total mass of the block B.

In addition, the content of the other constitutional units in the block B is preferably 50 mol % or less, more preferably 20 mol % or less, still more preferably 10 mol % or less, and particularly preferably 0 mass % with respect to the total of the block B.

<<Other block C>>

The specific block copolymer may include a block C other than the block A and the block B, but it is preferable not to include the block C.

Preferred examples of other block C include a block consisting of a constitutional unit other than the above-described constitutional unit having an ethylenically unsaturated group in the side chain and the above-described constitutional unit having a steric repulsive group in the side chain.

A resin chain constituting the other block C is not particularly limited, and examples thereof include an acrylic resin chain, a polyester chain, a polyether chain (preferably, a polyalkyleneoxy chain), a polyurethane chain, a polyurea chain, a polyamide chain, a polyimide chain, and a polyimine chain. In addition, the resin chain constituting the other block C may be a resin chain in which two or more of these resin chains are combined.

—Block Structure—

It is sufficient that the specific block copolymer has two or more kinds of blocks including the block A, and the specific block copolymer may have three or more kinds of blocks, but preferably has two to four kinds thereof, more preferably has two or three kinds thereof, and still more preferably has two kinds thereof. For example, in a case of an A-B-A type block copolymer described later, the specific block copolymer has two kinds of blocks.

In addition, the specific block copolymer preferably has 3 or more blocks, and more preferably has 3 or 4 blocks. According to the above-described aspect, since the blocks are subdivided to some extent, it is easily adsorbed on a surface of the pigment, and it is more excellent in storage stability.

In addition, the specific block copolymer preferably has a block having one or more kinds of acrylic resin chains, and is more preferably a copolymer consisting of only a block having two or more kinds of acrylic resin chains.

In addition, in a case where the specific block copolymer has two or more blocks consisting of the same kind of constitutional unit, these blocks may the same or different molecular weights (weight-average molecular weight and number-average molecular weight), and the molecular structure such as composition ratio, arrangement state, three-dimensional arrangement, and crystal structure of the constitutional units may be the same of different from each other.

The monomer unit in each block of the specific block copolymer may be only one kind, or may be two or more kinds. For example, each block of the specific block copolymer may be a homopolymer or a random copolymer.

In addition, the block A is preferably a random copolymer block, and the block B is preferably a homopolymer block.

In a case where the block A is represented by A, the block B is represented by B, and the other block C is represented by C, examples of the specific block copolymer include A-B type diblock copolymers; an A-B-A type, B-A-B type, A-B-C type, B-A-C type, or B-C-A type triblock copolymers; linear polyblock copolymers such as $(A-B)_1$ type, $(A-B-)_nA$ type, and $(B-A-)_nB$ type; star-shaped block copolymers such as $(A-B-)_nX$ type (X represents a coupling residue), $(B-A-)_nX$ type, $(A-B-A)_nX$ type, $(A-C-B)_nX$ type, $(B-C-A)_nX$ type, $(A-B-C)_nX$ type, $(C-B-A-)_nX$ type, and (C-A-B-)$_n$X type (in above, n represents an integer of 2 or more); and comb-shaped block copolymers.

Among these, from the viewpoint of storage stability, developability, and adhesiveness of a cured product to be obtained, an A-B type diblock copolymer or an A-B-A type or B-A-B type triblock copolymer is preferable, and an A-B type diblock copolymer is more preferable.

From the viewpoint of storage stability, developability, and adhesiveness of a cured product to be obtained, the content of the block A in the specific block copolymer is preferably 20 mass % to 95 mass %, more preferably 40 mass % to 95 mass %, still more preferably 50 mass % to 90 mass %, and particularly preferably 60 mass % to 85 mass % with respect to the total mass of the specific block copolymer.

From the viewpoint of storage stability, developability, and adhesiveness of a cured product to be obtained, the content of the block B in the specific block copolymer is preferably 1 mass % to 80 mass %, more preferably 5 mass % to 60 mass %, still more preferably 10 mass % to 50 mass %, and particularly preferably 15 mass % to 40 mass % with respect to the total mass of the specific block copolymer.

In the specific block copolymer, from the viewpoint of storage stability, developability, and adhesiveness of a cured product to be obtained, the mass ratio ($W^A/W^B$) of the content $W^A$ of the block A and the content $W^B$ of the block B is preferably 0.5 to 20, more preferably 0.8 to 10, still more preferably 1 to 5, and particularly preferably more than 1 and 3 or less.

—Weight-Average Molecular Weight of Block A and Block B—

From the viewpoint of storage stability, developability, and adhesiveness of a cured product to be obtained, the weight-average molecular weight (Mw) of the block A is preferably 1,000 or more, more preferably 2,000 to 100,000, still more preferably 4,000 to 50,000, and particularly preferably 5,000 to 20,000.

From the viewpoint of storage stability, developability, and adhesiveness of a cured product to be obtained, the weight-average molecular weight (Mw) of the block B is preferably 1,000 or more, more preferably 2,000 to 100,000, still more preferably 4,000 to 50,000, and particularly preferably 5,000 to 20,000.

—Acid Value of Specific Block Copolymer—

From the viewpoint of developability, the acid value of the specific block copolymer is preferably 20 mgKOH/g to 200 mgKOH/g, more preferably 30 mgKOH/g to 150 mgKOH/g, and particularly preferably 40 mgKOH/g to 100 mgKOH/g.

The acid value of the specific block copolymer represents a mass of potassium hydroxide required to neutralize acidic components per 1 g of solid content of the resin. The acid value of the specific block copolymer is measured as follows. That is, a measurement sample is dissolved in a mixed solvent of tetrahydrofuran/water=9/1 (mass ratio), and the obtained solution is subjected to neutralization titration with a 0.1 mol/L sodium hydroxide aqueous solution at 25° C. using a potentiometric titrator (trade name: AT-510, manufactured by KYOTO ELECTRONICS MANUFACTURING CO., LTD.). An inflection point of a titration pH curve was set as a titration end point, and the acid value was calculated from the following equation.

$A = 56.11 \times Vs \times 0.5 \times f/w$

A: acid value (mgKOH/g)
Vs: amount (mL) of the 0.1 mol/L sodium hydroxide aqueous solution used for the titration
f: titer of the 0.1 mol/L sodium hydroxide aqueous solution w: mass (g) of the measurement sample (expressed in terms of solid contents)

—Weight-Average Molecular Weight of Specific Block Copolymer—

From the viewpoint of storage stability, developability, and adhesiveness of a cured product to be obtained, the weight-average molecular weight (Mw) of the specific block copolymer is preferably 3,000 or more, more preferably 3,000 to 200,000, still more preferably 8,000 to 30,000, particularly preferably 10,000 to 27,000, and most preferably 12,000 to 24,000.

—Ethylenically Unsaturated Bonding Value of Specific Block Copolymer—

From the viewpoint of developability, curability, and adhesiveness of a cured product to be obtained, the ethylenically unsaturated bonding value of the specific block copolymer is preferably 0.01 mmol/g to 2.0 mmol/g, more preferably 0.1 mmol/g to 1.0 mmol/g, still more preferably 0.2 mmol/g to 0.8 mmol/g, and particularly preferably 0.3 mmol/g to 0.6 mmol/g.

The ethylenically unsaturated bonding value of the specific block copolymer refers to a molar amount of ethylenically unsaturated bonding per 1 g of the solid content of the specific block copolymer, and is measured by the following method.

<<Method for Preparing Sample>>

0.2 g of propyl benzoate (164-04893 manufactured by FUJIFILM Wako Pure Chemical Corporation) is weighed and mixed with 50 g of deuterated dimethyl sulfoxide (heavy DMSO) (534-74585 manufactured by FUJIFILM Wako Pure Chemical Corporation) to adjust a heavy DMSO with internal standard. Next, 0.03 g (expressed in terms of solid contents) of the specific block copolymer is weighed and mixed with 0.17 g of the heavy DMSO with internal standard to produce a measurement sample.

<<Measuring Method of Nuclear Magnetic Resonance (NMR)>>

The measurement sample is transferred to a sample tube for NMR, and NMR is measured ($^1$H-NMR, 400 MHz, DMSO, method integrating accumulate number: 16 times).

<<Analysis Method of NMR Spectrum>>

The peak of internal standard (propyl benzoate) is obtained at 7.90 ppm to 8.04 ppm, and the bias and slop are adjusted to set the integrated value to 2. The peak of the ethylenically unsaturated group is obtained at 6.25 ppm to 6.38 ppm, and the bias and slop are adjusted to record the integrated value.

<<Calculation Method>>

The ethylenically unsaturated bonding value is calculated by the expression shown below. For the ethylenically unsaturated bonding value in the present disclosure, the average value of three times adjusted and measured separately is adopted.

Ethylenically unsaturated bonding value [mmol/g]=(Integrated value of ethylenically unsaturated group×weighed value [g] of heavy DMSO with internal standard×internal standard concentration [mmol/g])/(weighed value [g] of specific block copolymer)

Suitable specific examples of the specific block copolymer include those produced in Examples described later.

In the curable composition, only one kind of specific block copolymer may be included, or two or more kinds thereof may be included.

From the viewpoint of storage stability, developability, and adhesiveness of a cured product to be obtained, the content of the specific block copolymer is preferably 0.05 mass % to 20 mass %, more preferably 0.1 mass % to 10 mass %, and particularly preferably 0.5 mass % to 5 mass % with respect to the total solid content of the curable composition.

In addition, from the viewpoint of storage stability, developability, and adhesiveness of a cured product to be obtained, the ratio (D/P) of the content D of the specific block copolymer and the content P of the pigment is preferably D/P=0.1 or more, more preferably D/P=0.2 or more, and particularly preferably D/P=0.2 to 1.0.

The method for synthesizing the specific block copolymer is not particularly limited, and a known or a method applying the known method can be used for the synthesis.

For example, a diblock type specific block copolymer of block A-block B can be produced by a method in which a precursor monomer forming the block A is polymerized by living radical polymerization, a macromonomer forming the block B is added to the precursor of block A and polymerized, and after the polymerization reaction is completed, an ethylenically unsaturated group is introduced into the precursor of block A (for example, introduction by reaction with a carboxy group and an epoxy group).

In addition, suitable examples of the method for synthesizing the specific block copolymer include a reversible addition/fragmentation chain transfer (RAFT) polymerization method and a tellurium mediated living radical polymerization (TERP) method.

In a case where the specific block copolymer is synthesized by the RAFT polymerization method or the TERP method, a wide range of monomers including a monomer having a polar group or a non-conjugated monomer can be used.

As a RAFT agent used in the RAFT polymerization method and a tellurium compound used in the TERP method, known compounds can be used.

—Method of Adding Specific Block Copolymer—

The method of adding the specific block copolymer to the curable composition is not particularly limited, and a known addition method and a known mixing method can be used. Preferred examples thereof include a method in which the specific block copolymer is mixed (dry or wet) with a pigment in advance and used as a dried specific block copolymer-containing composite pigment, a method of adding the specific block copolymer during pigment milling, a method of adding the specific block copolymer with a dispersion medium during pigment dispersion, and a method of adding the specific block copolymer to a pigment dispersion liquid.

<Pigment>

The curable composition according to the embodiment of the present disclosure includes a pigment.

Examples of the pigment include a white pigment, a black pigment, a chromatic pigment, and a near-infrared absorbing pigment. In the present disclosure, the white pigment includes not only a pure white pigment but also a bright gray (for example, grayish-white, light gray, and the like) pigment close to white. In addition, the pigment may be either an inorganic pigment or an organic pigment. In addition, as the pigment, a material in which a part of an inorganic pigment or an organic-inorganic pigment is replaced with an organic chromophore can also be used. By substituting an inorganic pigment or an organic-inorganic pigment with an organic chromophore, color tone design can be easily performed. In addition, as the pigment, a pigment having a maximal absorption wavelength in a wavelength range of 400 nm to 2,000 nm is preferable, and a pigment having a maximal absorption wavelength in a wavelength range of 400 nm to 700 nm is more preferable.

The curable composition according to the embodiment of the present disclosure can be preferably used as a curable composition for forming a colored pixel in a color filter. Examples of the colored pixel include a red pixel, a green pixel, a blue pixel, a magenta pixel, a cyan pixel, and a yellow pixel. Among these, a red pixel is preferably mentioned.

The average primary particle diameter of the pigment used in the present disclosure is preferably 1 nm to 200 nm. The lower limit is more preferably 5 nm or more and particularly preferably 10 nm or more. The upper limit is more preferably 180 nm or less, still more preferably 150 nm or less, and particularly preferably 100 nm or less. In a case where the average primary particle diameter of the pigment is within the above-described range, dispersibility of the pigment in the curable composition is good. In the present disclosure, the primary particle diameter of the pigment can be determined from an image obtained by observing primary particles of the pigment using a transmission electron microscope. Specifically, a projected area of the primary particles of the pigment is determined, and the corresponding circle-equivalent diameter is calculated as the primary particle diameter of the pigment. In addition, the average primary particle diameter in the present disclosure is the arithmetic average value of the primary particle diameters with respect to 400 primary particles of the pigment. In addition, the primary particle of the pigment refers to a particle which is independent without aggregation.

In addition, from the viewpoint of exerting the effects in the present disclosure more, the curable composition according to the embodiment of the present disclosure preferably includes a red pigment, and more preferably includes a red pigment and a yellow pigment.

—Red Pigment—

As the red pigment, a known pigment can be used. Examples thereof include Color Index (C. I.) Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, 279, 294 (xanthene-based, Organo Ultramarine, Bluish Red), 295 (monoazo-based), 296 (diazo-based), and 297 (aminoketone-based).

Among these, as the red pigment, at least one pigment selected from the group consisting of C. I. Pigment Red 254, C. I. Pigment Red 264, and C. I. Pigment Red 272 is preferable, and C. I. Pigment Red 254 is more preferable.

As the red pigment, diketopyrrolopyrrole-based pigments described in JP2017-201384A, in which the structure has at least one substituted bromine atom, diketopyrrolopyrrole-based pigments described in paragraphs 0016 to 0022 of JP6248838B, diketopyrrolopyrrole compounds described in WO2012/102399A, diketopyrrolopyrrole compounds described in WO2012/117965A, naphtholazo compounds described in JP2012-229344A, red pigments described in JP6516119B, red pigments described in JP6525101B, and the like can also be used. In addition, as the red pigment, a compound having a structure that an aromatic ring group in which a group bonded with an oxygen atom, a sulfur atom, or a nitrogen atom is introduced to an aromatic ring is bonded to a diketopyrrolopyrrole skeleton can be used. As the compound, a compound represented by Formula (DPP1) is preferable, and a compound represented by Formula (DPP2) is more preferable.

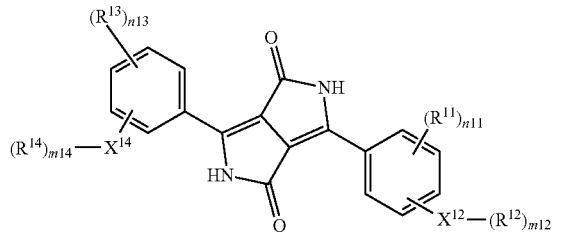
(DPP1)

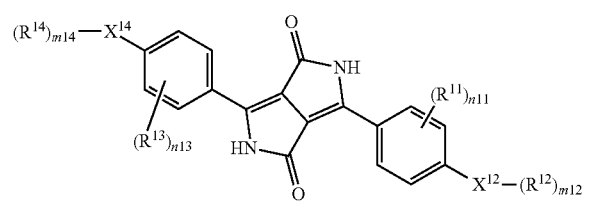
(DPP2)

In the formulae, $R^{11}$ and $R^{13}$ each independently represent a substituent, $R^{12}$ and $R^{14}$ each independently represent a hydrogen atom, an alkyl group, an aryl group, or a heteroaryl group, n11 and n13 each independently represent an integer of 0 to 4, $X^{12}$ and $X^{14}$ each independently represent an oxygen atom, a sulfur atom, or a nitrogen atom, in a case where $X^{12}$ is an oxygen atom or a sulfur atom, m12 represents 1, in a case where $X^{12}$ is a nitrogen atom, m12 represents 2, in a case where $X^{14}$ is an oxygen atom or a sulfur atom, m14 represents 1, and in a case where $X^{14}$ is a nitrogen atom, m14 represents 2. Preferred specific examples of the substituent represented by $R^{11}$ and $R^{13}$ include an alkyl group, an aryl group, a halogen atom, an acyl group, an alkoxycarbonyl group, an aryloxycarbonyl group, a heteroaryloxycarbonyl group, an amide group, a cyano group, a nitro group, a trifluoromethyl group, a sulfoxide group, and a sulfo group.

The red pigment may be used alone or in combination of two or more kinds thereof.

The content of the red pigment in the total solid content of the curable composition is preferably 10 mass % to 80 mass %. The lower limit is more preferably 15 mass % or more and particularly preferably 20 mass % or more. The upper limit is more preferably 70 mass % or less and particularly preferably 60 mass % or less.

—Yellow Pigment—

Examples of the yellow pigment include an azo compound, a quinophthalone compound, an isoindolinone compound, an isoindoline compound, and an anthraquinone compound. Among these, from the reason that it is easy to form a film having spectral characteristics suitable for green pixels, an isoindoline compound is preferable.

Examples of the yellow pigment include Color Index (C. I.) Pigment Yellow (hereinafter, also simply referred to as "PY") 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, 215, 228 (directly connected quinophthalone dimer described in WO2013/098836A), 231, 232 (methine-based), 233 (quinoline-based), 234 (aminoketone-based), 235 (aminoketone-based), and 236 (aminoketone-based).

In addition, a pigment described in JP2017-201003A and a pigment described in JP2017-197719A can be used as the yellow pigment. In addition, as the yellow pigment, a metal azo pigment which includes at least one kind of an anion selected from the group consisting of an azo compound represented by Formula (Y) and an azo compound having a tautomeric structure of the azo compound represented by Formula (Y), two or more kinds of metal ions, and a melamine compound can also be used.

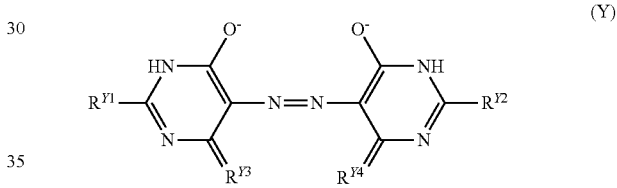
(Y)

In Formula (Y), $R^{Y1}$ and $R^{Y2}$ each independently represent —OH or $NR^{Y5}R^{Y6}$, $R^{Y3}$ and $R^{Y4}$ each independently represent =O or $=NR^{Y7}$, and $R^{Y5}$ to $R^{Y7}$ each independently represent a hydrogen atom or an alkyl group.

The alkyl group represented by $R^{Y5}$ to $R^{Y7}$ preferably has 1 to 10 carbon atoms, more preferably has 1 to 6 carbon atoms, and still more preferably has 1 to 4 carbon atoms. The above-described alkyl group may be linear, branched, or cyclic, and is preferably linear or branched and more preferably linear. The above-described alkyl group may have a substituent. Preferred examples of the substituent a halogen atom, a hydroxy group, an alkoxy group, a cyano group, and an amino group.

The details of the metal azo pigment can be found in paragraphs 0011 to 0062 and 0137 to 0276 of JP2017-171912A, paragraphs 0010 to 0062 and 0138 to 0295 of JP2017-171913A, paragraphs 0011 to 0062 and 0139 to 0190 of JP2017-171914A, and paragraphs 0010 to 0065 and 0142 to 0222 of JP2017-171915A, the contents of which are incorporated herein by reference.

In addition, as the yellow pigment, a quinophthalone dimer represented by Formula (Q) can also be suitably used. Further, a quinophthalone dimer described in JP6443711B can also be suitably used.

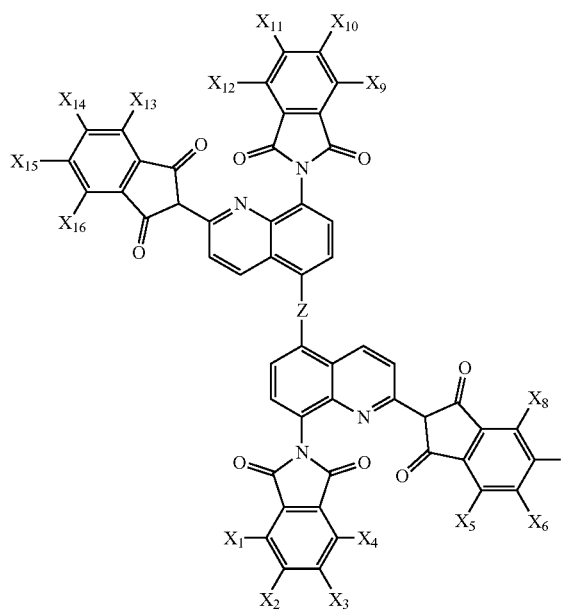

(Q)

In Formula (Q), $X_1$ to $X_{16}$ each independently represent a hydrogen atom or a halogen atom, and Z represents an alkylene group having 1 to 3 carbon atoms.

As the yellow pigment, quinophthalone pigments described in JP2018-203798A, JP2018-62578A, JP6432077B3, JP6432076B3, JP2018-155881A, JP2018-111757A, JP2018-40835A, JP2017-197640A, JP2016-145282A, JP2014-85565A, JP2014-21139A, JP2013-209614A, JP2013-209435A, JP2013-181015A, JP2013-61622A, JP2013-54339A, JP2013-32486A, JP2012-226110A, JP2008-74987A, JP2008-81565A, JP2008-74986A, JP2008-74985A, JP2008-50420A, JP2008-31281A, or JP1973-32765B (JP-S48-32765B) can also be suitably used.

In addition, as the yellow pigment, quinophthalone compounds described in paragraphs 0011 to 0034 of JP2013-54339A, quinophthalone compounds described in paragraphs 0013 to 0058 of JP2014-26228A, yellow pigments described in JP2019-8014A, quinophthalone compounds described in JP6607427B3, compounds described in KR10-2014-0034963A, compounds described in JP2017-095706A, compounds described in TW2019-20495A, compounds described in JP6607427B, and the like can also be used.

In addition, as the yellow pigment, compounds described in JP2018-62644A can also be used. These compounds can also be used as a pigment derivative.

Further, as described in JP2018-155881A, C. I. Pigment Yellow 129 may be added for the purpose of improving weather fastness.

The yellow pigment may be used alone or in combination of two or more kinds thereof.

The content of the yellow pigment in the curable composition according to the embodiment of the present disclosure is preferably 10 parts by mass to 100 parts by mass with respect to 100 parts by mass of a green pigment. The upper limit is preferably 80 parts by mass or less, more preferably 70 parts by mass or less, and still more preferably 50 parts by mass or less. The lower limit is preferably 12.5 parts by mass or more, more preferably 14 parts by mass or more, and still more preferably 16 parts by mass or more.

In addition, in a case where the curable composition according to the embodiment of the present disclosure is red, from the viewpoint of sensitivity and spectral characteristics, the mass ratio of the red pigment and the yellow pigment is preferably red pigment:yellow pigment=100:0 to 50:50, more preferably 95:5 to 60:40, and particularly preferably 90:10 to 70:30.

Examples of chromatic pigments other than the red and yellow include the following.

C. I. Pigment Orange 2, 5, 13, 16, 17:1, 31, 34, 36, 38, 43, 46, 48, 49, 51, 52, 55, 59, 60, 61, 62, 64, 71, and 73 (all of which are orange pigments);

C. I. Pigment Green 7, 10, 36, 37, 58, 59, 62, and 63 (all of which are green pigments);

C. I. Pigment Violet 1, 19, 23, 27, 32, 37, 42, 60 (triarylmethane-based), 61 (xanthene-based), and the like (all of which are violet pigments); and C. I. Pigment Blue 1, 2, 15, 15:1, 15:2, 15:3, 15:4, 15:6, 16, 22, 60, 64, 66, 79, 80, 87 (monoazo-based), 88 (methine-based), and the like (all of which are blue pigments).

As the blue pigment, an aluminum phthalocyanine compound having a phosphorus atom can also be used. Specific examples thereof include the compounds described in paragraphs 0022 to 0030 of JP2012-247591A and paragraph 0047 of JP2011-157478A.

As the green pigment, a halogenated zinc phthalocyanine compound having an average number of halogen atoms in one molecule of 10 to 14, an average number of bromine atoms in one molecule of 8 to 12, and an average number of chlorine atoms in one molecule of 2 to 5 can also be used. As specific examples thereof, compounds described in WO2015/118720A, compounds described in CN2010-6909027A, a phthalocyanine compound having a phosphoric acid ester as a ligand, and the like can also be used.

In addition, as the green pigment, green pigments described in JP2019-8014A or JP2018-180023Amay be used.

Examples of the white pigment include titanium oxide, strontium titanate, barium titanate, zinc oxide, magnesium oxide, zirconium oxide, aluminum oxide, barium sulfate, silica, talc, mica, aluminum hydroxide, calcium silicate, aluminum silicate, hollow resin particles, and zinc sulfide. The white pigment is preferably particles having a titanium atom, more preferably titanium oxide. In addition, the white pigment is preferably a particle having a refractive index of 2.10 or more with respect to light having a wavelength of 589 nm. The above-mentioned refractive index is preferably 2.10 to 3.00 and more preferably 2.50 to 2.75.

In addition, as the white pigment, the titanium oxide described in "Titanium Oxide-Physical Properties and Applied Technology, written by Manabu Kiyono, pages 13 to 45, published on Jun. 25, 1991, published by Shuppan Co., Ltd." can also be used.

The white pigment is not limited to a compound formed of a single inorganic substance, and may be particles combined with other materials. For example, it is preferable to use a particle having a pore or other materials therein, a particle having a number of inorganic particles attached to a core particle, or a core-shell composite particle composed of a core particle formed of polymer particles and a shell layer formed of inorganic fine nanoparticles. With regard to the core-shell composite particle composed of a core particle formed of polymer particles and a shell layer formed of inorganic fine nanoparticles, reference can be made to, for example, the descriptions in paragraphs 0012 to 0042 of JP2015-047520A, the contents of which are incorporated herein by reference.

As the white pigment, hollow inorganic particles can also be used. The hollow inorganic particles refer to inorganic particles having a structure with a cavity therein, and the cavity is enclosed by an outer shell. As the hollow inorganic particles, hollow inorganic particles described in JP2011-075786A, WO2013/061621A, JP2015-164881A, and the like can be used, the contents of which are incorporated herein by reference.

The black pigment is not particularly limited, and a known black pigment can be used. Examples thereof include carbon black, titanium black, and graphite, and carbon black or titanium black is preferable and titanium black is more preferable. The titanium black is black particles containing a titanium atom, and is preferably lower titanium oxide or titanium oxynitride. The surface of the titanium black can be modified, as necessary, according to the purpose of improving dispersibility, suppressing aggregating properties, and the like. For example, the surface of the titanium black can be coated with silicon oxide, titanium oxide, germanium oxide, aluminum oxide, magnesium oxide, or zirconium oxide. In addition, a treatment with a water-repellent substance as described in JP2007-302836A can be performed. Examples of the black pigment include Color Index (C. I.) Pigment Black 1 and 7. It is preferable that the titanium black has a small primary particle diameter of the individual particles and has a small average primary particle diameter. Specifically, the average primary particle diameter thereof is preferably 10 to 45 nm. The titanium black can be used as a dispersion. Examples thereof include a dispersion which includes titanium black particles and silica particles and in which the content ratio of Si atoms to Ti atoms is adjusted to a range of 0.20 to 0.50. With regard to the dispersion, reference can be made to the description in paragraphs 0020 to 0105 of JP2012-169556A, the contents of which are incorporated herein by reference. Examples of a commercially available product of the titanium black include Titanium black 10S, 12S, 13R, 13M, 13M-C, 13R-N, 13M-T (trade name; manufactured by Mitsubishi Materials Corporation), and Tilack D (trade name; manufactured by Akokasei Co., Ltd.).

In addition, as the other pigments, thiazole compounds described in JP2012-158649A, azo compounds described in JP2011-184493A, or azo compounds described in JP2011-145540A can also be used.

In addition, as the pigment, at least one pigment selected from the group consisting of C. I. Pigment Red 254, 264, and 272, C. I. Pigment Yellow 139, 150, and 185, C. I. Pigment Blue 15:6, C. I. Pigment Violet 23, C. I. Pigment Green 36 and 58, and TiON is preferable.

In addition, preferred examples of the pigment used in the present disclosure include a pigment having an X-ray diffraction pattern by a specific CuKα ray. Specific examples thereof include phthalocyanine pigments described in JP6561862B, diketopyrrolopyrrole pigments described in JP6413872B, and azo pigments (C. I. Pigment Red 269) described in JP6281345B.

The curable composition according to the embodiment of the present disclosure may include only one kind of pigment or two or more kinds thereof.

The content of the pigment in the total solid content of the curable composition is preferably 5 mass % or more, more preferably 10 mass % or more, still more preferably 20 mass % or more, particularly preferably 30 mass % or more, and most preferably 40 mass % or more. The upper limit of the content of the pigment is preferably 80 mass % or less, more preferably 70 mass % or less, and still more preferably 60 mass % or less.

In addition, the curable composition according to the embodiment of the present disclosure may include a dye, but it is preferable that the content of the dye is less than the content of the pigment.

As the dye, a known dye can be used without any particular limitation. Examples thereof include a pyrazoleazo compound, an anilinoazo compound, a triarylmethane compound, an anthraquinone compound, an anthrapyridone compound, a benzylidene compound, an oxonol compound, a pyrazolotriazoleazo compound, a pyridoneazo compound, a cyanine compound, a phenothiazine compound, a pyrrolopyrazoleazomethine compound, a xanthene compound, a phthalocyanine compound, a benzopyran compound, an indigo compound, and a pyrromethene compound.

In addition, as the dye, methine dyes described in JP2019-073695A, methine dyes described in JP2019-073696A, methine dyes described in JP2019-073697A, and methine dyes described in JP2019-073698A can also be used.

In the curable composition according to the embodiment of the present disclosure, a coloring agent multimer can also be used. The coloring agent multimer is preferably a dye which is used after being dissolved in a solvent. In addition, the coloring agent multimer may form a particle. In a case where the coloring agent multimer is a particle, the coloring agent multimer is usually used in a state of being dispersed in a solvent. The coloring agent multimer in the particle state can be obtained by, for example, emulsion polymerization, and specific examples thereof include the compounds and production methods described in JP2015-214682A. The coloring agent multimer has two or more coloring agent structures in one molecule, and preferably has three or more coloring agent structures in one molecule. The upper limit is particularly not limited, but may be 100 or less. A plurality of coloring agent structures included in one molecule may be the same coloring agent structure or different coloring agent structures. The weight-average molecular weight (Mw) of the coloring agent multimer is preferably 2,000 to 50,000. The lower limit is more preferably 3,000 or more and still more preferably 6,000 or more. The upper limit is more preferably 30,000 or less and still more preferably 20,000 or less. As the coloring agent multimer, the compounds described in JP2011-213925A, JP2013-041097A, JP2015-028144A, JP2015-030742A, WO2016/031442A, or the like can also be used.

<Polymerizable Compound>

In the curable composition according to the embodiment of the present disclosure, the content of the polymerizable compound is 15 mass % or less with respect to the total solid content of the curable composition.

That is, in the curable composition according to the embodiment of the present disclosure, the polymerizable compound is not contained, or the content of the polymerizable compound is more than 0 mass % and 15 mass % or less with respect to the total solid content of the curable composition.

It is needless to say that the above-described polymerizable compound in the present disclosure is a polymerizable compound other than the specific block copolymer.

The polymerizable compound is preferably a compound having an ethylenically unsaturated group. Examples of the ethylenically unsaturated group include a vinyl group, a (meth)allyl group, and a (meth)acryloyl group. The polymerizable compound used in the present disclosure is preferably a radically polymerizable compound.

Any chemical forms of a monomer, a prepolymer, an oligomer, or the like may be used as the polymerizable compound, but a monomer is preferable. The molecular weight of the polymerizable compound is preferably 100 to 3,000. The upper limit is more preferably 2,000 or less, still more preferably 1,500 or less, and particularly preferably 1,000 or less. The lower limit is more preferably 150 or more and still more preferably 250 or more.

The polymerizable compound is preferably a compound including 3 or more ethylenically unsaturated groups, more preferably a compound including 3 to 15 ethylenically unsaturated groups, and still more preferably a compound having 3 to 6 ethylenically unsaturated groups. In addition, the polymerizable compound is preferably a trifunctional to pentadecafunctional (meth)acrylate compound and more preferably a trifunctional to hexafunctional (meth)acrylate compound. Specific examples of the polymerizable compound include the compounds described in paragraphs 0095 to 0108 of JP2009-288705A, paragraph 0227 of JP2013-029760A, paragraphs 0254 to 0257 of JP2008-292970A, paragraphs 0034 to 0038 of JP2013-253224A, paragraph 0477 of JP2012-208494A, JP2017-048367A, JP6057891B, JP6031807B, and JP2017-194662A, the contents of which are incorporated herein by reference.

From the viewpoint of storage stability of the composition and color loss resistance of a film to be obtained, the ethylenically unsaturated group value (hereinafter, referred to as a C=C value) of the polymerizable compound is preferably 2 mmol/g to 14 mmol/g. The lower limit is more preferably 3 mmol/g or more, still more preferably 4 mmol/g or more, and particularly preferably 5 mmol/g or more. The upper limit is preferably more 12 mmol/g or less, still more preferably 10 mmol/g or less, and particularly preferably 8 mmol/g or less. The C=C value of the polymerizable compound is obtained by dividing the number of ethylenically unsaturated groups included in one molecule of the polymerizable compound by the molecular weight of the polymerizable compound.

As the polymerizable compound, dipentaerythritol triacrylate (as a commercially available product, KAYARAD D-330 manufactured by Nippon Kayaku Co., Ltd.), dipentaerythritol tetraacrylate (as a commercially available product, KAYARAD D-320 manufactured by Nippon Kayaku Co., Ltd.), dipentaerythritol penta(meth)acrylate (as a commercially available product, KAYARAD D-310 manufactured by Nippon Kayaku Co., Ltd.), dipentaerythritol hexa (meth)acrylate (as a commercially available product, KAYARAD DPHA manufactured by Nippon Kayaku Co., Ltd., NK ESTER A-DPH-12E manufactured by Shin-Nakamura Chemical Co., Ltd.), or a compound having a structure in which the (meth)acryloyl group of these compounds is bonded through an ethylene glycol and/or a propylene glycol residue (for example, SR454 and SR499 which are commercially available from Sartomer) is preferable. In addition, as the polymerizable compound, diglycerin ethylene oxide (EO)-modified (meth)acrylate (as a commercially available product, M-460 manufactured by TOAGOSEI CO., LTD.), pentaerythritol tetraacrylate (NK ESTER A-TMMT manufactured by Shin-Nakamura Chemical Co., Ltd.), 1,6-hexanediol diacrylate (KAYARAD HDDA manufactured by Nippon Kayaku Co., Ltd.), RP-1040 (manufactured by Nippon Kayaku Co., Ltd.), ARONIX TO-2349 (manufactured by TOAGOSEI CO., LTD.), NK OLIGO UA-7200 (manufactured by Shin-Nakamura Chemical Co., Ltd.), 8UH-1006 and 8UH-1012 (manufactured by Taisei Fine Chemical Co., Ltd.), Light Acrylate POB-A0 (manufactured by KYOEISHA CHEMICAL Co., Ltd.), and the like can also be used.

In addition, as the polymerizable compound, it is also preferable to use a trifunctional (meth)acrylate compound such as trimethylolpropane tri(meth)acrylate, trimethylolpropane propyleneoxide-modified tri(meth)acrylate, trimethylolpropane ethyleneoxide-modified tri(meth)acrylate, isocyanuric acid ethyleneoxide-modified tri(meth)acrylate, and pentaerythritol tri(meth)acrylate. Examples of a commercially available product of the trifunctional (meth)acrylate compound include ARONIX M-309, M-310, M-321, M-350, M-360, M-313, M-315, M-306, M-305, M-303, M-452, and M-450 (manufactured by TOAGOSEI CO., LTD.), NK ESTER A9300, A-GLY-9E, A-GLY-20E, A-TMM-3, A-TMM-3L, A-TMM-3LM-N, A-TMPT, and TMPT (manufactured by Shin-Nakamura Chemical Co., Ltd.), and KAYARAD GPO-303, TMPTA, THE-330, TPA-330, and PET-30 (manufactured by Nippon Kayaku Co., Ltd.).

As the polymerizable compound, a compound having an isocyanurate skeleton can also be used. By using a polymerizable compound having an isocyanurate skeleton, solvent resistance of a film to be obtained can be improved. Specific examples of the polymerizable compound having an isocyanurate skeleton include tris(2-acryloyloxyethyl) isocyanurate and F-caprolactone-modified tris(2-acryloxyethyl) isocyanurate. Examples of a commercially available product thereof include FANCRYL FA-731A (manufactured by Hitachi Chemical Co., Ltd.), NK ESTER A-9300, A-9300-1CL, and A9300-3CL (manufactured by Shin-Nakamura Chemical Co., Ltd.), and ARONIX M-315 (manufactured by TOAGOSEI CO., LTD.).

As the polymerizable compound, a compound having an acid group can also be used. By using a polymerizable compound having an acid group, the polymerizable compound in an unexposed area is easily removed during development and the generation of the development residue can be suppressed. Examples of the acid group include a carboxyl group, a sulfo group, and a phosphoric acid group, and a carboxyl group is preferable. Examples of a commercially available product of the polymerizable compound having an acid group include ARONIX M-305, M-510, M-520, and ARONIX TO-2349 (manufactured by TOAGOSEI CO., LTD.). The acid value of the polymerizable compound having an acid group is preferably 0.1 mgKOH/g to 40 mgKOH/g and more preferably 5 mgKOH/g to 30 mgKOH/g. In a case where the acid value of the polymerizable compound is 0.1 mgKOH/g or more, solubility in a developer is good, and in a case where the acid value of the polymerizable compound is 40 mgKOH/g or less, it is advantageous in production and handling.

As the polymerizable compound, a compound having a caprolactone structure can also be used. Examples of the polymerizable compound having a caprolactone structure include DPCA-20, DPCA-30, DPCA-60, and DPCA-120, each of which is commercially available as KAYARAD DPCA series from Nippon Kayaku Co., Ltd.

As the polymerizable compound, a polymerizable compound having an alkyleneoxy group can also be used. The polymerizable compound having an alkyleneoxy group is preferably a polymerizable compound having an ethyleneoxy group and/or a propyleneoxy group, more preferably a polymerizable compound having an ethyleneoxy group, and still more preferably a trifunctional to hexafunctional (meth) acrylate compound having 4 to 20 ethyleneoxy groups. Examples of a commercially available product of the polymerizable compound having an alkyleneoxy group include SR-494 manufactured by Sartomer, which is a tetrafunctional (meth)acrylate having four ethyleneoxy groups, and KAYARAD TPA-330 manufactured by Nippon Kayaku Co., Ltd., which is a trifunctional (meth)acrylate having three isobutyleneoxy groups.

As the polymerizable compound, a polymerizable compound having a fluorene skeleton can also be used. Examples of a commercially available product of the polymerizable compound having a fluorene skeleton include OGSOL EA-0200, EA-0300 (manufactured by Osaka Gas Chemicals Co., Ltd., (meth)acrylate monomer having a fluorene skeleton).

As the polymerizable compound, it is also preferable to use a compound which does not substantially include environmentally regulated substances such as toluene. Examples of a commercially available product of such a compound include KAYARAD DPHA LT and KAYARAD DPEA-12 LT (manufactured by Nippon Kayaku Co., Ltd.).

The urethane acrylates described in JP1973-041708B (JP-S48-041708B), JP1976-037193A (JP-S51-037193A), JP1990-032293B (JP-H02-032293B), or JP1990-016765B (JP-H02-016765B), or the urethane compounds having an ethylene oxide skeleton described in JP1983-049860B (JP-S58-049860B), JP1981-017654B (JP-S56-017654B), JP1987-039417B (JP-S62-039417B), or JP1987-039418B (JP-S62-039418B) are also suitable as the polymerizable compound. In addition, the polymerizable compounds having an amino structure or a sulfide structure in the molecule, described in JP1988-277653A (JP-S63-277653A), JP1988-260909A (JP-S63-260909A), or JP1989-105238A (JP-H01-105238A), are also preferably used. In addition, as the polymerizable compound, commercially available products such as UA-7200 (manufactured by Shin-Nakamura Chemical Co., Ltd.), DPHA-40H (manufactured by Nippon Kayaku Co., Ltd.), and UA-306H, UA-306T, UA-306I, AH-600, T-600, AI-600, and LINC-202UA (manufactured by KYOEISHA CHEMICAL Co., Ltd.) can also be used.

The content of the polymerizable compound in the total solid content of the curable composition is preferably more than 0 mass % and 15 mass % or less, and more preferably 0.01 mass % to 15 mass %. The lower limit is still preferably 0.05 mass % or more and particularly preferably 0.1 mass % or more. The upper limit is preferably 15 mass % or less and particularly preferably 4 mass % or less. The polymerizable compound may be used singly or in combination of two or more kinds thereof. In a case where two or more kinds thereof are used in combination, the total thereof is preferably within the above-described range.

In addition, the total content of a resin described later and the polymerizable compound in the total solid content of the curable composition is preferably 10 mass % to 50 mass %. The lower limit is preferably 15 mass % or more, more preferably 20 mass % or more, and still more preferably 25 mass % or more. The upper limit is preferably 45 mass % or less, more preferably 40 mass % or less, and still more preferably 35 mass % or less.

In addition, the content of the polymerizable compound is preferably 10 parts by mass to 2,000 parts by mass with respect to 100 parts by mass of the photopolymerization initiator. The upper limit is preferably 1,800 parts by mass or less and more preferably 1,500 parts by mass or less. The lower limit is preferably 30 parts by mass or more and more preferably 50 parts by mass or more.

<Photopolymerization Initiator>

The curable composition according to the embodiment of the present disclosure includes a photopolymerization initiator.

The photopolymerization initiator is not particularly limited, and can be appropriately selected from known photopolymerization initiators. For example, a compound having photosensitivity to light in a range from an ultraviolet region to a visible region is preferable. The photopolymerization initiator is preferably a photoradical polymerization initiator.

Examples of the photopolymerization initiator include a halogenated hydrocarbon derivative (for example, a compound having a triazine skeleton or a compound having an oxadiazole skeleton), an acylphosphine compound, a hexaarylbiimidazole, an oxime compound, an organic peroxide, a thio compound, a ketone compound, an aromatic onium salt, an α-hydroxyketone compound, and an α-aminoketone compound. From the viewpoint of exposure sensitivity, as the photopolymerization initiator, a trihalomethyltriazine compound, a benzyldimethylketal compound, an α-hydroxyketone compound, an α-aminoketone compound, an acylphosphine compound, a phosphine oxide compound, a metallocene compound, an oxime compound, a triarylimidazole dimer, an onium compound, a benzothiazole compound, a benzophenone compound, an acetophenone compound, a cyclopentadiene-benzene-iron complex, a halomethyl oxadiazole compound, or a 3-aryl-substituted coumarin compound is preferable, a compound selected from an oxime compound, an α-hydroxyketone compound, an α-aminoketone compound, or an acylphosphine compound is more preferable, and an oxime compound is still more preferable. As the photopolymerization initiator, compounds described in paragraphs 0065 to 0111 of JP2014-130173A and in JP6301489B, peroxide-based photopolymerization initiators described in MATERIAL STAGE, pp. 37 to 60, vol. 19, No. 3, 2019, photopolymerization initiators described in WO2018/221177A, photopolymerization initiators described in WO2018/110179A, photopolymerization initiators described in JP2019-043864A, photopolymerization initiators described in JP2019-044030A, and organic peroxides described in JP2019-167313A, the contents of which are incorporated herein by reference.

Examples of a commercially available product of the α-hydroxyketone compound include IRGACURE 184, DAROCUR 1173, IRGACURE-500, IRGACURE 2959, and IRGACURE 127 (all of which are manufactured by BASF). Examples of a commercially available product of the α-aminoketone compound include IRGACURE 907, IRGACURE 369, IRGACURE 379, and IRGACURE 379EG (all of which are manufactured by BASF). Examples of a commercially available product of the acylphosphine compound include IRGACURE 819 and DAROCUR TPO (both of which are manufactured by BASF).

Examples of the oxime compound include the compounds described in JP2001-233842A, the compounds described in JP2000-080068A, the compounds described in JP2006-342166A, the compounds described in J. C. S. Perkin II (1979, pp. 1653-1660), the compounds described in J. C. S. Perkin II (1979, pp. 156-162), the compounds described in Journal of Photopolymer Science and Technology (1995, pp. 202-232), the compounds described in JP2000-066385A, the compounds described in JP2000-080068A, the compounds described in JP2004-534797A, the compounds described in JP2006-342166A, the compounds described in JP2017-019766A, the compounds described in JP6065596B, the compounds described in WO2015/152153A, the compounds described in WO2017/051680A, the compounds described in JP2017-198865A, the compounds described in paragraphs 0025 to 0038 of WO2017/164127A, and the compounds described in WO2013/167515A. Specific examples of the oxime compound include 3-benzoyloxyiminobutane-2-one, 3-acetoxyiminobutane-2-one, 3-propionyloxyiminobutane-2-one, 2-acetoxyiminopentane-3-one, 2-acetoxyimino-1-phenylpropane-1-one, 2-benzoyloxyimino-1-phenylpropane-1-one, 3-(4-toluene sulfonyloxy)iminobutane-2-one, and 2-ethoxycarbonyloxyimino-1-phenylpropane-1-one. Examples of a commercially available product thereof include IRGACURE OXE01, IRGACURE OXE02, IRGACURE OXE03, and IRGACURE OXE04 (all of which are manufactured by BASF), TR-PBG-304 (manufactured by TRONLY), and ADEKA OPTOMER N-1919 (manufactured by ADEKA Corporation; photopolymerization initiator 2 described in JP2012-014052A). In addition, as the oxime compound, it is also preferable to use a compound having no colorability or a compound having high transparency and being resistant to discoloration. Examples of a commercially available product thereof include ADEKA ARKLS NCI-730, NCI-831, and NCI-930 (all of which are manufactured by ADEKA Corporation).

An oxime compound having a fluorene ring can also be used as the photopolymerization initiator. Specific examples of the oxime compound having a fluorene ring include compounds described in JP2014-137466A.

In addition, as the photopolymerization initiator, an oxime compound having a skeleton in which at least one benzene ring of a carbazole ring is a naphthalene ring can also be used. Specific examples of such an oxime compound include the compounds described in WO2013/083505A.

In the present disclosure, an oxime compound having a fluorine atom can also be used as the photopolymerization initiator. Specific examples of the oxime compound having a fluorine atom include compounds described in JP2010-262028A, Compounds 24 and 36 to 40 described in JP2014-500852A, and Compound (C-3) described in JP2013-164471A.

An oxime compound having a nitro group can be used as the photopolymerization initiator. It is preferable that the oxime compound having a nitro group is a dimer. Specific examples of the oxime compound having a nitro group include a compound described in paragraphs 0031 to 0047 of JP2013-114249A and paragraphs 0008 to 0012 and 0070 to 0079 of JP2014-137466A, a compound described in paragraphs 0007 to 0025 of JP4223071B, and ADEKAARKLS NCI-831 (manufactured by ADEKA Corporation).

An oxime compound having a benzofuran skeleton can also be used as the photopolymerization initiator. Specific examples thereof include OE-01 to OE-75 described in WO2015/036910A.

Specific examples of the oxime compound which are preferably used in the present disclosure are shown below, but the present disclosure is not limited thereto.

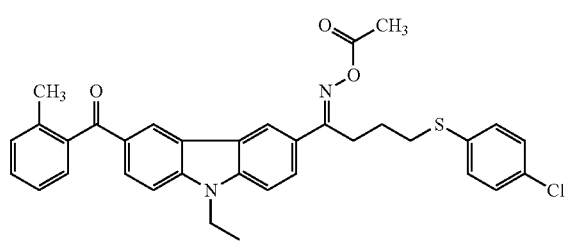

(C-1)

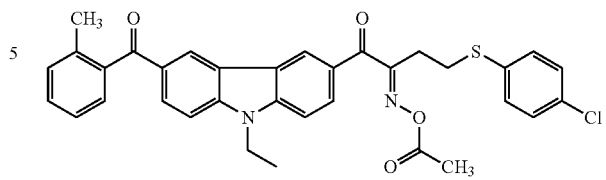

(C-2)

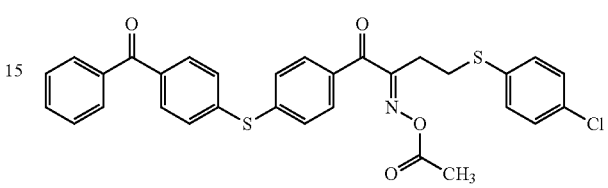

(C-3)

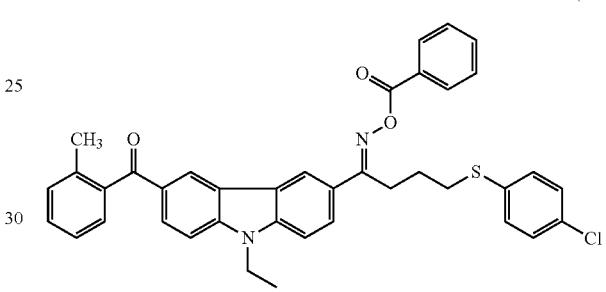

(C-4)

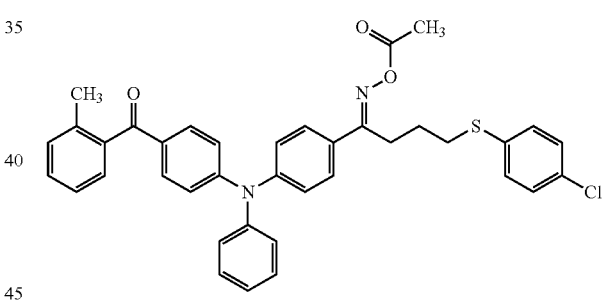

(C-5)

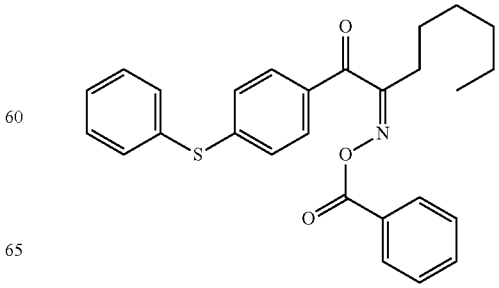

(C-6)

(C-7)

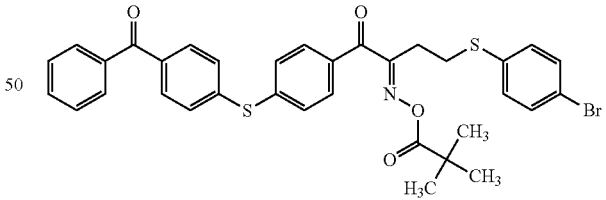

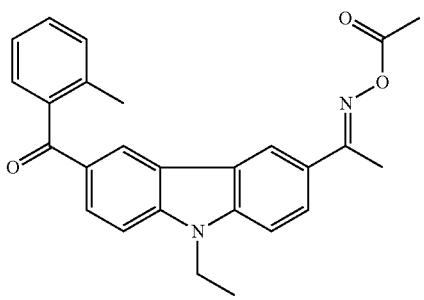
(C-8)

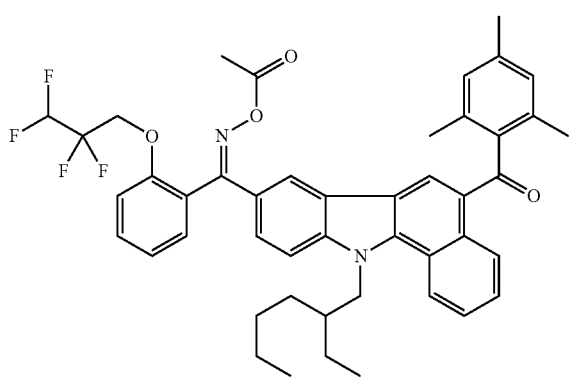
(C-13)

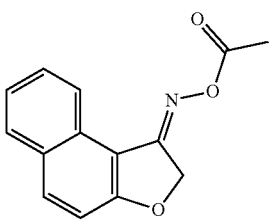
(C-9)

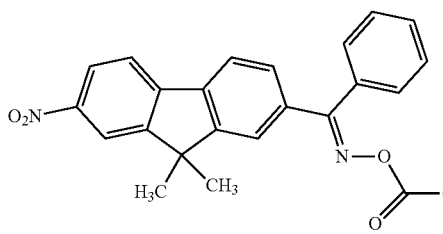
(C-14)

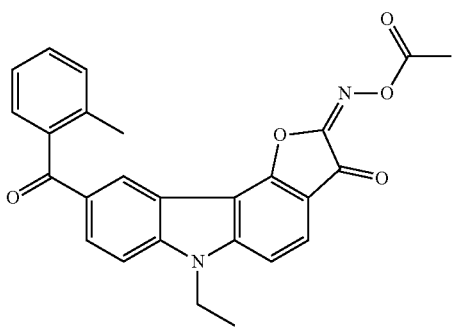
(C-10)

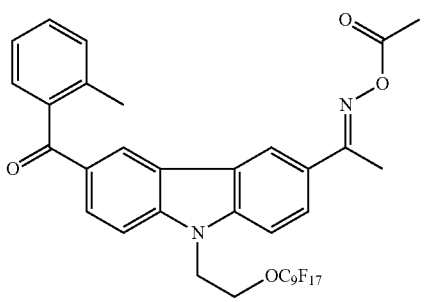
(C-11)

(C-12)

The oxime compound is preferably a compound having a maximal absorption wavelength in a wavelength range of 350 to 500 nm and more preferably a compound having a maximal absorption wavelength in a wavelength range of 360 to 480 nm. In addition, from the viewpoint of sensitivity, the molar absorption coefficient of the oxime compound at a wavelength of 365 nm or 405 nm is preferably high, more preferably 1,000 to 300,000, still more preferably 2,000 to 300,000, and particularly preferably 5,000 to 200,000. The molar absorption coefficient of a compound can be measured using a well-known method. For example, the molar absorption coefficient is preferably measured by a spectrophotometer (Cary-5 spectrophotometer, manufactured by Varian Medical Systems, Inc.) using an ethyl acetate solvent at a concentration of 0.01 g/L.

As the photopolymerization initiator, a bifunctional or tri- or higher functional photoradical polymerization initiator may be used. By using such a photoradical polymerization initiator, two or more radicals are generated from one molecule of the photoradical polymerization initiator, and as a result, good sensitivity is obtained. In addition, in a case of using a compound having an asymmetric structure, crystallinity is reduced so that solubility in a solvent or the like is improved, precipitation is to be difficult over time, and temporal stability of the curable composition can be improved. Specific examples of the bifunctional or tri- or higher functional photoradical polymerization initiator include dimers of the oxime compounds described in JP2010-527339A, JP2011-524436A, WO2015/004565A, paragraphs 0407 to 0412 of JP2016-532675A, and paragraphs 0039 to 0055 of WO2017/033680A; the compound (E) and compound (G) described in JP2013-522445A; Cmpd 1 to 7 described in WO2016/034963A; the oxime ester photoinitiators described in paragraph 0007 of JP2017-523465A; the photoinitiators described in paragraphs 0020 to 0033 of JP2017-167399A; the photopolymerization initiator (A) described in paragraphs 0017 to 0026 of JP2017-151342A; and the oxime ester photoinitiators described in JP6469669B.

The content of the photopolymerization initiator in the total solid content of the curable composition is preferably 0.1 mass % to 30 mass %. The lower limit is more preferably 0.5 mass % or more and particularly preferably 1 mass % or more. The upper limit is more preferably 20 mass % or less and particularly preferably 15 mass % or less.

The photopolymerization initiator may be used singly or in combination of two or more kinds thereof. In a case where two or more kinds thereof are used, the total content thereof is preferably within the above-described range.

<Resin>

The curable composition according to the embodiment of the present disclosure preferably contains a resin.

It is needless to say that the above-described resin in the present disclosure is a resin other than the specific block copolymer.

The resin is blended in, for example, an application for dispersing particles such as a pigment in a composition or an application as a binder. Mainly, a resin which is used for dispersing particles such as a pigment is also referred to as a dispersant. However, such applications of the resin are only exemplary, and the resin can also be used for other purposes in addition to such applications.

As the resin, a polymer dispersant described later is preferably included.

In addition, as the resin, an alkali-soluble resin described later is preferably included.

The weight-average molecular weight (Mw) of the resin is preferably 3,000 to 2,000,000. The upper limit is more preferably 1,000,000 or less and particularly preferably 500,000 or less. The lower limit is more preferably 4,000 or more and particularly preferably 5,000 or more.

Examples of the resin include a (meth)acrylic resin, an ene-thiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyamideimide resin, a polyolefin resin, a cyclic olefin resin, a polyester resin, and a styrene resin. These resins may be used singly or as a mixture of two or more kinds thereof. In addition, the resins described in paragraphs 0041 to 0060 of JP2017-206689A, the resins described in paragraphs 0022 to 0071 of JP2018-010856A, and the resins described in paragraphs 0153 to 0167 of JP2018-173660A can also be used.

As the resin, a resin having an acid group can be preferably used. According to this aspect, developability of the curable composition can be improved, and pixels having excellent rectangularity can be easily formed. Examples of the acid group include a carboxy group, a phosphoric acid group, a sulfo group, and a phenolic hydroxy group, and a carboxy group is preferable. The resin having an acid group can be suitably used, for example, as an alkali-soluble resin.

The resin having an acid group preferably includes a constitutional unit having an acid group in the side chain, and more preferably includes 5 mol % to 70 mol % of constitutional units having an acid group in the side chain with respect to the total constitutional units of the resin. The upper limit of the content of the constitutional unit having an acid group in the side chain is more preferably 50 mol % or less and particularly preferably 30 mol % or less. The lower limit of the content of the constitutional unit having an acid group in the side chain is more preferably 10 mol % or more and particularly preferably 20 mol % or more. In the present disclosure, in a case where the content of the constitutional unit is expressed in mol %, the constitutional unit is synonymous with the monomer unit.

With regard to the resin having an acid group, reference can be made to the description in paragraph 0167 of JP2018-173660A, the description in paragraphs 0558 to 0571 of JP2012-208494A (paragraphs 0685 to 0700 of the corresponding US2012/0235099A), and the description in paragraphs 0076 to 0099 of JP2012-198408A, the contents of which are incorporated herein by reference. A commercially available product can also be used as the resin having an acid group.

The acid value of the resin having an acid group is preferably 30 mgKOH/g to 500 mgKOH/g. The lower limit is more preferably 50 mgKOH/g or more and particularly preferably 70 mgKOH/g or more. The upper limit is more preferably 400 mgKOH/g or less, still more preferably 300 mgKOH/g or less, and particularly preferably 200 mgKOH/g or less. The weight-average molecular weight (Mw) of the resin having an acid group is preferably 5000 to 100,000. In addition, the number-average molecular weight (Mn) of the resin having an acid group is preferably 1,000 to 20,000.

The curable composition according to the embodiment of the present disclosure can also include a resin (polymer dispersant) as a dispersant. Examples of the dispersant include an acidic dispersant (acidic resin) and a basic dispersant (basic resin). Here, the acidic dispersant (acidic resin) represents a resin in which the amount of the acid group is larger than the amount of the basic group. The acidic dispersant (acidic resin) is preferably a resin in which the amount of the acid group occupies 70 mol % or more in a case where the total content of the acid group and the basic group is 100 mol %, and more preferably a resin substantially consisting of only an acid group. The acid group included in the acidic dispersant (acidic resin) is preferably a carboxy group. The acid value of the acidic dispersant (acidic resin) is preferably 40 mgKOH/g to 105 mgKOH/g, more preferably 50 mgKOH/g to 105 mgKOH/g, and still more preferably 60 mgKOH/g to 105 mgKOH/g. In addition, the basic dispersant (basic resin) represents a resin in which the amount of the basic group is larger than the amount of the acid group. The basic dispersant (basic resin) is preferably a resin in which the amount of the basic group is more than 50 mol % in a case where the total amount of the acid group and the basic group is 100 mol %. The basic group included in the basic dispersant is preferably an amino group.

The resin used as a dispersant preferably includes a constitutional unit having an acid group. In a case where the resin used as a dispersant includes a repeating unit having an acid group, the generation of the development residue can be further suppressed in the formation of a pattern by a photolithography method.

It is also preferable that the resin used as a dispersant is a graft resin. With regard to details of the graft resin, reference can be made to the description in paragraphs 0025 to 0094 of JP2012-255128A, the contents of which are incorporated herein by reference.

It is also preferable that the resin used as a dispersant is a polyimine-based dispersant including a nitrogen atom in at least one of the main chain or the side chain. As the polyimine-based dispersant, a resin having a main chain which has a partial structure having a functional group of pKa 14 or less, and a side chain which has 40 to 10,000 atoms, in which at least one of the main chain or the side chain has a basic nitrogen atom, is preferable. The basic nitrogen atom is not particularly limited as long as it is a nitrogen atom exhibiting basicity. With regard to the polyimine-based dispersant, reference can be made to the description in paragraphs 0102 to 0166 of JP2012-255128A, the contents of which are incorporated herein by reference.

It is also preferable that the resin used as a dispersant is a resin having a structure in which a plurality of polymer chains are bonded to a core portion. Examples of such a resin include dendrimers (including star polymers). In addition, specific examples of the dendrimer include polymer compounds C-1 to C-31 described in paragraphs 0196 to 0209 of JP2013-043962A.

In addition, the above-described resin (alkali-soluble resin) having an acid group can also be used as a dispersant.

In addition, it is also preferable that the resin used as a dispersant is a resin including a constitutional unit having an ethylenically unsaturated group in the side chain. The content of the constitutional unit having an ethylenically unsaturated group in the side chain is preferably 10 mol % or more, more preferably 10 mol % to 80 mol %, and still more preferably 20 mol % to 70 mol % with respect to the total constitutional units of the resin.

In addition, as the resin used as a dispersant, a resin having a constitutional unit represented by Formula D1 can be suitably used.

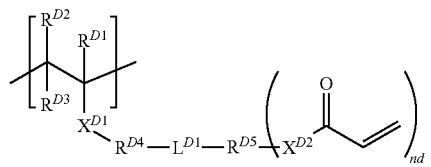

Formula D1

In Formula D1, $R^{D1}$ to $R^{D3}$ each independently represent a hydrogen atom or an alkyl group, $X^{D1}$ represents —COO—, —CONR—, or an arylene group, where R represents a hydrogen atom, an alkyl group, or an aryl group, $R^{D4}$ represents a divalent linking group, $L^{D1}$ represents a group represented by Formula D2 or Formula D3, $R^{D5}$ represents an (nd+1)-valent linking group, $X^{D2}$ represents an oxygen atom or —$NR^{D4}$—, where $R^{D4}$ represents a hydrogen atom, an alkyl group, or an aryl group, and nd represents an integer of 1 or more.

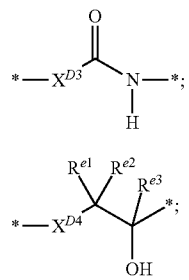

Formula D2

Formula D3

In Formulae D2 and D3, $X^{D3}$ represents an oxygen atom or —NH—, $X^{D4}$ represents an oxygen atom or —COO—, $R^{c1}$ to $R^{c3}$ each independently represent a hydrogen atom or an alkyl group, at least two of $R^{c1}$ to $R^{c3}$ may be bonded to each other to form a ring structure, and * represents a bonding position with other structures.

Preferred examples of the constitutional unit represented by Formula D1 include the following structures, and it is needless to say that the constitutional unit is not limited thereto.

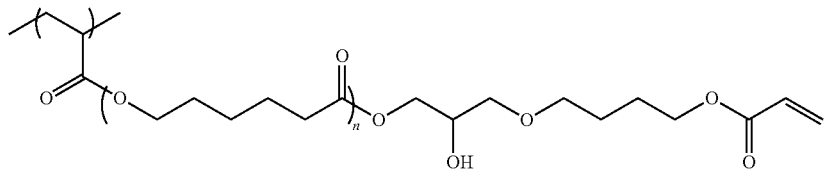

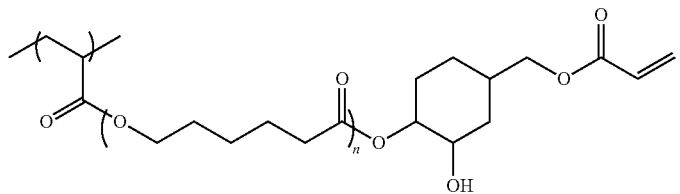

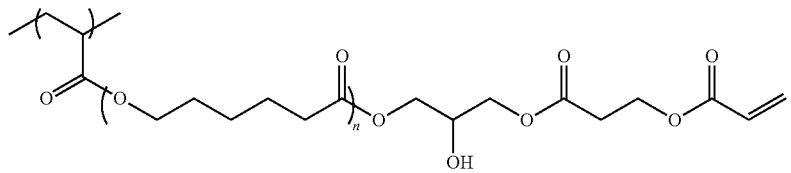

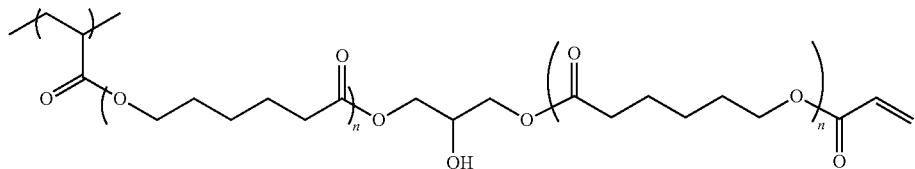

-continued
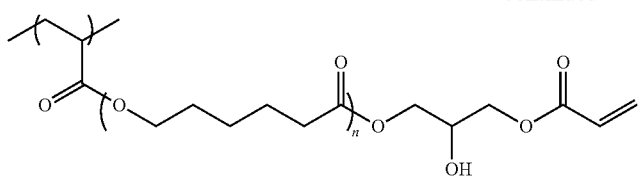
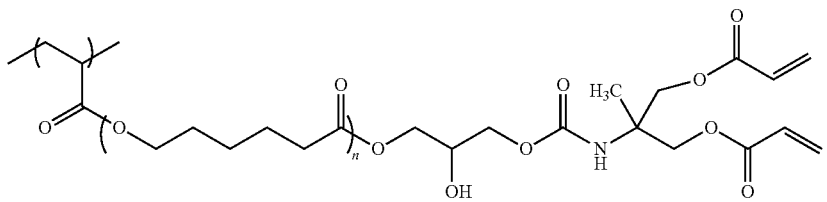
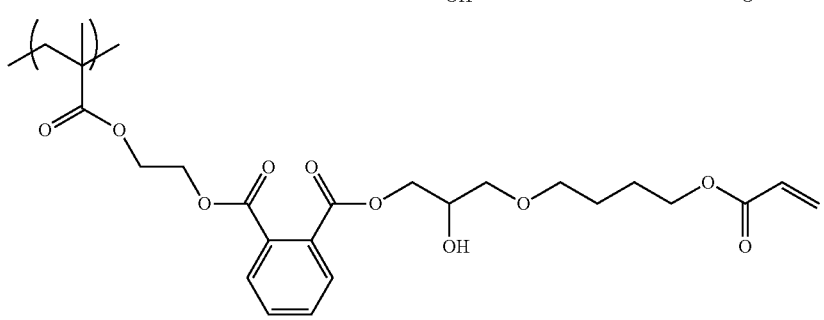
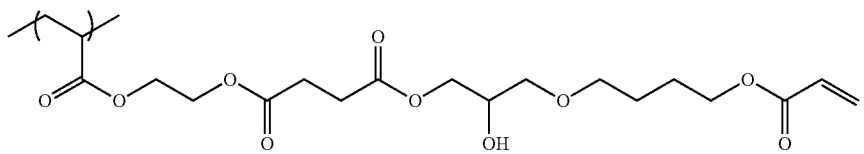
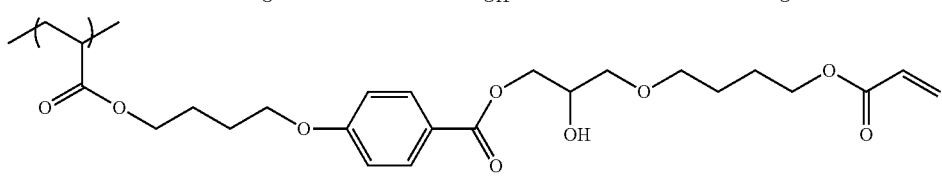
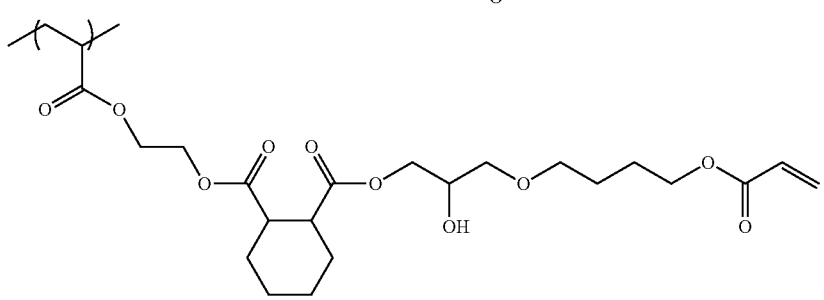
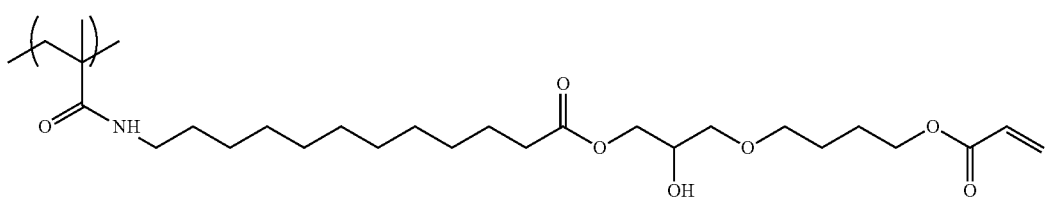
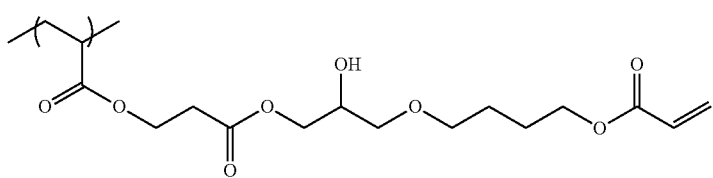

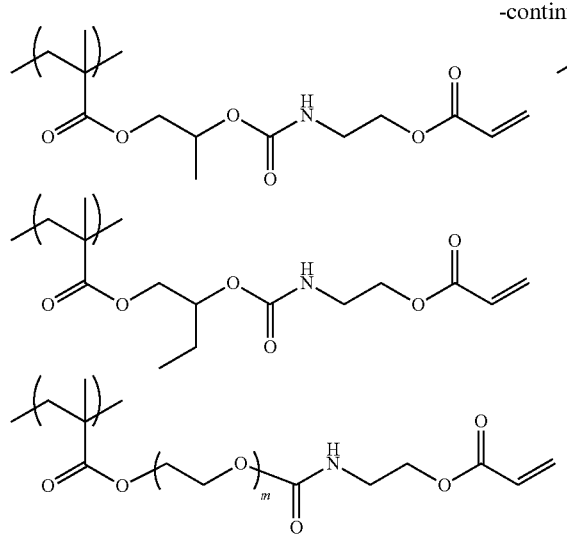
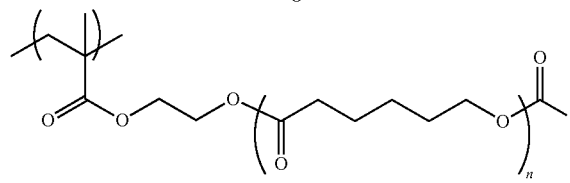
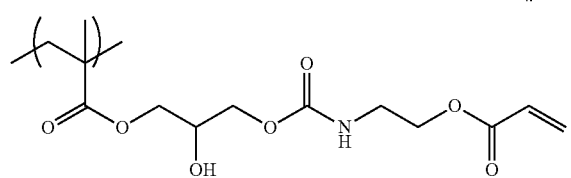
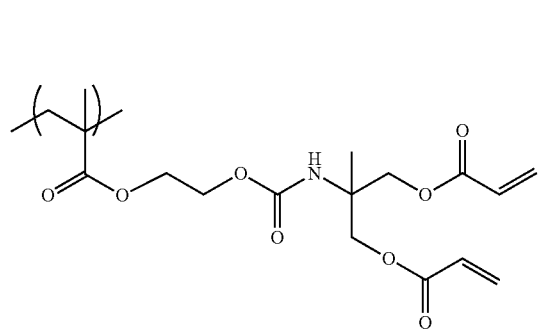
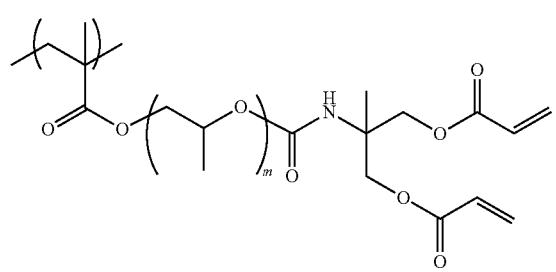
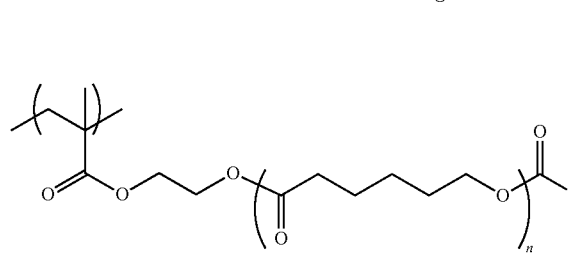
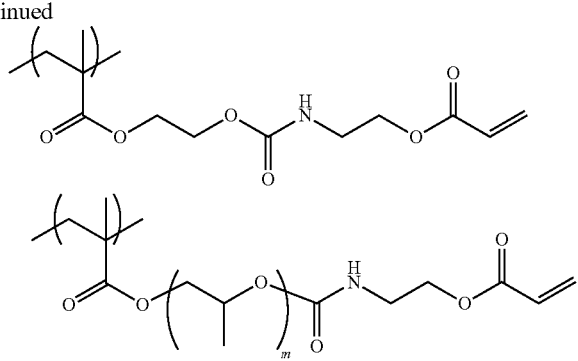
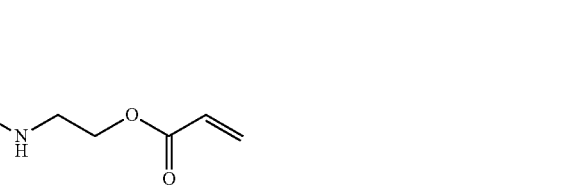
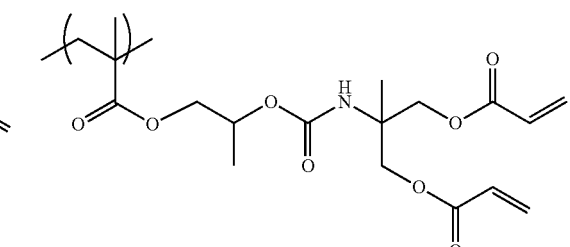
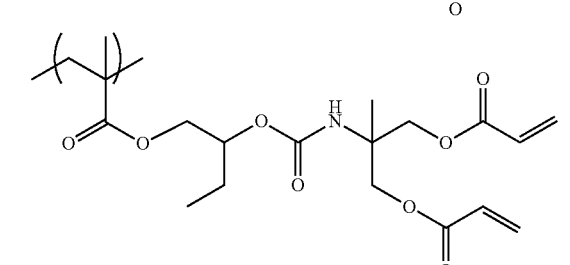
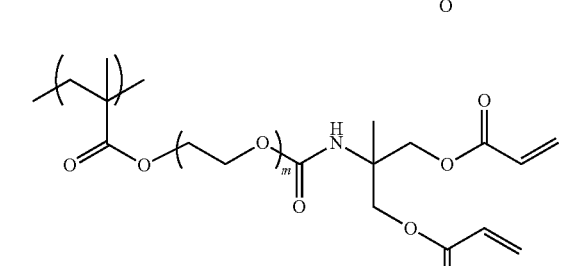
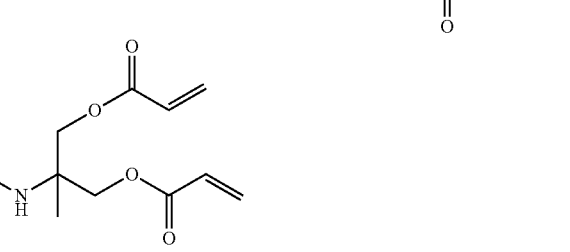

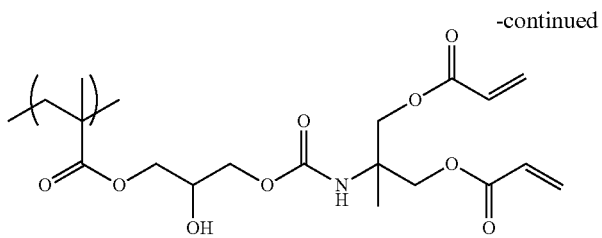

m represents an integer of 2 or more, and n represents an integer of 1 or more.

In addition, as the dispersant, the following P1 or P2 is preferably mentioned.

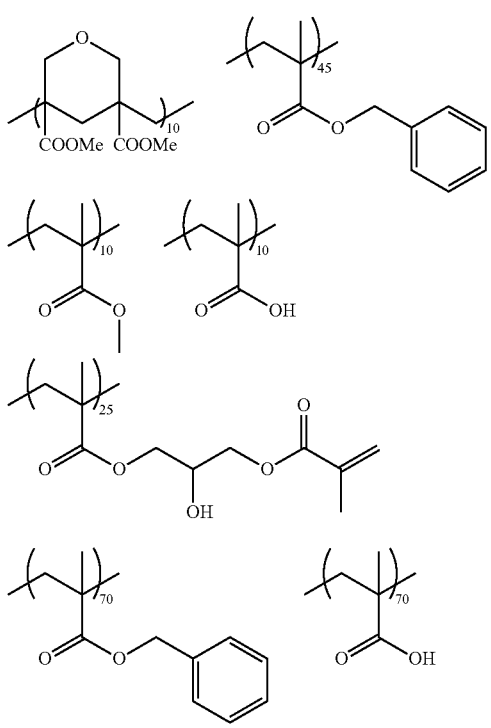

A commercially available product is also available as the dispersant, and specific examples thereof include DISPERBYK series (for example, DISPERBYK-111, 161, and the like) manufactured by BYK Chemie, and Solsperse series (for example, Solsperse 76500) manufactured by Lubrizol Corporation. The pigment dispersing agents described in paragraphs 0041 to 0130 of JP2014-130338A can also be used, the contents of which are incorporated herein by reference. The resin described as a dispersant can be used for an application other than the dispersant. For example, the resin can also be used as a binder.

The content of the resin in the total solid content of the curable composition is preferably 5 mass % to 50 mass %. The lower limit is more preferably 10 mass % or more and particularly preferably 15 mass % or more. The upper limit is more preferably 40 mass % or less, still more preferably 35 mass % or less, and particularly preferably 30 mass % or less. In addition, the content of the resin (alkali-soluble resin) having an acid group in the total solid content of the curable composition is preferably 5 mass % to 50 mass %. The lower limit is more preferably 10 mass % or more and particularly preferably 15 mass % or more. The upper limit is more preferably 40 mass % or less, still more preferably 35 mass % or less, and particularly preferably 30 mass % or less. In addition, from the reason that excellent developability is easily obtained, the content of the resin (alkali-soluble resin) having an acid group in the total amount of the resin is preferably 30 mass % or more, more preferably 50 mass % or more, still more preferably 70 mass % or more, and particularly preferably 80 mass % or more. The upper limit may be 100 mass %, 95 mass % or less, or 90 mass % or less.

In addition, from the viewpoint of curability, developability, and film-forming property, the total content of the polymerizable compound and the resin in the total solid content of the curable composition is preferably 10 mass % to 65 mass %. The lower limit is more preferably 15 mass % or more, still more preferably 20 mass % or more, and particularly preferably 30 mass % or more. The upper limit is more preferably 60 mass % or less, still more preferably 50 mass % or less, and particularly preferably 40 mass % or less. In addition, the curable composition according to the embodiment of the present disclosure preferably contains 30 parts by mass to 300 parts by mass of the resin with respect to 100 parts by mass of the polymerizable compound. The lower limit is more preferably 50 parts by mass or more and particularly preferably 80 parts by mass or more. The upper limit is more preferably 250 parts by mass or less and particularly preferably 200 parts by mass or less.

<Pigment Derivative>

The curable composition according to the embodiment of the present disclosure can contain a pigment derivative. According to this aspect, storage stability of the curable composition can be further improved. Examples of the pigment derivative include a compound having a structure in which a part of a pigment is substituted with an acid group, a basic group, a group having a salt structure, a group having a quinone structure, or a group having a tetracyanoquinodimethane structure.

As the pigment derivative, a compound represented by Formula (B1) is preferable.

In Formula (B1), P represents a coloring agent structure, L represents a single bond or a linking group, X represents an acid group, a basic group, a group having a salt structure, or a phthalimidomethyl group, m represents an integer of 1 or more, n represents an integer of 1 or more, in a case where m represents 2 or more, a plurality of L's and a plurality of X's may be different from each other, and in a case where n represents 2 or more, a plurality of X's may be different from each other.

Examples of the coloring agent structure represented by P include a pyrrolopyrrole coloring agent structure, a diketopyrrolopyrrole coloring agent structure, a quinacridone coloring agent structure, an anthraquinone coloring agent structure, a dianthraquinone coloring agent structure, a benzoisoindole coloring agent structure, a thiazine indigo coloring agent structure, an azo coloring agent structure, a quinophthalone coloring agent structure, a phthalocyanine coloring agent structure, a naphthalocyanine coloring agent structure, a dioxazine coloring agent structure, a perylene coloring agent structure, a perinone coloring agent structure, a benzimidazolone coloring agent structure, a benzothiazole coloring agent structure, a benzimidazole coloring agent structure, and a benzoxazole coloring agent structure.

Examples of the linking group represented by L include a hydrocarbon group, a heterocyclic group, —NR—, —SO$_2$—, —S—, —O—, —CO—, or a group of a combination of these groups. R represents a hydrogen atom, an alkyl group, or an aryl group.

Examples of the acid group represented by X include a carboxyl group, a sulfo group, a carboxylic acid amide group, a sulfonic acid amide group, and an imide acid group. As the carboxylic acid amide group, a group represented by —NHCOR$^{X1}$ is preferable. As the sulfonic acid amide group, a group represented by —NHSO$_2$R$^{X2}$ is preferable. As the imide acid group, a group represented by —SO$_2$NHSO$_2$R$^{X3}$, —CONHSO$_2$R$^{X4}$, —CONHCOR$^{X5}$, or —SO$_2$NHCOR$^{X6}$ is preferable. R$^{X1}$ to R$^{X6}$ each independently represent a hydrocarbon group or a heterocyclic group. The hydrocarbon group and heterocyclic group represented by R$^{X1}$ to R$^{X6}$ may further have a substituent. As the substituent which may be further included, a halogen atom is preferable and a fluorine atom is more preferable. Examples of the basic group represented by X include an amino group. Examples of the salt structure represented by X include a salt of the acid group or the basic group described above.

Examples of the pigment derivative include compounds having the following structures. In addition, for example, compounds described in JP1981-118462A (JP-S56-118462A), JP1988-264674A (JP-S63-264674A), JP1989-217077A (JP-H1-217077A), JP1991-9961A (JP-H3-9961A), JP1991-26767A (JP-H3-26767A), JP1991-153780A (JP-H3-153780A), JP1991-45662A (JP-H3-45662A), JP1992-285669A (JP-H4-285669A), JP1994-145546A (JP-H6-145546A), JP1994-212088A (JP-H6-212088A), JP1994-240158A (JP-H6-240158A), JP1998-30063A (JP-H10-30063A), JP1998-195326A (JP-H10-195326A), paragraphs 0086 to 0098 of WO2011/024896A, paragraphs 0063 to 0094 of WO2012/102399A, and paragraph 0082 of WO2017/038252A can be used, the contents of which are incorporated herein by reference.

Further, as the pigment derivative, compounds described in JP2015-172732A (metal salt of a quinophthalone compound having a sulfo group), JP2014-199308A, JP2014-85562A, JP2014-35351A, or JP2008-81565A can also be used, the contents of which are incorporated herein by reference.

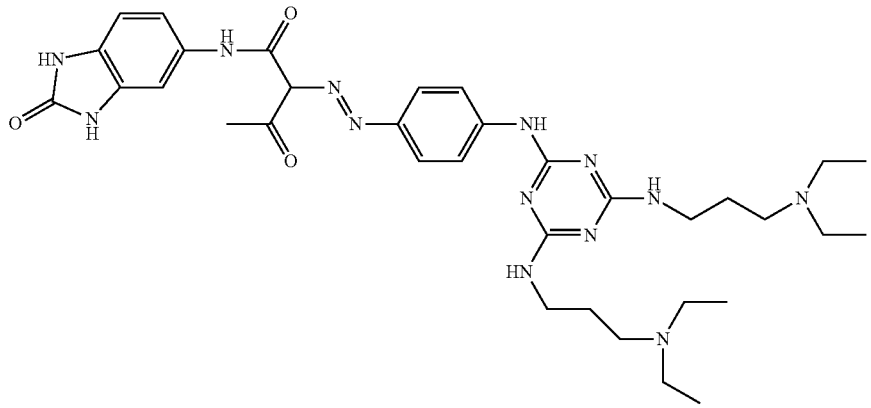

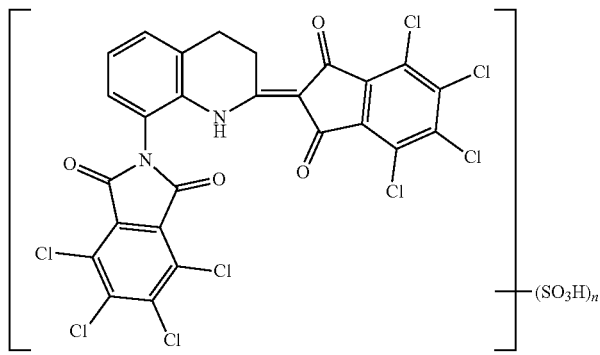

-continued

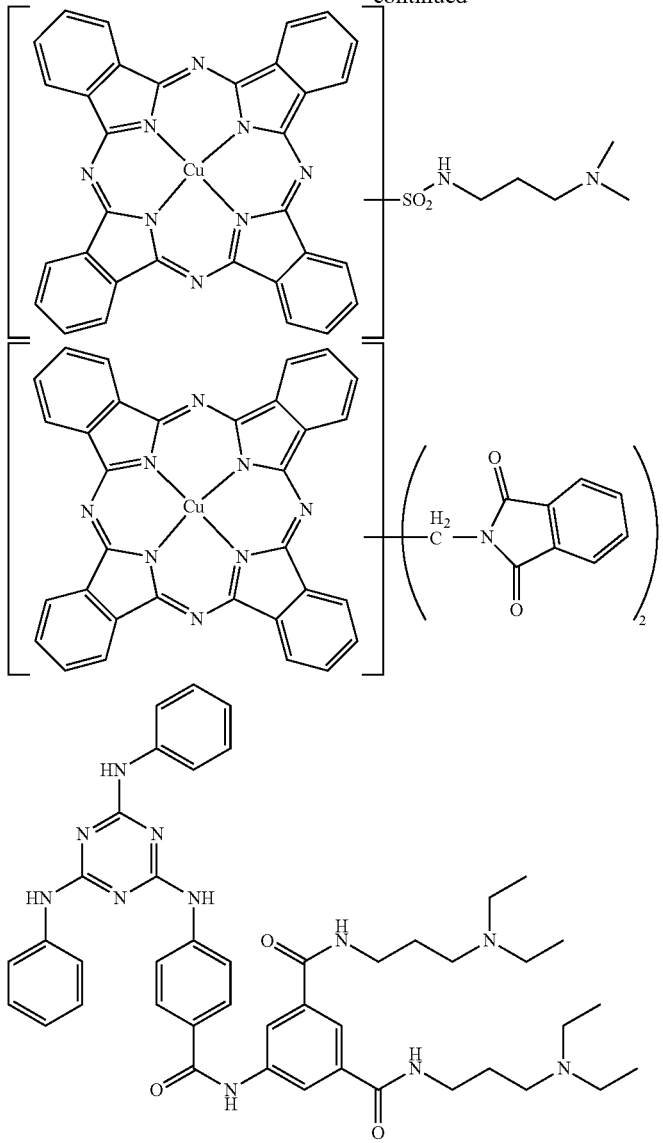

The content of the pigment derivative in the total solid content of the curable composition is preferably 0.3 mass % to 20 mass %. The lower limit is more preferably 0.6 mass % or more and particularly preferably 0.9 mass % or more. The upper limit is more preferably 15 mass % or less, still more preferably 12.5 mass % or less, and particularly preferably 10 mass % or less.

In addition, the content of the pigment derivative is preferably 1 part by mass to 30 parts by mass with respect to 100 parts by mass of the pigment. The lower limit is more preferably 2 parts by mass or more and particularly preferably 3 parts by mass or more. The upper limit is more preferably 25 parts by mass or less, still more preferably 20 parts by mass or less, and particularly preferably 15 parts by mass or less.

The pigment derivative may be used singly or in combination of two or more kinds thereof. In a case where two or more kinds of pigment derivatives are used in combination, it is preferable that the total content of the two or more kinds of pigment derivatives is within the above-described range.

<Compound Having Cyclic Ether Group>

The curable composition according to the embodiment of the present disclosure can contain a compound having a cyclic ether group. Examples of the cyclic ether group include an epoxy group and an oxetanyl group. The compound having a cyclic ether group is preferably a compound having an epoxy group. Examples of the compound having an epoxy group include a compound having one or more epoxy groups in one molecule, and a compound two or more epoxy groups in one molecule is preferable. It is preferable to have 1 to 100 epoxy groups in one molecule. The upper limit of the epoxy group may be, for example, 10 or less or 5 or less. The lower limit of the epoxy group is preferably 2 or more. As the compound having an epoxy group, the compounds described in paragraphs 0034 to 0036 of JP2013-011869A, paragraphs 0147 to 0156 of JP2014-043556A, and paragraphs 0085 to 0092 of JP2014-089408A, and the compounds described in JP2017-179172A can also be used. The contents of which are incorporated herein by reference.

The compound having an epoxy group may be a low-molecular-weight compound (preferably having a molecular weight of less than 2,000 and more preferably having a molecular weight of less than 1,000) or a high-molecular-weight compound (macromolecule) (for example, having a molecular weight of 1,000 or more, and in a case of a polymer, having a weight-average molecular weight of 1,000 or more). The weight-average molecular weight of the compound having an epoxy group is preferably 200 to 100,000 and more preferably 500 to 50,000. The upper limit of the weight-average molecular weight is preferably 10,000 or less, more preferably 5,000 or less, and still more preferably 3,000 or less.

As the compound having an epoxy group, an epoxy resin can be preferably used. Examples of the epoxy resin include an epoxy resin which is a glycidyl etherified product of a phenol compound, an epoxy resin which is a glycidyl etherified product of various novolak resins, an alicyclic epoxy resin, an aliphatic epoxy resin, a heterocyclic epoxy resin, a glycidyl ester-based epoxy resin, a glycidyl amine-based epoxy resin, an epoxy resin obtained by glycidylating halogenated phenols, a condensate of a silicon compound having an epoxy group and another silicon compound, and a copolymer of a polymerizable unsaturated compound having an epoxy group and another polymerizable unsaturated compound. The epoxy equivalent of the epoxy resin is preferably 310 g/eq to 3,300 g/eq, more preferably 310 g/eq to 1,700 g/eq, and still more preferably 310 g/eq to 1,000 g/eq.

Examples of a commercially available product of the compound having a cyclic ether group include EHPE 3150 (manufactured by Daicel Corporation), EPICLON N-695 (manufactured by DIC Corporation), and MARPROOF G-0150M, G-0105SA, G-0130SP, G-0250SP, G-1005S, G-1005SA, G-1010S, G-2050M, G-01100, and G-01758 (all of which are manufactured by NOF Corporation, an epoxy group-containing polymer).

In a case where the curable composition according to the embodiment of the present disclosure contains a compound having a cyclic ether group, the content of the compound having a cyclic ether group in the total solid content of the curable composition is preferably 0.1 mass % to 20 mass %. The lower limit is more preferably 0.5 mass % or more and particularly preferably 1 mass % or more. The upper limit is more preferably 15 mass % or less and particularly preferably 10 mass % or less. The compound having a cyclic ether group may be used singly or in combination of two or more kinds thereof. In a case of using two or more kinds thereof, the total content thereof is preferably within the above-described range.

<<Near-Infrared Absorber>>

The curable composition according to the embodiment of the present disclosure can further include a near-infrared absorber. The near-infrared absorber is preferably a compound having a maximal absorption wavelength in a wavelength range of more than 700 nm and 1,800 nm or less. In addition, in the near-infrared absorber, a ratio $A^1/A^2$, which is a ratio of an absorbance $A^1$ at a wavelength of 500 nm to an absorbance $A^2$ at the maximal absorption wavelength, is preferably 0.08 or less and more preferably 0.04 or less.

Examples of the near-infrared absorber include a pyrrolopyrrole compound, a cyanine compound, a squarylium compound, a phthalocyanine compound, a naphthalocyanine compound, a quaterrylene compound, a merocyanine compound, a croconium compound, an oxonol compound, an iminium compound, a dithiol compound, a triarylmethane compound, a pyrromethene compound, an azomethine compound, an anthraquinone compound, a dibenzofuranone compound, a metal oxide, and a metal boride. Examples of the pyrrolopyrrole compound include compounds described in paragraphs 0016 to 0058 of JP2009-263614A, compounds described in paragraphs 0037 to 0052 of JP2011-68731A, and compounds described in paragraphs 0010 to 0033 of WO2015/166873A. Examples of the squarylium compound include compounds described in paragraphs 0044 to 0049 of JP2011-208101A, compounds described in paragraphs 0060 and 0061 of JP6065169B, compounds described in paragraph 0040 of WO2016/181987A, compounds described in JP2015-176046A, compounds described in paragraph 0072 of WO2016/190162A, compounds described in paragraphs 0196 to 0228 of JP2016-74649A, compounds described in paragraph 0124 of JP2017-67963A, compounds described in WO2017/135359A, compounds described in JP2017-114956A, compounds described in JP6197940B, and compounds described in WO2016/120166A. Examples of the cyanine compound include compounds described in paragraphs 0044 and 0045 of JP2009-108267A, compounds described in paragraphs 0026 to 0030 of JP2002-194040A, compounds described in JP2015-172004A, compounds described in JP2015-172102A, compounds described in JP2008-88426A, and compounds described in paragraph 0090 of WO2016/190162A. Examples of the croconium compound include compounds described in JP2017-82029A. Examples of the iminium compound include compounds described in JP2008-528706A, compounds described in JP2012-012399A, compounds described in JP2007-92060A, and compounds described in paragraphs 0048 to 0063 of WO2018/043564A. Examples of the phthalocyanine compound include compounds described in paragraph 0093 of JP2012-77153A, oxytitanium phthalocyanine described in JP2006-343631A, and compounds described in paragraphs 0013 to 0029 of JP2013-195480A. Examples of the naphthalocyanine compound include compounds described in paragraph 0093 of JP2012-77153A. Examples of the metal oxide include indium tin oxide, antimony tin oxide, zinc oxide, Al-doped zinc oxide, fluorine-doped tin dioxide, niobium-doped titanium dioxide, and tungsten oxide. The details of tungsten oxide can be found in paragraph 0080 of JP2016-006476A, the content of which is incorporated herein by reference. Examples of the metal boride include lanthanum boride. Examples of a commercially available product of lanthanum boride include $LaB_6$—F (manufactured by JAPAN NEW METALS CO., LTD.). In addition, as the metal boride, compounds described in WO2017/119394A can also be used. Examples of a commercially available product of indium tin oxide include F-ITO (manufactured by DOWA HIGHTECH CO., LTD.).

In addition, as the near-infrared absorber, the squarylium compounds described in JP2017-197437A, the squarylium compounds described in paragraphs 0090 to 0107 of WO2017/213047A, the pyrrole ring-containing compounds described in paragraphs 0019 to 0075 of JP2018-054760A, the pyrrole ring-containing compounds described in paragraphs 0078 to 0082 of JP2018-040955A, the pyrrole ring-containing compounds described in paragraphs 0043 to 0069 of JP2018-002773A, the squarylium compounds having an aromatic ring at the α-amide position described in paragraphs 0024 to 0086 of JP2018-041047A, the amide-linked squarylium compounds described in JP2017-179131A, the compounds having a pyrrole bis-type squarylium skeleton or a croconium skeleton described in JP2017-141215A, the dihydrocarbazole bis-type squarylium compounds described in JP2017-082029A, the asymmetric compounds described in paragraphs 0027 to 0114 of JP2017-068120A, the pyrrole ring-containing compounds (carbazole type) described in JP2017-067963A, the phthalocyanine compounds described in JP6251530B, and the like can also be used.

In a case where the curable composition according to the embodiment of the present disclosure contains a near-infrared absorber, the content of the near-infrared absorber in the total solid content of the curable composition is preferably 1 mass % or more, more preferably 5 mass % or more, and particularly preferably 10 mass % or more. The upper limit is not particularly limited, but is preferably 70 mass % or less, more preferably 65 mass % or less, and still more preferably 60 mass % or less.

In addition, it is also possible that the curable composition according to the embodiment of the present disclosure does not substantially contain the near-infrared absorber. In a case where the curable composition according to the embodiment of the present disclosure does not substantially include the near-infrared absorber, the content of the near-infrared absorber in the total solid content of the curable composition according to the embodiment of the present disclosure is preferably 0.1 mass % or less, more preferably 0.05 mass % or less, and particularly preferably 0 mass %.

<Silane Coupling Agent>

The curable composition according to the embodiment of the present disclosure can contain a silane coupling agent. According to this aspect, adhesiveness of a film to be obtained with a support can be further improved. The silane coupling agent means a silane compound having a hydrolyzable group and other functional groups. In addition, the hydrolyzable group refers to a substituent directly linked to a silicon atom and capable of forming a siloxane bond due to at least one of a hydrolysis reaction or a condensation reaction. Examples of the hydrolyzable group include a halogen atom, an alkoxy group, and an acyloxy group, and an alkoxy group is preferable. That is, it is preferable that the silane coupling agent is a compound having an alkoxysilyl group. Examples of the functional group other than the hydrolyzable group include a vinyl group, a (meth)allyl group, a (meth)acryloyl group, a mercapto group, an epoxy group, an oxetanyl group, an amino group, a ureide group, a sulfide group, an isocyanate group, and a phenyl group, and an amino group, a (meth)acryloyl group, or an epoxy group is preferable. Specific examples of the silane coupling agent include the compounds described in paragraphs 0018 to 0036 of JP2009-288703A and the compounds described in paragraphs 0056 to 0066 of JP2009-242604A, the contents of which are incorporated herein by reference.

The content of the silane coupling agent in the total solid content of the curable composition is preferably 0.1 mass % to 5 mass %. The upper limit is more preferably 3 mass % or less and particularly preferably 2 mass % or less. The lower limit is more preferably 0.5 mass % or more and particularly preferably 1 mass % or more. The silane coupling agent may be used singly or in combination of two or more kinds thereof. In a case of using two or more kinds thereof, the total content thereof is preferably within the above-described range.

<Organic Solvent>

The curable composition according to the embodiment of the present disclosure may include an organic solvent. Basically, the organic solvent is not particularly limited as long as it satisfies the solubility of the respective components and the application properties of the curable composition. Examples of the organic solvent include an ester solvent, a ketone solvent, an alcohol solvent, an amide solvent, an ether solvent, and a hydrocarbon solvent. The details of the organic solvent can be found in paragraph 0223 of WO2015/166779A, the content of which is incorporated herein by reference. In addition, an ester solvent in which a cyclic alkyl group is substituted or a ketone solvent in which a cyclic alkyl group is substituted can also be preferably used. Specific examples of the organic solvent include polyethylene glycol monomethyl ether, dichloromethane, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, cyclohexyl acetate, cyclopentanone, ethyl carbitol acetate, butyl carbitol acetate, propylene glycol monomethyl ether, propylene glycol monomethyl ether acetate, 3-methoxy-N,N-dimethylpropanamide, and 3-butoxy-N,N-dimethylpropanamide. In this case, it may be preferable that the content of aromatic hydrocarbons (such as benzene, toluene, xylene, and ethylbenzene) as the organic solvent is low (for example, 50 parts per million (ppm) by mass or less, 10 ppm by mass or less, or 1 ppm by mass or less with respect to the total amount of the organic solvent) in consideration of environmental aspects and the like.

As the organic solvent, an organic solvent having a low metal content is preferably used. For example, the metal content in the organic solvent is preferably 10 mass parts per billion (ppb) or less. Optionally, an organic solvent having a metal content at a mass parts per trillion (ppt) level may be used. For example, such an organic solvent is available from Toyo Gosei Co., Ltd. (The Chemical Daily, Nov. 13, 2015).

Examples of a method for removing impurities such as a metal from the organic solvent include distillation (such as molecular distillation and thin-film distillation) and filtration using a filter. The filter pore size of the filter used for the filtration is preferably 10 μm or less, more preferably 5 μm or less, and still more preferably 3 μm or less. As a material of the filter, polytetrafluoroethylene, polyethylene, or nylon is preferable.

The organic solvent may include an isomer (a compound having the same number of atoms and a different structure). In addition, only one kind of isomers may be included, or a plurality of isomers may be included.

The organic solvent preferably has the content of peroxides of 0.8 mmol/L or less, and more preferably, the organic solvent does not substantially include peroxides.

The content of the organic solvent in the curable composition is preferably 10 mass % to 95 mass %, more preferably 20 mass % to 90 mass %, and still more preferably 30 mass % to 90 mass %.

In addition, from the viewpoint of environmental regulation, it is preferable that the curable composition according to the embodiment of the present disclosure does not substantially contain environmentally regulated substances. In the present disclosure, the description "does not substantially contain environmentally regulated substances" means that the content of the environmentally regulated substances in the coloring composition is 50 ppm by mass or less, preferably 30 ppm by mass or less, still more preferably 10 ppm by mass or less, and particularly preferably 1 ppm by mass or less. Examples of the environmentally regulated substances include benzenes; alkylbenzenes such as toluene and xylene; and halogenated benzenes such as chlorobenzene. These compounds are registered as environmentally regulated substances in accordance with Registration Evaluation Authorization and Restriction of Chemicals (REACH) rules, Pollutant Release and Transfer Register (PRTR) law, Volatile Organic Compounds (VOC) regulation, and the like, and strictly regulated in their usage and handling method. These compounds can be used as a solvent in a case of producing respective components used in the curable composition according to the embodiment of the present disclosure, and may be incorporated into the curable composition as a residual solvent. From the viewpoint of human safety and environmental considerations, it is preferable to reduce these substances as much as possible. Examples of a method for reducing the environmentally regulated substances include a method for reducing the environmentally regulated substances by distilling the environmentally regulated substances from a system by heating or depressurizing the system such that the temperature of the system is equal to or higher than a boiling point of the environmentally regulated substances. In addition, in a case of distilling a small amount of the environmentally regulated substances, it is also useful to azeotrope with a solvent having the boiling point equivalent to that of the above-described solvent in order to increase efficiency. In addition, in a case of containing a compound having radical polymerizability, in order to suppress the radical polymerization reaction proceeding during the distillation under reduced pressure to cause cross-linking between the molecules, a polymerization inhibitor or the like may be added and the distillation under reduced pressure is performed. These distillation methods can be performed at any stage of raw material, product (for example, resin solution after polymerization or polyfunctional monomer solution) obtained by reacting the raw material, curable composition produced by mixing these compounds, or the like.

<Polymerization Inhibitor>

The curable composition according to the embodiment of the present disclosure can include a polymerization inhibitor. Examples of the polymerization inhibitor include hydroquinone, p-methoxyphenol, di-tert-butyl-p-cresol, pyrogallol, tert-butyl catechol, benzoquinone, 4,4'-thiobis(3-methyl-6-tert-butylphenol), 2,2'-methylenebis(4-methyl-6-t-butylphenol), and an N-nitrosophenylhydroxylamine salt (an ammonium salt, a cerous salt, or the like). Among these, p-methoxyphenol is preferable. The content of the polymerization inhibitor in the total solid content of the coloring composition is preferably 0.0001 mass % to 5 mass %.

<Surfactant>

The curable composition according to the embodiment of the present disclosure can contain a surfactant. As the surfactant, various surfactants such as a fluorine-based surfactant, a nonionic surfactant, a cationic surfactant, an anionic surfactant, or a silicon-based surfactant can be used. With regard to the surfactant, reference can be made to the description in paragraphs 0238 to 0245 of WO2015/166779A and paragraphs 0253 to 0260 of JP2018-173660A, the contents of which are incorporated herein by reference.

It is preferable that the surfactant is a fluorine-based surfactant. By containing a fluorine-based surfactant in the curable composition, liquid characteristics (particularly, fluidity) are further improved, and liquid saving properties can be further improved. In addition, it is possible to form a film with a small thickness unevenness.

The content of the surfactant in the total solid content of the curable composition is preferably 0.001 mass % to 5.0 mass % and more preferably 0.005 mass % to 3.0 mass %. The surfactant may be used singly or in combination of two or more kinds thereof. In a case of using two or more kinds thereof, the total content thereof is preferably within the above-described range.

<Ultraviolet Absorber>

The curable composition according to the embodiment of the present disclosure can contain an ultraviolet absorber. As the ultraviolet absorber, a conjugated diene compound, an aminodiene compound, a salicylate compound, a benzophenone compound, a benzotriazole compound, an acrylonitrile compound, a hydroxyphenyltriazine compound, an indole compound, a triazine compound, and the like can be used. With regard to details thereof, reference can be made to the description in paragraphs 0052 to 0072 of JP2012-208374A, paragraphs 0317 to 0334 of JP2013-68814A, and paragraphs 0061 to 0080 of JP2016-162946A, the contents of which are incorporated herein by reference. Specific examples of the ultraviolet absorber include a compound having the following structures. Examples of a commercially available product of the ultraviolet absorber include UV-503 (manufactured by Daito Chemical Co., Ltd.). In addition, examples of the benzotriazole compound include MYUA series manufactured by Miyoshi Oil & Fat Co., Ltd. (The Chemical Daily, Feb. 1, 2016). In addition, as the ultraviolet absorber, compounds described in paragraphs 0049 to 0059 of JP6268967B can also be used.

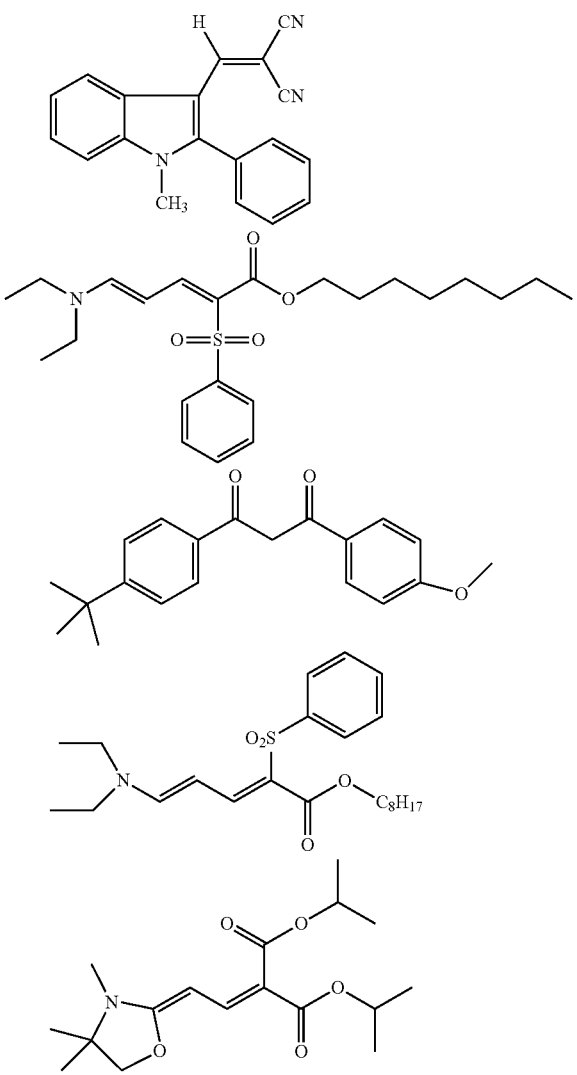

The content of the ultraviolet absorber in the total solid content of the curable composition is preferably 0.01 mass % to 10 mass % and more preferably 0.01 mass % to 5 mass %. The ultraviolet absorber may be used singly or in combination of two or more kinds thereof. In a case where two or more kinds thereof are used, the total content thereof is preferably within the above-described range.

<Antioxidant>

The curable composition according to the embodiment of the present disclosure can contain an antioxidant. Examples of the antioxidant include a phenol compound, a phosphite ester compound, and a thioether compound. As the phenol compound, any phenol compound which is known as a phenol-based antioxidant can be used. Preferred examples of the phenol compound include a hindered phenol compound. A compound having a substituent at a site (ortho position) adjacent to a phenolic hydroxy group is preferable. As the substituent, a substituted or unsubstituted alkyl group having 1 to 22 carbon atoms is preferable. In addition, as the antioxidant, a compound having a phenol group and a phosphite ester group in the same molecule is also preferable. In addition, as the antioxidant, a phosphorus antioxidant can also be suitability used. Examples of the phosphorus antioxidant include tris[2-[[2,4,8,10-tetrakis(1,1-dimethylethyl)dibenzo[d,f][1,3,2]dioxaphosphepin-6-yl]oxy]ethyl]amine, tris[2-[(4,6,9,11-tetra-tert-butyldibenzo[d,f][1,3,2]dioxaphosphepin-2-yl)oxy]ethyl]amine, and ethyl bis(2,4-di-tert-butyl-6-methylphenyl)phosphite. Examples of a commercially available product of the antioxidant include ADK STAB AO-20, ADK STAB AO-30, ADK STAB AO-40, ADK STAB AO-50, ADK STAB AO-50F, ADK STAB AO-60, ADK STAB AO-60G, ADK STAB AO-80, and ADK STAB AO-330 (all of which are manufactured by ADEKA Corporation). In addition, as the antioxidant, compounds described in paragraphs 0023 to 0048 of JP6268967B, compounds described in KR10-2019-0059371A, and the like can also be used.

The content of the antioxidant in the total solid content of the curable composition is preferably 0.01 mass % to 20 mass % and more preferably 0.3 mass % to 15 mass %. The antioxidant may be used singly or in combination of two or more kinds thereof. In a case where two or more kinds thereof are used, the total content thereof is preferably within the above-described range.

<Other Components>

Optionally, the curable composition according to the embodiment of the present disclosure may further contain a sensitizer, a curing accelerator, a filler, a thermal curing accelerator, a plasticizer, and other auxiliary agents (for example, conductive particles, an anti-foaming agent, a flame retardant, a leveling agent, a peeling accelerator, an aromatic chemical, a surface tension adjuster, or a chain transfer agent). By appropriately containing these components, properties such as film properties can be adjusted. The details of the components can be found in, for example, paragraphs 0183 and later of JP2012-003225A (corresponding to paragraph 0237 of US2013/0034812A) and paragraphs 0101 to 0104 and 0107 to 0109 of JP2008-250074A, the content of which is incorporated herein by reference. In addition, optionally, the curable composition according to the embodiment of the present disclosure may contain a potential antioxidant. Examples of the potential antioxidant include a compound in which a portion that functions as the antioxidant is protected by a protective group and the protective group is desorbed by heating the compound at 100° C. to 250° C. or by heating the compound at 80° C. to 200° C. in the presence of an acid/a base catalyst. Examples of the potential antioxidant include compounds described in WO2014/021023A, WO2017/030005A, and JP2017-008219A. Examples of a commercially available product thereof include ADEKA ARKLS GPA-5001 (manufactured by ADEKA Corporation).

In addition, in order to adjust the refractive index of a film to be obtained, the curable composition according to the embodiment of the present disclosure may contain a metal oxide. Examples of the metal oxide include $TiO_2$, $ZrO_2$, $Al_2O_3$, and $SiO_2$. The primary particle diameter of the metal oxide is preferably 1 nm to 100 nm, more preferably 3 nm to 70 nm, and particularly preferably 5 nm to 50 nm. The metal oxide may have a core-shell structure, and in this case, the core portion may be hollow.

In addition, the curable composition according to the embodiment of the present disclosure may include a light-resistance improver. Examples of the light-resistance improver include the compounds described in paragraphs 0036 and 0037 of JP2017-198787A, the compounds described in paragraphs 0029 to 0034 of JP2017-146350A, the compounds described in paragraphs 0036 and 0037, and 0049 to 0052 of JP2017-129774A, the compounds described in paragraphs 0031 to 0034, 0058, and 0059 of JP2017-129674A, the compounds described in paragraphs 0036 and 0037, and 0051 to 0054 of JP2017-122803A, the compounds described in paragraphs 0025 to 0039 of WO2017/164127A, the compounds described in paragraphs 0034 to 0047 of JP2017-186546A, the compounds described in paragraphs 0019 to 0041 of JP2015-25116A, the compounds described in paragraphs 0101 to 0125 of JP2012-145604A, the compounds described in paragraphs 0018 to 0021 of JP2012-103475A, the compounds described in paragraphs 0015 to 0018 of JP2011-257591A, the compounds described in paragraphs 0017 to 0021 of JP2011-191483A, the compounds described in paragraphs 0108 to 0116 of JP2011-145668A, and the compounds described in paragraphs 0103 to 0153 of JP2011-253174A.

For example, in a case where a film is formed by application, the viscosity (25° C.) of the curable composition according to the embodiment of the present disclosure is preferably 1 mPa×s to 100 mPa×s. The lower limit is more preferably 2 mPa×s or more and still more preferably 3 mPa×s or more. The upper limit is more preferably 50 mPa×s or less, still more preferably 30 mPa×s or less, and particularly preferably 15 mPa×s or less.

In the curable composition according to the embodiment of the present disclosure, the content of liberate metal which is not bonded to or coordinated with a pigment or the like is preferably 100 ppm or less, more preferably 50 ppm or less, and still more preferably 10 ppm or less, it is particularly preferable to not contain the liberate metal substantially. According to this aspect, the effects described in JP2012-153796A, JP2000-345085A, JP2005-200560A, JP1996-43620A (JP-H08-43620A), JP2004-145078A, JP2014-119487A, JP2010-083997A, JP2017-090930A, JP2018-025612A, JP2018-025797A, JP2017-155228A, JP2018-36521A, and the like can also be obtained. Examples of the types of the above-described liberate metal include Na, K, Ca, Sc, Ti, Mn, Cu, Zn, Fe, Cr, Co, Mg, Al, Sn, Zr, Ga, Ge, Ag, Au, Pt, Cs, and Bi. In addition, in the curable composition according to the embodiment of the present disclosure, the content of liberate halogen which is not bonded to or coordinated with a pigment or the like is preferably 100 ppm or less, more preferably 50 ppm or less, and still more preferably 10 ppm or less, it is particularly preferable to not contain the liberate halogen substantially. Examples of a method for reducing liberate metals and halogens in the coloring composition include washing with ion exchange water, filtration, ultrafiltration, and purification with an ion exchange resin.

It is also preferable that the curable composition according to the embodiment of the present disclosure does not substantially include terephthalic acid ester.

<Storage Container>

A storage container of the curable composition according to the embodiment of the present disclosure is not particularly limited, and a known storage container can be used. In addition, as the storage container, in order to suppress infiltration of impurities into the raw materials or the curable composition, a multilayer bottle in which a container interior wall having a six-layer structure is formed of six kinds of resins or a bottle in which a container interior wall having a seven-layer structure is formed of six kinds of resins is preferably used. Examples of such a container include a container described in JP2015-123351A.

<Method of Preparing Curable Composition>

The curable composition according to the embodiment of the present disclosure can be prepared by mixing the above-described components with each other. During the preparation of the curable composition, all the components may be dissolved and/or dispersed in an organic solvent at the same time to prepare the curable composition. Optionally, two or more solutions or dispersion liquids in which the respective components are appropriately blended may be prepared, and the solutions or dispersion liquids may be mixed with each other during use (during application) to prepare the curable composition.

In addition, in the preparation of the curable composition, a process of dispersing the pigment is preferably included. In the process of dispersing the pigment, examples of a mechanical force which is used for dispersing the pigment include compression, pressing, impact, shear, and cavitation. Specific examples of these processes include a beads mill, a sand mill, a roll mill, a ball mill, a paint shaker, a microfluidizer, a high-speed impeller, a sand grinder, a flow jet mixer, high-pressure wet atomization, and ultrasonic dispersion. In addition, in the pulverization of the pigment in a sand mill (beads mill), it is preferable to perform a treatment under the condition for increasing a pulverization efficiency by using beads having small diameters; increasing the filling rate of the beads; or the like. In addition, it is preferable that rough particles are removed by filtering, centrifugal separation, and the like after pulverization treatment. In addition, as the process and the disperser for dispersing the pigment, the process and the disperser described in "Dispersion Technology Comprehension, published by Johokiko Co., Ltd., Jul. 15, 2005", "Actual comprehensive data collection on dispersion technology and industrial application centered on suspension (solid/liquid dispersion system), published by Publication Department, Management Development Center, Oct. 10, 1978", and paragraph 0022 of JP2015-157893A can be suitably used. In addition, in the process for dispersing the pigment, a refining treatment of particles in a salt milling step may be performed. A material, a device, process conditions, and the like used in the salt milling step can be found in, for example, JP2015-194521A and JP2012-046629A.

During the preparation of the curable composition, it is preferable that the curable composition is filtered through a filter, for example, in order to remove foreign matter or to reduce defects. As the filter, any filter which is used in the related art for filtering or the like can be used without any particular limitation. Examples of the filter include filters formed of materials including, for example, a fluororesin such as polytetrafluoroethylene (PTFE), a polyamide-based resin such as nylon (for example, nylon-6 and nylon-6,6), and a polyolefin resin (including a polyolefin resin having a high-density or an ultrahigh molecular weight) such as polyethylene and polypropylene (PP). Among these materials, polypropylene (including high-density polypropylene) or nylon is preferable.

The pore size of the filter is preferably 0.01 μm to 7.0 μm, more preferably 0.01 μm to 3.0 μm, and still more preferably 0.05 μm to 0.5 μm. In a case where the pore size of the filter is within the above-described range, fine foreign matters can be reliably removed. With regard to the pore size value of the filter, reference can be made to a nominal value of filter manufacturers. As the filter, various filters provided by Nihon Pall Corporation (DFA4201NIEY and the like), Advantec Toyo Kaisha., Ltd., Nihon Entegris G.K. (formerly Nippon Microlith Co., Ltd.), Kitz Microfilter Corporation, and the like can be used.

In addition, it is preferable that a fibrous filter material is used as the filter. Examples of the fibrous filter material include polypropylene fiber, nylon fiber, and glass fiber. Examples of a commercially available product include SBP type series (SBP008 and the like), TPR type series (TPR002, TPR005, and the like), or SHPX type series (SHPX003 and the like), all manufactured by Roki Techno Co., Ltd.

In a case where a filter is used, a combination of different filters (for example, a first filter and a second filter) may be used. In this case, the filtering using each of the filters may be performed once, or twice or more. In addition, a combination of filters having different pore sizes in the above-described range may be used. In addition, the filtering using the first filter may be performed only on the dispersion liquid, and then the filtering using the second filter may be performed on a mixture of the dispersion liquid and other components.

(Cured Product)

The cured product according to the embodiment of the present disclosure is a cured product obtained by curing the curable composition according to the embodiment of the present disclosure. The cured product according to the embodiment of the present disclosure can be suitably used in a color filter or the like. Specifically, the cured product according to the embodiment of the present disclosure can be preferably used as a colored layer (pixel) of a color filter, and more specifically, the cured product according to the embodiment of the present disclosure can be preferably used as a green-colored layer (green pixel) of a color filter.

The cured product according to the embodiment of the present disclosure is preferably a film-like cured product, and the film thickness thereof can be appropriately adjusted depending on the purposes. For example, the thickness of the film is preferably 20 μm or less, more preferably 10 μm or less, and still more preferably 5 μm or less. The lower limit of the thickness of the film is preferably 0.1 μm or more, more preferably 0.2 μm or more, and still more preferably 0.3 μm or more.

(Color Filter)

The color filter according to the embodiment of the present disclosure includes the above-described cured product according to the embodiment of the present disclosure. More preferably, the color filter according to the embodiment of the present disclosure has the cured product according to the embodiment of the present disclosure as a pixel of the color filter. The color filter according to the embodiment of the present disclosure can be used for a solid-state imaging element such as a charge coupled device (CCD) and a complementary metal-oxide semiconductor (CMOS), an image display device, or the like.

The color filter according to the embodiment of the present disclosure may further have a pixel (hereinafter, also referred to as other pixels) different from the cured product (pixel) according to the embodiment of the present disclosure. Examples of the other pixels include red pixels, blue pixels, yellow pixels, cyan pixels, magenta pixels, transparent pixels, black pixels, and pixels of near-infrared transmission filter.

In the color filter according to the embodiment of the present disclosure, the thickness of a film obtained from the cured product according to the embodiment of the present disclosure can be appropriately adjusted depending on the purposes. The thickness of the film is preferably 20 µm or less, more preferably 10 µm or less, and still more preferably 5 µm or less. The lower limit of the thickness of the film is preferably 0.1 µm or more, more preferably 0.2 µm or more, and still more preferably 0.3 µm or more.

In the color filter according to the embodiment of the present disclosure, the width of the pixel is preferably 0.5 µm to 20.0 µm. The lower limit is more preferably 1.0 µm or more and particularly preferably 2.0 µm or more. The upper limit is more preferably 15.0 µm or less and particularly preferably 10.0 µm or less. In addition, the Young's modulus of the pixel (cured product according to the embodiment of the present disclosure) is preferably 0.5 GPa to 20 GPa and more preferably 2.5 GPa to 15 GPa.

Each pixel included in the color filter according to the embodiment of the present disclosure preferably has high flatness. Specifically, the surface roughness Ra of the pixel is preferably 100 nm or less, more preferably 40 nm or less, and still more preferably 15 nm or less. The lower limit is not specified, but is preferably, for example, 0.1 nm or more. The surface roughness of the pixel can be measured, for example, using an atomic force microscope (AFM) Dimension 3100 manufactured by Veeco Instruments, Inc. In addition, the contact angle of water on the pixel can be appropriately set to a preferred value and is typically in the range of 500 to 110°. The contact angle can be measured, for example, using a contact angle meter CV-DT-A Model (manufactured by Kyowa Interface Science Co., Ltd.). In addition, it is preferable that the volume resistivity value of the pixel is high. Specifically, the volume resistivity value of the pixel is preferably $10^9 \Omega \times cm$ or more and more preferably $10^{11} \Omega \times cm$ or more. The upper limit is not specified, but is, for example, preferably $10^{14} \Omega \times cm$ or less. The volume resistivity value of the pixel can be measured, for example, using an ultrahigh resistance meter 5410 (manufactured by Advantest Corporation).

In addition, in the color filter according to the embodiment of the present disclosure, a protective layer may be provided on a surface of the cured product according to the embodiment of the present disclosure. By providing the protective layer, various functions such as oxygen shielding, low reflection, hydrophilicity/hydrophobicity, and shielding of light (ultraviolet rays, near-infrared rays, and the like) having a specific wavelength can be imparted. The thickness of the protective layer is preferably 0.01 µm to 10 µm and more preferably 0.1 µm to 5 µm. Examples of a method for forming the protective layer include a method of forming the protective layer by applying a resin composition dissolved in an organic solvent, a chemical vapor deposition method, and a method of attaching a molded resin with an adhesive. Examples of components constituting the protective layer include a (meth)acrylic resin, an ene-thiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyamideimide resin, a polyolefin resin, a cyclic olefin resin, a polyester resin, a styrene resin, a polyol resin, a polyvinylidene chloride resin, a melamine resin, a urethane resin, an aramid resin, a polyamide resin, an alkyd resin, an epoxy resin, a modified silicone resin, a fluororesin, a polycarbonate resin, a polyacrylonitrile resin, a cellulose resin, Si, C, W, $Al_2O_3$, Mo, $SiO_2$, and $Si_2N_4$, and two or more kinds of these components may be contained. For example, in a case of a protective layer for oxygen shielding, it is preferable that the protective layer contains a polyol resin, $SiO_2$, and $Si_2N_4$. In addition, in a case of a protective layer for low reflection, it is preferable that the protective layer contains a (meth)acrylic resin and a fluororesin.

In a case of forming the protective layer by applying a resin composition, as a method for applying the resin composition, a known method such as a spin coating method, a casting method, a screen printing method, and an ink jet method can be used. As the organic solvent included in the resin composition, a known organic solvent (for example, propylene glycol 1-monomethyl ether 2-acetate, cyclopentanone, ethyl lactate, and the like) can be used. In a case of forming the protective layer by a chemical vapor deposition method, as the chemical vapor deposition method, a known chemical vapor deposition method (thermochemical vapor deposition method, plasma chemical vapor deposition method, and photochemical vapor deposition method) can be used.

The protective layer may contain, as desired, an additive such as organic or inorganic particles, an absorber of a specific wavelength (for example, ultraviolet rays, near-infrared rays, and the like), a refractive index adjusting agent, an antioxidant, an adhesive agent, and a surfactant. Examples of the organic or inorganic particles include polymer particles (for example, silicone resin particles, polystyrene particles, and melamine resin particles), titanium oxide, zinc oxide, zirconium oxide, indium oxide, aluminum oxide, titanium nitride, titanium oxynitride, magnesium fluoride, hollow silica, silica, calcium carbonate, and barium sulfate. As the absorber of a specific wavelength, a known absorber can be used. Examples of the ultraviolet absorber and near-infrared absorber include the above-described materials. The content of these additives can be appropriately adjusted, but is preferably 0.1 mass % to 70 mass % and more preferably 1 mass % to 60 mass % with respect to the total weight of the protective layer.

In addition, as the protective layer, protective layers described in paragraphs 0073 to 0092 of JP2017-151176A can also be used.

<Method for Manufacturing Color Filter>

The color filter according to the embodiment of the present disclosure can be manufactured through a step of forming a curable composition layer on a support using the above-described curable composition according to the embodiment of the present disclosure, and a step of forming a pattern on the curable composition layer by a photolithography method or a dry etching method.

—Photolithography Method—

Pattern formation by a photolithography method preferably includes a step of forming a curable composition layer on a support using the curable composition according to the embodiment of the present disclosure, a step of exposing the curable composition layer in a patterned manner, and a step of removing an unexposed area of the curable composition layer by development to form a pattern (pixel). Optionally, a step (pre-baking step) of baking the curable composition layer and a step (post-baking step) of baking the developed pattern (pixel) may be provided.

In the step of forming a curable composition layer, the curable composition layer is formed on a support using the curable composition according to the embodiment of the present disclosure. The support is not particularly limited, and can be appropriately selected depending on applications. Examples thereof include a glass substrate and a silicon substrate, and a silicon substrate is preferable. In addition, a charge coupled device (CCD), a complementary metal-oxide semiconductor (CMOS), a transparent conductive film, or the like may be formed on the silicon substrate. In some cases, a black matrix for isolating each pixel is formed on the silicon substrate. In addition, an undercoat layer may be provided on the silicon substrate so as to improve adhesiveness to an upper layer, prevent the diffusion of substances, or planarize the surface of the substrate.

As a method of applying the curable composition, a known method can be used. Examples of the known method include: a drop casting method; a slit coating method; a spray method; a roll coating method; a spin coating method; a cast coating method; a slit and spin method; a pre-wetting method (for example, a method described in JP2009-145395A); various printing methods including jet printing such as an ink jet method (for example, an on-demand method, a piezoelectric method, or a thermal method) or a nozzle jet method, flexographic printing, screen printing, gravure printing, reverse offset printing, and metal mask printing; a transfer method using a mold or the like; and a nanoimprinting method. The application method using an ink jet method is not particularly limited, and examples thereof include a method (in particular, pp. 115 to 133) described in "Extension of Use of Ink Jet—Infinite Possibilities in Patent-" (published on February, 2005, S.B. Research Co., Ltd.) and methods described in JP2003-262716A, JP2003-185831A, JP2003-261827A, JP2012-126830A, and JP2006-169325A. In addition, with regard to the method of applying the curable composition, reference can be made to the description in WO2017/030174A and WO2017/018419A, the contents of which are incorporated herein by reference.

The curable composition layer formed on the support may be dried (pre-baked). In a case of producing a film by a low-temperature process, pre-baking may not be performed. In a case where pre-baking is performed, the pre-baking temperature is preferably 150° C. or lower, more preferably 120° C. or lower, and still more preferably 110° C. or lower. The lower limit may be, for example, 50° C. or higher or 80° C. or higher. The pre-baking time is preferably 10 seconds to 300 seconds, more preferably 40 seconds to 250 seconds, and still more preferably 80 seconds to 220 seconds. Pre-baking can be performed using a hot plate, an oven, or the like.

Next, the curable composition layer is exposed in a patterned manner (exposing step). For example, the curable composition layer can be exposed in a patterned manner using a stepper exposure device or a scanner exposure device through a mask having a predetermined mask pattern. As a result, an exposed area can be cured.

Examples of the radiation (light) which can be used during the exposure include g-rays and i-rays. In addition, light (preferably light having a wavelength of 180 to 300 nm) having a wavelength of 300 nm or less can also be used. Examples of the light having a wavelength of 300 nm or less include KrF ray (wavelength: 248 nm) and ArF ray (wavelength: 193 nm), and KrF ray (wavelength: 248 nm) are preferable. In addition, a long-wave light source of 300 nm or more can be used.

In addition, in a case of exposure, the composition layer may be irradiated with light continuously to expose the composition layer, or the composition layer may be irradiated with light in a pulse to expose the composition layer (pulse exposure). The pulse exposure refers to an exposing method in which light irradiation and resting are repeatedly performed in a short cycle (for example, millisecond-level or less). In a case of the pulse exposure, the pulse width is preferably 100 nanoseconds (ns) or less, more preferably 50 nanoseconds or less, and still more preferably 30 nanoseconds or less. The lower limit of the pulse width is not particularly limited, and may be 1 femtosecond (fs) or more or 10 femtoseconds or more. The frequency is preferably 1 kHz or more, more preferably 2 kHz or more, and still more preferably 4 kHz or more. The upper limit of the frequency is preferably 50 kHz or less, more preferably 20 kHz or less, and still more preferably 10 kHz or less. The maximum instantaneous illuminance is preferably 50,000,000 W/m$^2$ or more, more preferably 100,000,000 W/m$^2$ or more, and still more preferably 200,000,000 W/m$^2$ or more. In addition, the upper limit of the maximum instantaneous illuminance is preferably 1,000,000,000 W/m$^2$ or less, more preferably 800,000,000 W/m$^2$ or less, and still more preferably 500,000,000 W/m$^2$ or less. The pulse width refers to a time during which light is irradiated in a pulse period. In addition, the frequency refers to the number of pulse periods per second. In addition, the maximum instantaneous illuminance refers to an average illuminance within the period of light irradiation in the pulse period. In addition, the pulse period refers to a period in which light irradiation and resting in the pulse exposure are defined as one cycle.

The irradiation dose (exposure amount) is, for example, preferably 0.03 J/cm$^2$ to 2.5 J/cm$^2$ and more preferably 0.05 J/cm$^2$ to 1.0 J/cm$^2$. The oxygen concentration during the exposure can be appropriately selected, and the exposure may also be performed, for example, in a low-oxygen atmosphere having an oxygen concentration of 19% by volume or less (for example, 15% by volume, 5% by volume, and substantially oxygen-free) or in a high-oxygen atmosphere having an oxygen concentration of more than 21% by volume (for example, 22% by volume, 30% by volume, and 50% by volume), in addition to an atmospheric air. In addition, the exposure illuminance can be appropriately set, and can be preferably selected from a range of 1,000 W/m$^2$ to 100,000 W/m$^2$ (for example, 5,000 W/m$^2$, 15,000 W/m$^2$, or 35,000 W/m$^2$). Appropriate conditions of each of the oxygen concentration and the exposure illuminance may be combined, and for example, a combination of the oxygen concentration of 10% by volume and the illuminance of 10,000 W/m$^2$, a combination of the oxygen concentration of 35% by volume and the illuminance of 20,000 W/m$^2$, or the like is available.

Next, the unexposed area of the curable composition layer is removed by development to form a pattern (pixel). The unexposed area of the coloring composition layer can be removed by development using a developer. Thus, the curable composition layer of the unexposed area in the exposing step is eluted into the developer, and as a result, only a photocured portion remains. As the developer, an organic alkaline developer causing no damage on a base of element, circuit, or the like is preferable. The temperature of the developer is preferably 20° C. to 30° C. The development time is preferably 20 seconds to 180 seconds. In addition, in order to further improve residues removing properties, a step of shaking the developer off per 60 seconds and supplying a new developer may be repeated multiple times.

As the developer, an alkaline solution (alkaline developer) obtained by diluting an alkali agent with pure water is preferable. Examples of the alkaline agent include: an organic alkaline compound such as ammonia, ethylamine, diethylamine, dimethylethanolamine, diglycolamine, diethanolamine, hydroxyamine, ethylenediamine, tetramethylammonium hydroxide, tetraethylammonium hydroxide, tetrapropylammonium hydroxide, tetrabutylammonium hydroxide, ethyltrimethylammonium hydroxide, benzyltrimethylammonium hydroxide, dimethyl bis(2-hydroxyethyl)ammonium hydroxide, choline, pyrrole, piperidine, and 1,8-diazabicyclo[5.4.0]-7-undecene; and an inorganic alkaline compound such as sodium hydroxide, potassium hydroxide, sodium carbonate, sodium bicarbonate, sodium silicate, and sodium metasilicate. In consideration of environmental aspects and safety aspects, the alkaline agent is preferably a compound having a high molecular weight. The concentration of the alkaline agent in the alkaline solution is preferably 0.001 mass % to 10 mass % and more preferably 0.01 mass % to 1 mass %. In addition, the developer may further contain a surfactant. Examples of the surfactant include the surfactants described above. Among these, a nonionic surfactant is preferable. From the viewpoint of easiness of transport, storage, and the like, the developer may be obtained by temporarily preparing a concentrated solution and diluting the concentrated solution to a necessary concentration during use. The dilution factor is not particularly limited and, for example, can be set to be in a range of 1.5 times to 100 times. In addition, it is also preferable to wash (rinse) with pure water after development. In addition, it is preferable that the rinsing is performed by supplying a rinsing liquid to the curable composition layer after development while rotating the support on which the curable composition layer after development is formed. In addition, it is preferable that the rinsing is performed by moving a nozzle discharging the rinsing liquid from a center of the support to a peripheral edge of the support. In this case, in the movement of the nozzle from the center of the support to the peripheral edge of the support, the nozzle may be moved while gradually decreasing the moving speed of the nozzle. By performing rinsing in this manner, in-plane variation of rinsing can be suppressed. In addition, the same effect can be obtained by gradually decreasing the rotating speed of the support while moving the nozzle from the center of the support to the peripheral edge of the support.

After the development, it is preferable to perform an additional exposure treatment or a heating treatment (post-baking) after carrying out drying. The additional exposure treatment or the post-baking is a curing treatment after development in order to complete curing. The heating temperature in the post-baking is preferably 100° C. to 240° C. and more preferably 200° C. to 240° C. The film after development is post-baked continuously or batchwise using a heating unit such as a hot plate, a convection oven (hot air circulation dryer), and a high-frequency heater under the above-described conditions. In a case of performing the additional exposure treatment, light used for the exposure is preferably light having a wavelength of 400 nm or less. In addition, the additional exposure treatment may be carried out by the method described in KR2017-122130A.

—Dry Etching Method—

It is preferable that the formation of a pattern using a dry etching method is performed using a method including: a step of forming a curable composition layer on a support using the curable composition according to the embodiment of the present disclosure, and of curing the entire curable composition layer to form a cured composition layer; a step of forming a photoresist layer on the cured composition layer; a step of exposing the photoresist layer in a patterned manner and then developing the photoresist layer to form a resist pattern; and a step of dry-etching the cured composition layer with an etching gas using the resist pattern as a mask. It is preferable that pre-baking treatment is further performed in order to form the photoresist layer. In particular, as the forming process of the photoresist layer, it is desirable that a heating treatment after exposure and a heating treatment after development (post-baking treatment) are performed. The details of the pattern formation by the dry etching method can be found in paragraphs 0010 to 0067 of JP2013-064993A, the content of which is incorporated herein by reference.

(Solid-State Imaging Element)

It is preferable that the solid-state imaging element according to the embodiment of the present disclosure includes the cured product according to the embodiment of the present disclosure and has the color filter according to the embodiment of the present disclosure. The configuration of the solid-state imaging element according to the embodiment of the present disclosure is not particularly limited as long as the solid-state imaging element is configured to include the cured product according to the embodiment of the present disclosure and functions as a solid-state imaging element. Examples of the configuration include the following configurations.

The solid-state imaging element is configured to have a plurality of photodiodes constituting a light receiving area of the solid-state imaging element (a charge coupled device (CCD) image sensor, a complementary metal-oxide semiconductor (CMOS) image sensor, or the like), and a transfer electrode formed of polysilicon or the like on a substrate; have a light shielding film having openings only over the light receiving portion of the photodiodes on the photodiodes and the transfer electrodes; have a device-protective film formed of silicon nitride or the like, which is formed to cover the entire surface of the light shielding film and the light receiving portion of the photodiodes, on the light shielding film; and have a color filter on the device-protective film. Further, the solid-state imaging element may also be configured, for example, such that it has a light collecting unit (for example, a microlens, which is the same hereinafter) on a device-protective film under a color filter (a side closer to the substrate), or has a light collecting unit on a color filter. In addition, the color filter may have a structure in which each colored pixel is embedded in a space partitioned in, for example, a lattice shape by a partition wall. The partition wall in this case preferably has a low refractive index for each colored pixel. Examples of an imaging device having such a structure include the devices described in JP2012-227478A, JP2014-179577A, and WO2018/043654A. An imaging device including the solid-state imaging element according to the embodiment of the present disclosure can also be used as a vehicle-mounted camera or a surveillance camera, in addition to a digital camera or electronic equipment (mobile phones or the like) having an imaging function.

In addition, in the solid-state imaging element according to the embodiment of the present disclosure, by providing an ultraviolet absorbing layer (UV cut filter) in the structure of the solid-state imaging element, as described in JP2019-211559A, light resistance of the color filter may be improved.

(Image Display Device)

It is preferable that the image display device according to the embodiment of the present disclosure includes the cured product according to the embodiment of the present disclosure and has the color filter according to the embodiment of the present disclosure. Examples of the image display device include a liquid crystal display device or an organic electroluminescent display device. The definitions of image display devices or the details of the respective image display devices are described in, for example, "Electronic Display Device (edited by Akio Sasaki, Kogyo Chosakai Publishing Co., Ltd., published in 1990)", "Display Device (edited by Sumiaki Ibuki, Sangyo Tosho Co., Ltd., published in 1989)", and the like. In addition, the details of a liquid crystal display device can be found in, for example, "Next-Generation Liquid Crystal Display Techniques (edited by Tatsuo Uchida, Kogyo Chosakai Publishing Co., Ltd., published in 1994)". The liquid crystal display device is not particularly limited, and examples thereof include various liquid crystal display devices described in "Next-Generation Liquid Crystal Display Techniques".

EXAMPLES

Hereinafter, the present disclosure will be described in detail with reference to examples, but the present disclosure is not limited thereto.

In the examples, "%" and "parts" respectively indicate "mass %" and "parts by mass" unless otherwise specified. In a polymer compound, the molecular weight indicates the weight-average molecular weight (Mw) and the proportion of constitutional units indicates mole percentage unless otherwise specified.

The weight-average molecular weight (Mw) is a value in terms of polystyrene obtained by performing measurement using a gel permeation chromatography (GPC) method.

Synthesis Example A3: Synthesis of Macromonomer B-3

The method for synthesizing a macromonomer B-3 is shown below.

ε-caprolactone (1,044.2 parts, corresponding to a cyclic compound), δ-valerolactone (184.3 parts, corresponding to a cyclic compound), and 2-ethyl-1-hexanol (71.6 parts, corresponding to a ring-opening polymerization initiator) were charged into a three-neck flask to obtain a mixture. Next, the above-described mixture was stirred while blowing nitrogen.

Next, monobutyltin oxide (0.61 parts) was added to the mixture and the obtained mixture was heated to 90° C. After 6 hours, using $^1$H-nuclear magnetic resonance (NMR), it was confirmed that a signal derived from 2-ethyl-1-hexanol in the mixture had disappeared, and then the mixture was heated to 110° C. After continuing the polymerization reaction at 110° C. for 12 hours under nitrogen, it was confirmed by $^1$H-NMR that a signal derived from ε-caprolactone and δ-valerolactone had disappeared. Thereafter, the obtained compound was subjected to molecular weight measurement by a gel permeation chromatography (GPC) method (according to measurement conditions described later). After confirming that the molecular weight of the compound had reached the desired value, 2,6-di-t-butyl-4-methylphenol (0.35 parts) was added to the mixture containing the above-described compound, and 2-methacryloyloxyethyl isocyanate (87.0 parts) was added dropwise to the obtained mixture over 30 minutes. After 6 hours from the completion of the dropwise addition, it was confirmed by $^1$H-NMR that a signal derived from 2-methacryloyloxyethyl isocyanate (MOI) had disappeared, and then propylene glycol monomethyl ether acetate (PGMEA) (1,387.0 parts) was added to the mixture to obtain a macromonomer B-3 solution (2,770 parts) having a concentration of 50 mass %. The structure of the macromonomer B-3 was confirmed by $^1$H-NMR. The weight-average molecular weight of the obtained macromonomer B-3 was 3,000.

Synthesis Examples A1 and A2: Synthesis of Macromonomers B-1 and B-2

Macromonomers B-1 and B-2 were synthesized by the same method as in Synthesis Example A3, except that the monomers and amounts used were changed to those shown in Table 1.

TABLE 1

| | Macro-monomer | Ring-opening polymerization initiator | Constitutional unit 1 | | Constitutional unit 2 | | Weight-average molecular weight | Repetition number (p + q) |
| --- | --- | --- | --- | --- | --- | --- | --- | --- |
| | | | Cyclic compound | Content (mass %) | Cyclic compound | Content (mass %) | | |
| Synthesis example A1 | B-1 | 2-Ethyl-1-hexanol | ε-Caprolactone | 100 | δ-Valerolactone | 0 | 3,000 | 9 |
| Synthesis example A2 | B-2 | Stearyl alcohol | ε-Caprolactone | 100 | δ-Valerolactone | 0 | 3,400 | 9 |
| Synthesis example A3 | B-3 | 2-Ethyl-1-hexanol | ε-Caprolactone | 80 | δ-Valerolactone | 20 | 6,000 | 20 |

The structures of B-1 to B-3, and B-4 to B-7 described later are shown below.

B-4: Blemmer PSE1300 (manufactured by NOF Corporation., stearoxypolyethylene glycol monomethacrylate)

B-5: Blemmer 75ANEP-600 (manufactured by NOF Corporation., nonylphenoxy(polyethylene glycol-polypropylene glycol) monoacrylate)

B-6: Blemmer 50POEP800B (manufactured by NOF Corporation., octoxypolyethylene glycol-polypropylene glycol monomethacrylate, m≈8, n≈6)

B-7: synthetic product

Synthesis of B-7

380 parts by mass of propylene glycol monomethyl ether acetate (PGMEA) was charged into a three-neck flask, and the mixture was heated to 75° C. while flowing nitrogen into the flask. Separately, a dropping solution in which 200 parts by mass of methyl methacrylate, 200 parts by mass of butyl acrylate, 23.5 parts by mass of 3-mercaptopropionic acid, 2.25 parts by mass of 2,2'-azobis(methyl 2-metylpropionate) (hereinafter, described as "V-601"), and 254 parts by mass of PGMEA were mixed was prepared. This dropping solution was added dropwise thereto over 2 hours. After dropwise addition, the mixture was further heated and stirred at the same temperature for 1 hour. After further adding 2.25 parts by mass of V-601, the mixture was heated at the same temperature for 2 hours. 2.25 parts by mass of V-601 was further added thereto, the temperature was increased to 90° C., the mixture was heated for 3 hours, the polymerization reaction was terminated.

Next, 40.1 parts by mass of glycidyl methacrylate (GMA), 21.2 parts by mass of tetrabutylammonium bromide, and 0.127 parts by mass of dibutylhydroxytoluene (BHT) were added to the obtained polymerization reactant, the mixture was heated at 100° C. for 4 hours, and after confirming that the acid value was 0, the GMA reaction was terminated.

The obtained GMA reactant was added dropwise to a mixture of 3,500 parts by mass of methanol and 3,500 parts by mass of water while stirring. The supernatant was removed, the obtained gum-like product was dried, propylene glycol monomethyl ether acetate was added thereto until the solid content reached 50 mass %, thereby dissolving the product to obtain a 50 mass % PGMEA solution of B-7.

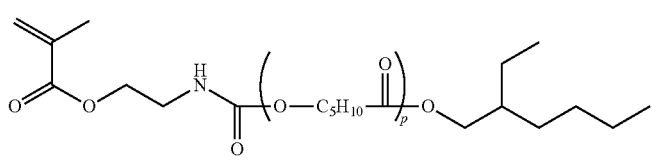

B-1

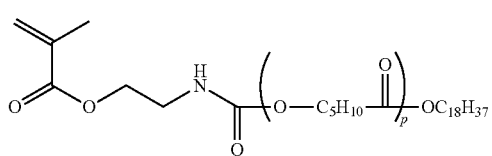

B-2

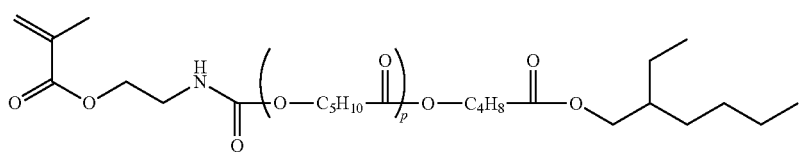

B-3

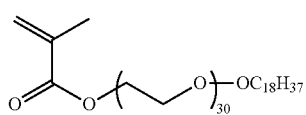

B-4

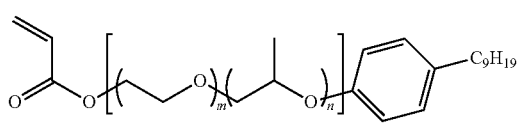

B-5

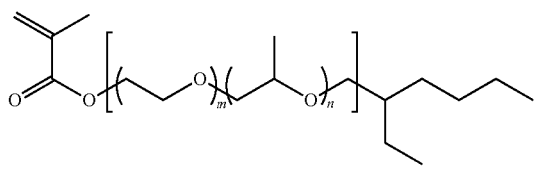

B-6

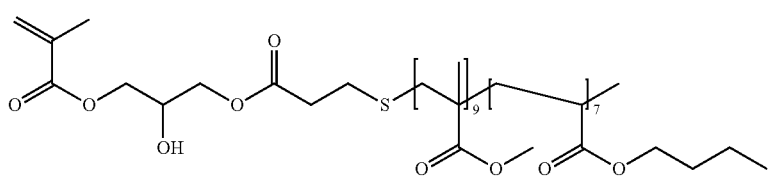

B-7

The numerical values at the lower right of each constitutional unit in B-7 represent the average number of each constitutional unit included in B-7.

Synthesis of Block Copolymer P2

Ethyl 2-bromoisobutyrate (manufactured by TOKYO CHEMICAL INDUSTRY CO., LTD., 0.60 parts), ARONIX M-5300 (co-carboxypolycaprolactone (n≈2) monoacrylate, manufactured by TOAGOSEI CO., LTD., 33.9 parts), and propylene glycol monomethyl ether acetate (114 parts) were charged into a three-neck flask to obtain a mixture.

The above-described mixture was stirred while blowing nitrogen. Next, the mixture was heated to 75° C. while flowing nitrogen into the flask. Next, separately, copper (I) bromide (0.20 parts) and 2,2'-bipyridyl (0.10 parts) were dissolved in 1.0 part of propylene glycol monomethyl ether, and the formed copper complex was added to the mixture to initiate the polymerization.

After confirming the consumption of the monomer by high performance liquid chromatography (HPLC), the macromonomer (B-1 above, 52.2 parts) was added to the mixture, and the mixture was subsequently heated and stirred at 75° C. After confirming the consumption of the monomer by high performance liquid chromatography (HPLC), the polymerization reaction was terminated.

After terminating the reaction, dimethyldodecylamin (1.8 parts) and 2,2,6,6-tetramethylpiperidine 1-oxyl (TEMPO, 0.38 parts) were added thereto under air, and 4-hydroxybutyl acrylate glycidyl ether (C-1, 5.21 parts) was added dropwise thereto.

After completion of the dropwise addition, the reaction was continued in air at 90° C. for 24 hours, and then the completion of the reaction was confirmed by acid value measurement. PGMEA was added to the obtained mixture so that the solid content was 30 mass % to obtain a target block copolymer.

The weight-average molecular weight (Mw) of each macromonomer and block copolymer was calculated by gel permeation chromatography (GPC) measurement under the following measurement conditions.

Device: HLC-8220GPC (manufactured by Tosoh Corporation)
Detector: differential refractometer (RI detector)
Pre-column: TSKGUARD COLUMN MP(XL) 6 mm×40 mm (manufactured by Tosoh Corporation)
Sample-side column: following 4 columns are directly connected (all manufactured by Tosoh Corporation)
TSK-GEL Multipore-HXL-M 7.8 mm×300 mm
Reference-side column: same as the sample-side column
Constant-temperature tank temperature: 40° C.
Mobile phase: tetrahydrofuran
Sample-side mobile phase flow rate: 1.0 mL/min
Reference-side mobile phase flow rate: 0.3 mL/min
Sample concentration: 0.1 mass %
Sample injection amount: 100 μL
Data collection time: 16 minutes to 46 minutes after sample injection
Sampling pitch: 300 msec In addition, the acid value of each resin was determined by neutralization titration using a sodium hydroxide aqueous solution. Specifically, the obtained resin was dissolved in a solvent, the solution was titrated with a sodium hydroxide aqueous solution using a potential difference measurement method to calculate the number of millimoles of the acid included in 1 g of the solid resin, and then the acid value was determined by multiplying the calculated value by 56.1 as a molecular weight of KOH.

In addition, as for the ethylenically unsaturated bonding value of each resin, after confirming the completion of the reaction of 4-hydroxybutyl acrylate glycidyl ether or the like from $^1$H-NMR measurement, the ethylenically unsaturated bonding value of each resin was calculated from the proportion of the amount of 4-hydroxybutyl acrylate glycidyl ether or the like to the charged solid content.

Synthesis of Block Copolymers P1 and P3 to P19

Each block copolymer was synthesized by the same method as in the above-described synthesis of the block copolymer P2, except that the monomers, raw materials, and amounts used were changed to those shown in Table 2.

Synthesis of Resin P20

490.0 g of M-5300 (ω-carboxypolycaprolactone (n≈2) monoacrylate, manufactured by TOAGOSEI CO., LTD.), 420.0 g of B-1, and 1,423.3 g of PGMEA were charged into a three-neck flask to obtain a mixture. Next, the mixture was stirred and heated to 75° C. while blowing nitrogen. Next, 5.20 g of dodecyl mercaptan, then 2.63 g of 2,2'-azobis (methyl 2-methylpropionate) (V-601) were added to the mixture to initiate the polymerization reaction. After heating the mixture at 75° C. for 2 hours, 2.63 g of an additional V-601 was added thereto. After 2 hours, 2.63 g of an additional V-601 was added thereto, and the mixture was heated to 90° C. The mixture was stirred for 3 hours to obtain a precursor polymer.

Into a 3,000 mL three-neck flask fully air-replaced, 224.9 g of the precursor polymer, 237.2 g of N-ethyl-2-pyrrolidone (NEP), 12.1 g of 4-(chloromethyl)styrene (manufactured by TOKYO CHEMICAL INDUSTRY CO., LTD.), 45.9 g of potassium carbonate, and 0.189 g of TEMPO were charged, and the obtained mixture was stirred at 80° C. for 2 hours. After confirming the disappearance of the raw material alcohol and the target product by $^1$H-NMR, the stirring was stopped. The mixture was ice-cooled to 5° C. or lower, 1,000 mL of 1 N (mol/L) hydrochloric acid aqueous solution was added dropwise thereto. 1,000 mL of butyl acetate was added thereto, and the mixture was washed with 500 mL of distilled water three times. The solvent was distilled off, and PGMEA was added thereto so that the solid content was 30 mass % to obtain a target product.

Synthesis of Resin P101: RAFT Polymerization Method

In a reactor equipped with gas inlet tube, condenser, stirring blade, and thermometer, ARONIX M-5300 (ω-carboxypolycaprolactone (n~2) monoacrylate, manufactured by TOAGOSEI CO., LTD., 24 parts), 2,2'-azobisisobutyronitrile (AIBN, 0.44 parts), and 4-[(2-Carboxyethylsulfanylthiocarbonyl) sulfanyl]-4-cyanopentanoic Acid (1.12 parts) were dissolved in propylene glycol monomethyl ether acetate (40 parts), and the system was replaced with nitrogen by nitrogen bubbling for 30 minutes. Thereafter, the mixture was gently stirred, and then the mixture was stirred at 60° C. for 24 hours while flowing nitrogen to perform living radical polymerization.

Next, AIBN (0.52 parts) and the macromonomer (B-1 above, 52.2 parts) were dissolved in propylene glycol monomethyl ether acetate (28 parts), and then a solution subjected to nitrogen replacement for 30 minutes was added to the above-described reaction solution, living radical polymerization was performed at 60° C. for 24 hours.

After terminating the reaction, dimethyldodecylamin (1.8 parts) and 2,2,6,6-tetramethylpiperidine 1-oxyl (TEMPO, 0.38 parts) were added thereto under air, and 4-hydroxybutyl acrylate glycidyl ether (C-1, 5.00 parts) was added dropwise thereto.

After completion of the dropwise addition, the reaction was continued in air at 90° C. for 24 hours, and then the completion of the reaction was confirmed by acid value measurement. PGMEA was added to the obtained mixture so that the solid content was 30 mass % to obtain a target block copolymer (resin P101).

Synthesis of Resin P102: Tellurium Mediated Living Radical Polymerization Method Into a reactor equipped with argon gas inlet tube, stirrer, and thermometer, ARONIX M-5300 (ω-carboxypolycaprolactone (n≈2) monoacrylate, manufactured by TOAGOSEI CO., LTD., 24 parts), AIBN (0.328 parts), and propylene glycol monomethyl ether (22.74 parts) were charged. After replacement with argon, ethyl-2-methyl-2-n-butylteranyl-propionate (3.00 parts) and dibutylditerlide (1.116) parts were added thereto, and the mixture was reacted at 60° C. for 20 hours.

To the obtained solution, a mixed solution of macromonomer (B-1 above, 52.2 parts), AIBN (0.328 parts), and propylene glycol monomethyl ether (51.79 g), which had been replaced with argon in advance, was added, and the mixture was reacted at 60° C. for 20 hours.

After completion of the reaction, PGMEA (74.53 parts) was added to the reaction solution, and propylene glycol monomethyl ether was distilled off under reduced pressure.

Dimethyldodecylamin (1.8 parts) and 2,2,6,6-tetramethylpiperidine 1-oxyl (TEMPO, 0.38 parts) were added to the obtained solution under air, and 4-hydroxybutyl acrylate glycidyl ether (C-1, 5.00 parts) was added dropwise thereto.

After completion of the dropwise addition, the reaction was continued in air at 90° C. for 24 hours, and then the completion of the reaction was confirmed by acid value measurement. PGMEA was added to the obtained mixture so that the solid content was 30 mass % to obtain a target block copolymer (resin P102).

TABLE 2

| | Block A | | | | | | | | Polymer physical properties | | |
|---|---|---|---|---|---|---|---|---|---|---|---|
| | Monomer having acid group (molar ratio) | Monomer containing terminal C = C group (molar ratio) | | Block B Macromonomer (molar ratio) | | | | | | Ethylenically unsaturated bonding value (mmol/g) | |
| Block copolymer or resin | x | Reactant | y | Type | z | Block structure | Structure of terminal C = C group | Structure of block B | Acid value (mgKOH/g) | | Mw |
| P1 | 63 | C-1 | 22 | B-1 | 15 | AB block | Acryloxy group | Polyester chain | 60 | 0.45 | 18,000 |
| P2 | 68 | C-1 | 17 | B-1 | 15 | AB block | Acryloxy group | Polyester chain | 70 | 0.40 | 18,000 |
| P3 | 58 | C-1 | 27 | B-1 | 15 | AB block | Acryloxy group | Polyester chain | 50 | 0.50 | 18,000 |
| P4 | 63 | C-1 | 22 | B-1 | 15 | AB block | Acryloxy group | Polyester chain | 60 | 0.45 | 12,000 |
| P5 | 63 | C-1 | 22 | B-1 | 15 | AB block | Acryloxy group | Polyester chain | 60 | 0.45 | 25,000 |
| P6 | 53 | C-1 | 22 | B-1 | 15 | AB block | Acryloxy group | Polyester chain | 40 | 0.45 | 18,000 |
| P7 | 73 | C-1 | 22 | B-1 | 15 | AB block | Acryloxy group | Polyester chain | 80 | 0.45 | 18,000 |
| P8 | 63 | C-4 | 22 | B-1 | 15 | AB block | Metharyloxy group | Polyester chain | 60 | 0.45 | 18,000 |
| P9 | 63 | C-5 | 22 | B-1 | 15 | AB block | Acrylamide group | Polyester chain | 60 | 0.45 | 18,000 |
| P10 | 63 | C-2 | 22 | B-1 | 15 | AB block | Acryloxy group | Polyester chain | 60 | 0.45 | 18,000 |
| P11 | 63 | C-3 | 22 | B-1 | 15 | AB block | Acryloxy group | Polyester chain | 60 | 0.45 | 18,000 |
| P12 | 63 | C-1 | 22 | B-2 | 15 | AB block | Acryloxy group | Polyester chain | 60 | 0.45 | 18,000 |
| P13 | 63 | C-1 | 22 | B-3 | 15 | AB block | Acryloxy group | Polyester chain | 60 | 0.45 | 18,000 |
| P14 | 63 | C-1 | 22 | B-4 | 15 | AB block | Acryloxy group | Polyalkyleneoxy chain | 60 | 0.45 | 18,000 |
| P15 | 63 | C-1 | 22 | B-5 | 15 | AB block | Acryloxy group | Polyalkyleneoxy chain | 60 | 0.45 | 18,000 |
| P16 | 63 | C-1 | 22 | B-6 | 15 | AB block | Acryloxy group | Polyalkyleneoxy chain | 60 | 0.45 | 18,000 |
| P17 | 63 | C-1 | 22 | B-7 | 15 | AB block | Acryloxy group | Acrylic resin chain | 60 | 0.45 | 18,000 |
| P18 | 63 | C-1 | 22 | B-1 | 15 | ABA block | Acryloxy group | Polyester chain | 60 | 0.45 | 18,000 |
| P19 | 63 | C-1 | 22 | B-1 | 15 | BAB block | Acryloxy group | Polyester chain | 60 | 0.45 | 18,000 |
| P20 | 63 | C-6 | 22 | B-1 | 15 | Random | Styryl group | Polyester chain | 60 | 0.45 | 18,000 |
| P101 | 63 | C-1 | 22 | B-1 | 15 | AB block | Acryloxy group | Polyester chain | 60 | 0.45 | 18,000 |
| P102 | 63 | C-1 | 22 | B-1 | 15 | AB block | Acryloxy group | Polyester chain | 60 | 0.45 | 18,000 |

Details of the abbreviations shown in Table 2 other than those described above are shown below.

C-1: 4-hydroxybutyl acrylate glycidyl ether (4HBAGE, manufactured by Nihon Kasei CO., LTD.)

C-2: 3,4-epoxycyclohexylmethyl acrylate (manufactured by Daicel Corporation)

C-3: glycidyl acrylate (manufactured by TOKYO CHEMICAL INDUSTRY CO., LTD.)

C-4: glycidyl methacrylate (manufactured by TOKYO CHEMICAL INDUSTRY CO., LTD.)

C-5: glycidyl acrylamide (synthetic product)

C-6: 4-(chloromethyl)styrene (manufactured by TOKYO CHEMICAL INDUSTRY CO., LTD.)

Synthesis of C-5

While cooling a flask containing 150 g of N-(2-hydroxyethyl)acrylamide (manufactured by TOKYO CHEMICAL INDUSTRY CO., LTD.) and 400 g of dimethylacetamide (DMAc), 150 g chloroacetyl chloride was added dropwise to the flask. After confirming the disappearance of the raw material alcohol and the target product by $^1$H-NMR, the stirring was stopped. After adding 1,000 ml of ethyl acetate thereto, the mixture was washed with 300 mL of 3.5 mass % hydrochloric acid aqueous solution, and washed with 300 mL of 5 mass % sodium bicarbonate water, the organic layer was dried over magnesium sulfate, and the solvent was distilled off to obtain 132 g of a target product.

In addition, some specific structures of the obtained block copolymers are shown below.

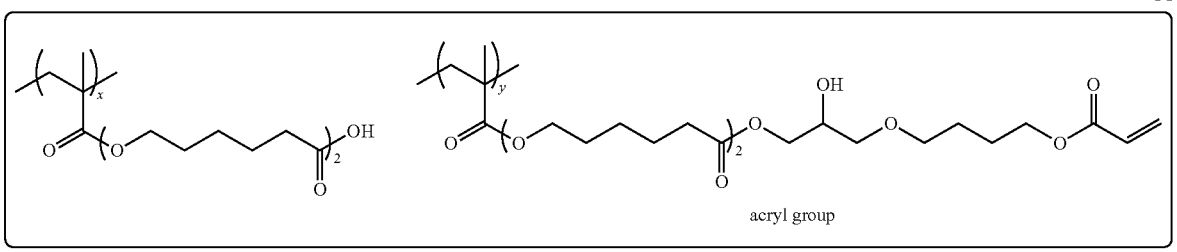

A block

P1-P7 acryl group

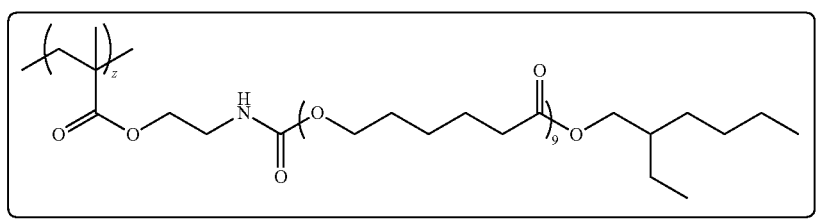

B block

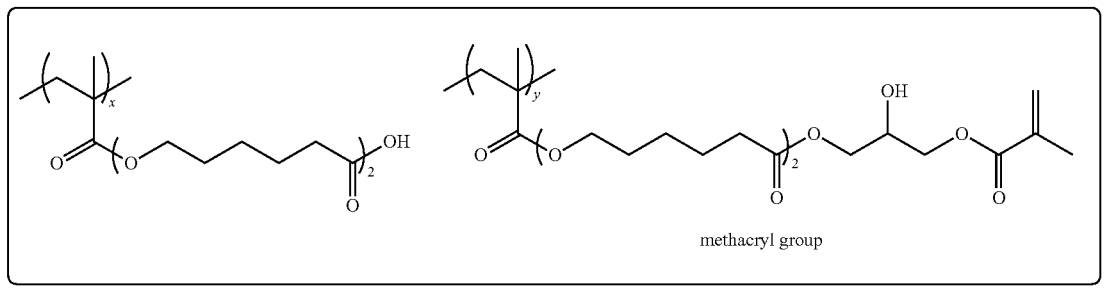

A block

P8 methacryl group

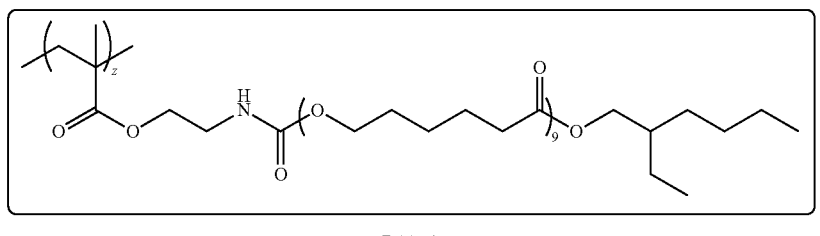

B block

-continued
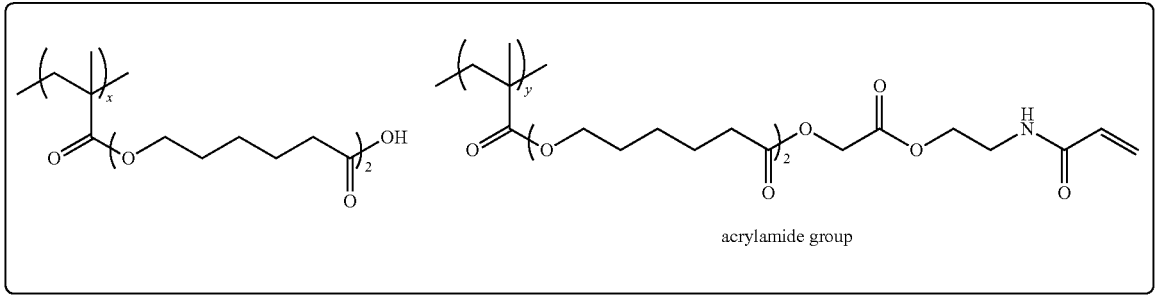
A block
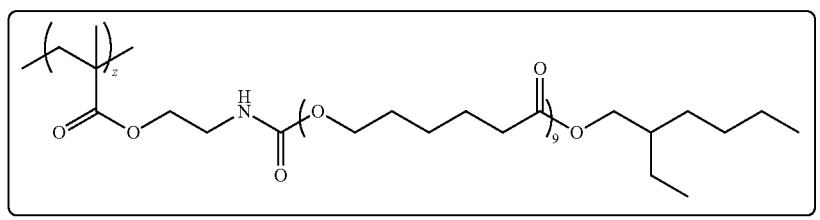
B block
P9
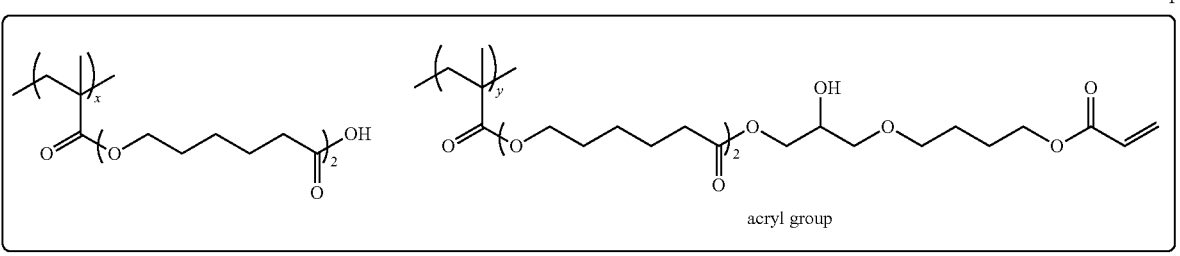
A block
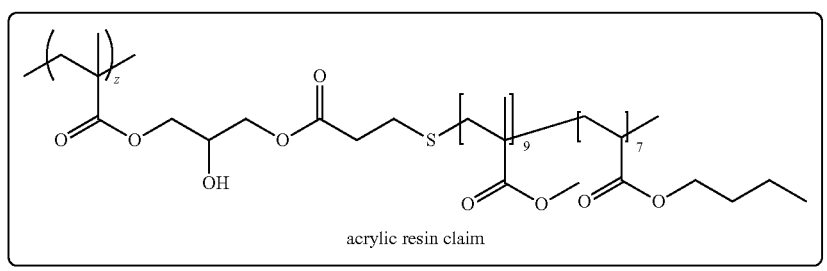
B block
P17
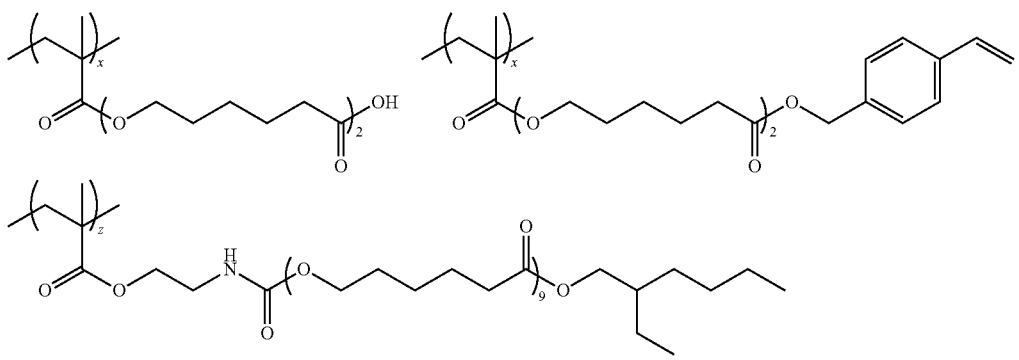
P20

<Preparation of Pigment Dispersion Liquid>

Raw materials shown in Table 3 below were mixed, and then 230 parts by mass of zirconia beads having a diameter of 0.3 mm were added thereto to perform a dispersion treatment for 5 hours using a paint shaker. Thereafter, the beads were separated by filtration to produce each pigment dispersion liquid.

TABLE 3

| Pigment dispersion liquid | Pigment Type | Pigment Part by mass | Dispersion aid Type | Dispersion aid Part by mass | Block copolymer Type | Block copolymer Part by mass | Polymerization inhibitor Type | Polymerization inhibitor Part by mass | Solvent Type | Solvent Part by mass |
|---|---|---|---|---|---|---|---|---|---|---|
| R-1 | PR254 | 12.00 | B1 | 1.39 | P1 | 4.2 | Q1 | 0.01 | J1 | 82.40 |
| R-2 | PR254 | 12.00 | B1 | 1.39 | P2 | 4.2 | Q1 | 0.01 | J1 | 82.40 |
| R-3 | PR254 | 12.00 | B1 | 1.39 | P3 | 4.2 | Q1 | 0.01 | J1 | 82.40 |
| R-4 | PR254 | 12.00 | B1 | 1.39 | P4 | 4.2 | Q1 | 0.01 | J1 | 82.40 |
| R-5 | PR254 | 12.00 | B1 | 1.39 | P5 | 4.2 | Q1 | 0.01 | J1 | 82.40 |
| R-6 | PR254 | 12.00 | B1 | 1.39 | P6 | 4.2 | Q1 | 0.01 | J1 | 82.40 |
| R-7 | PR254 | 12.00 | B1 | 1.39 | P7 | 4.2 | Q1 | 0.01 | J1 | 82.40 |
| R-8 | PR254 | 12.00 | B1 | 1.39 | P8 | 4.2 | Q1 | 0.01 | J1 | 82.40 |
| R-9 | PR254 | 12.00 | B1 | 1.39 | P9 | 4.2 | Q1 | 0.01 | J1 | 82.40 |
| R-10 | PR254 | 12.00 | B1 | 1.39 | P10 | 4.2 | Q1 | 0.01 | J1 | 82.40 |
| R-11 | PR254 | 12.00 | B1 | 1.39 | P11 | 4.2 | Q1 | 0.01 | J1 | 82.40 |
| R-12 | PR254 | 12.00 | B1 | 1.39 | P12 | 4.2 | Q1 | 0.01 | J1 | 82.40 |
| R-13 | PR254 | 12.00 | B1 | 1.39 | P13 | 4.2 | Q1 | 0.01 | J1 | 82.40 |
| R-14 | PR254 | 12.00 | B1 | 1.39 | P14 | 4.2 | Q1 | 0.01 | J1 | 82.40 |
| R-15 | PR254 | 12.00 | B1 | 1.39 | P15 | 4.2 | Q1 | 0.01 | J1 | 82.40 |
| R-16 | PR254 | 12.00 | B1 | 1.39 | P16 | 4.2 | Q1 | 0.01 | J1 | 82.40 |
| R-17 | PR254 | 12.00 | B1 | 1.39 | P17 | 4.2 | Q1 | 0.01 | J1 | 82.40 |
| R-18 | PR254 | 12.00 | B1 | 1.39 | P18 | 4.2 | Q1 | 0.01 | J1 | 82.40 |
| R-19 | PR254 | 12.00 | B1 | 1.39 | P19 | 4.2 | Q1 | 0.01 | J1 | 82.40 |
| R-20 | PR254 | 12.00 | B1 | 1.39 | P20 | 4.2 | Q1 | 0.01 | J1 | 82.40 |
| Y-1 | PY139 | 11.00 | B1 | 1.59 | P1 | 4.4 | Q1 | 0.01 | J1 | 83.01 |
| R-101 | PR254 | 12.00 | B1 | 4.39 | P1 | 1.2 | Q1 | 0.01 | J1 | 82.40 |
| R-102 | PR254 | 12.00 | B1 | 3.19 | P1 | 2.4 | Q1 | 0.01 | J1 | 82.40 |
| B-1 | PB15:6 PV23 | 10.00 2.59 | — | — | P1 | 5.38 | Q1 | 0.01 | J1 | 83.01 |
| G-1 | PG58 PY185 | 9.20 2.30 | B1 | 1.20 | P1 | 4.95 | Q1 | 0.01 | J1 | 82.34 |
| G-2 | PG36 PY150 PY185 | 12.10 1.80 0.70 | B1 | 1.20 | P1 | 4.95 | Q1 | 0.01 | J1 | 79.24 |
| G-3 | PG58 PG36 PY185 | 6.20 3.00 2.30 | B1 | 1.20 | P1 | 4.95 | Q1 | 0.01 | J1 | 82.34 |
| Bk-1 | TiON | 12.00 | — | — | P1 | 4.2 | Q1 | 0.01 | J2 | 74.90 |
| IR-1 | K1 | 11.00 | B1 | 1.59 | P1 | 6.0 | Q1 | 0.01 | J1 | 81.41 |
| IR-2 | K2 | 6.70 | K3 | 0.80 | P1 | 6.0 | Q1 | 0.01 | J1 | 86.50 |
| IR-3 | K2 | 6.70 | K3 | 0.80 | P1 | 6.0 | Q1 | 0.01 | J1 | 86.50 |
| R-1001 | PR254 | 12.00 | B1 | 1.39 | P101 | 4.2 | Q1 | 0.01 | J1 | 82.40 |
| R-1002 | PR254 | 12.00 | B1 | 1.39 | P102 | 4.2 | Q1 | 0.01 | J1 | 82.40 |

Details of the abbreviations shown in Table 3 other than those described above are shown below.

PR254: C. I. Pigment Red 254
PY139: C. I. Pigment Yellow 139
PYT50: C. I. Pigment Yellow 150
PY185: C. I. Pigment Yellow 185
PBT15:6: C. I. Pigment Blue 15:6
PV23: C. I. Pigment Violet 23
PG36: C. I. Pigment Green 36
PG58: C. I. Pigment Green 58
TiON: titanium black
K1: compound shown below
K2: compound shown below
K3: compound shown below
B1: compound shown below
Q1: 2,2,6,6-tetramethylpiperidine 1-oxyl (TEMPO)
J1: propylene glycol monomethyl ether acetate (PGMEA)
J2: cyclohexanone 85 86
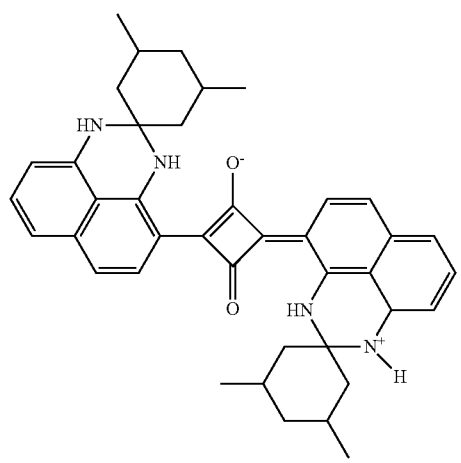
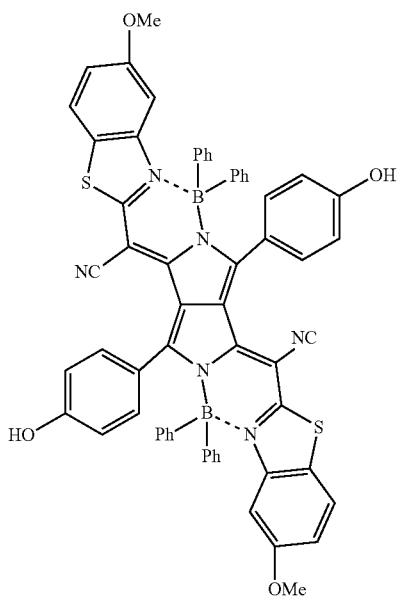
K1
K2
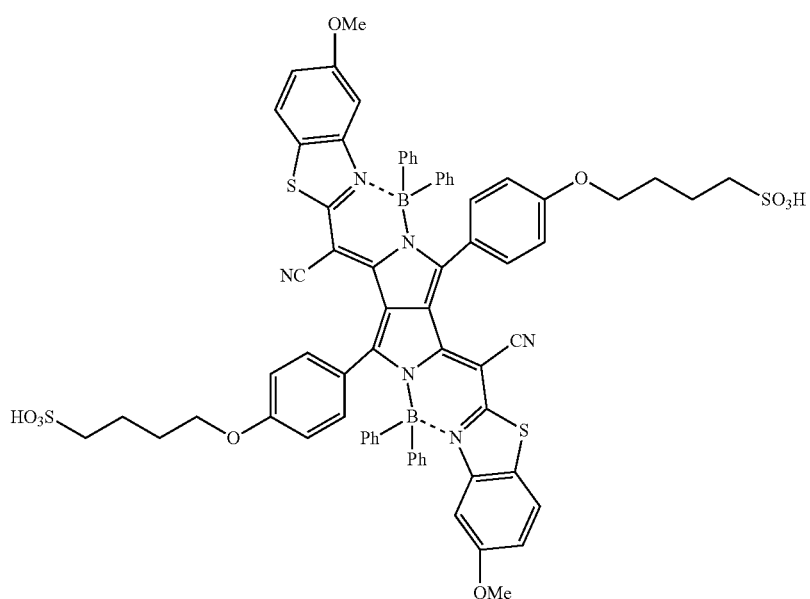
K3
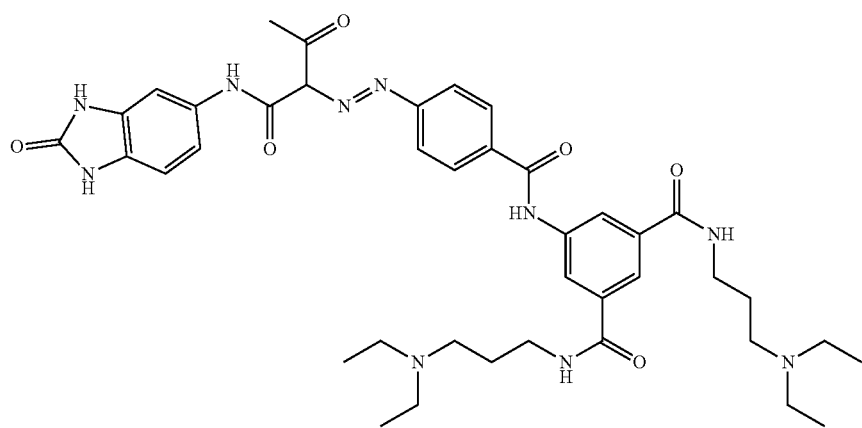
B1

Examples 1 to 48 and Comparative Examples 1 and 2

<Preparation of Curable Composition>

Each component shown in Table 4 or Table 5 below was mixed with each other in the amount shown in Table 4 or Table 5 below to prepare each curable composition.

<Evaluation>

The curable composition was evaluated by the following method. The evaluation results are shown in Table 4 or Table 5.

—Evaluation of Adhesiveness of Cured Product (Pattern)—

The curable composition obtained above was applied to an 8-inch silicon wafer previously sprayed with hexamethyldisilazane using a spin coater such that the film thickness after drying was the film thickness (μm) described, and a pre-baking was performed for 120 seconds at 100° C.

Using an i-ray stepper exposure device FPA-i5+(manufactured by Canon Inc.), the coating film in the coated substrate was irradiated with light having a wavelength of 365 nm at an exposure amount of 50 mJ/cm² to 1,700 mJ/cm² through a mask having a 1.1 μm square island pattern. After the exposure, the exposed film was developed using an alkaline developer CD-2000 (manufactured by Fujifilm Electronic Materials Co., Ltd.) at 25° C. for 40 seconds. Next, the developed film was rinsed with flowing water for 30 seconds and was dried by spraying to obtain a colored pattern.

The obtained 1.1 μm square island pattern was observed using a scanning electron microscope (S-9220, manufactured by Hitachi, Ltd.) from above the pattern to measure the size of the pattern. In addition, adhesiveness was evaluated using an optical microscope. The pattern size in a case where all the patterns were in closely attached was evaluated on a 5-point scale below.

Evaluation 3 or higher is preferable, and evaluations 4 and 5 are evaluated as having excellent performance.

5: adhesion was in a range of 0.9 μm or more and less than 1.0 μm.
4: adhesion was in a range of 1.0 μm or more and less than 1.05 μm.
3: adhesion was in a range of 1.05 μm or more and less than 1.1 μm.
2: adhesion was in a range of 1.1 μm or more and less than 1.2 μm.
1: adhesion does not occur unless 1.2 μm or more.

—Evaluation of Developability (Residue in Unexposed Area)—

The obtained curable composition was applied to a glass substrate by spin coating and dried to form a curable composition film having a film thickness of 1.0 μm. The conditions of the spin coating were first set at a rotation speed of 300 rpm (revolutions per minute) for 5 seconds, and then at 800 rpm for 20 seconds. In addition, the drying condition was set to 100° C. for 80 seconds.

Using an i-ray stepper exposure device FPA-3000 i5+ (manufactured by Canon Inc.), the coating film obtained as described above was exposed with light having a wavelength of 365 nm at an exposure amount of 10 mJ/cm² to 1,600 mJ/cm² through a pattern mask having 1 μm line and space. Next, the curable composition film after exposure was developed using a 60% CD-2000 (manufactured by Fujifilm Electronic Materials Co., Ltd.) developer at 25° C. for 60 seconds to obtain a patterned cured film. Next, the patterned cured film was rinsed with flowing water for 20 seconds and was air-dried.

In the above-described exposing step, the minimum exposure amount at which the developed pattern line width of the area irradiated with light was 1.0 μm or more was defined as the exposure sensitivity.

In the above, the cured film obtained with the minimum exposure amount (exposure sensitivity) such that the pattern line width after development was 1.0 μm or more was heated together with a glass substrate in an oven at 220° C. for 1 hour. After heating the cured film, the number of residues, on the glass substrate, in a region (unexposed area) not irradiated with light during the exposing step was observed using a scanning electron microscope (SEM) (magnification: 20,000 times), and the residue in unexposed area was evaluated. The evaluation was performed according to the following standard. In practical use, evaluation 3 or higher is preferable, and evaluations 4 and 5 are evaluated as having excellent performance.

5: pattern was formed, and no residue was observed in the unexposed area.
4: pattern was formed, and 1 to 3 residues were observed in 1.0 μm square of the unexposed area.
3: pattern was formed, and 4 to 10 residues were observed in 1.0 μm square of the unexposed area.
2: pattern was formed, and 11 or more residues were observed in 1.0 μm square of the unexposed area.
1: no pattern was formed due to poor development.

—Evaluation of Storage Stability—

The viscosity of the curable composition obtained as described above was measured by "RE-85L" manufactured by TOKI SANGYO CO., LTD. After that, the curable composition was left to stand under the conditions of 45° C. and 3 days, and then the viscosity thereof was measured again. Storage stability was evaluated according to the following evaluation standard from a viscosity difference (ΔVis) before and after leaving to stand. It can be said that the smaller the numerical value of the viscosity difference (ΔVis), the better the storage stability. The viscosity of the curable composition was measured in a state in which the temperature was adjusted to 25° C. The evaluation standard is as follows, and the evaluation results are shown in Table 4 or Table 5 below.

3: ΔVis was 0.5 mPa×s or less.
2: ΔVis was more than 0.5 mPa×s and 2.0 mPa×s or less.
1: ΔVis was more than 2.0 mPa×s.

TABLE 4

| | Pigment dispersion liquid 1 | | Pigment dispersion liquid 2 | | Photopolymerization initiator | | Polymerizable compound | | Surfactant | | Solvent | | Performance evaluation | | |
|---|---|---|---|---|---|---|---|---|---|---|---|---|---|---|---|
| | Type | Part by mass | Type | Part by mass | Type | Part by mass | Type | Part by mass | Type | Part by mass | Type | Part by mass | Adhesiveness | Developability | Storage stability |
| Example 1 | R-1 | 48.20 | Y-1 | 21.2 | I1 | 0.37 | M1 | 0.1 | H1 | 3.34 | J1 | 26.79 | 5 | 5 | 3 |
| Example 2 | R-2 | 48.20 | Y-1 | 21.2 | I1 | 0.37 | M1 | 0.1 | H1 | 3.34 | J1 | 26.79 | 4 | 5 | 3 |
| Example 3 | R-3 | 48.20 | Y-1 | 21.2 | I1 | 0.37 | M1 | 0.1 | H1 | 3.34 | J1 | 26.79 | 5 | 5 | 2 |
| Example 4 | R-4 | 48.20 | Y-1 | 21.2 | I1 | 0.37 | M1 | 0.1 | H1 | 3.34 | J1 | 26.79 | 5 | 4 | 3 |
| Example 5 | R-5 | 48.20 | Y-1 | 21.2 | I1 | 0.37 | M1 | 0.1 | H1 | 3.34 | J1 | 26.79 | 5 | 4 | 3 |
| Example 6 | R-6 | 48.20 | Y-1 | 21.2 | I1 | 0.37 | M1 | 0.1 | H1 | 3.34 | J1 | 26.79 | 5 | 5 | 2 |
| Example 7 | R-7 | 48.20 | Y-1 | 21.2 | I1 | 0.37 | M1 | 0.1 | H1 | 3.34 | J1 | 26.79 | 4 | 5 | 3 |
| Example 8 | R-8 | 48.20 | Y-1 | 21.2 | I1 | 0.37 | M1 | 0.1 | H1 | 3.34 | J1 | 26.79 | 4 | 5 | 3 |
| Example 9 | R-9 | 48.20 | Y-1 | 21.2 | I1 | 0.37 | M1 | 0.1 | H1 | 3.34 | J1 | 26.79 | 4 | 5 | 3 |
| Example 10 | R-10 | 48.20 | Y-1 | 21.2 | I1 | 0.37 | M1 | 0.1 | H1 | 3.34 | J1 | 26.79 | 4 | 5 | 3 |
| Example 11 | R-11 | 48.20 | Y-1 | 21.2 | I1 | 0.37 | M1 | 0.1 | H1 | 3.34 | J1 | 26.79 | 4 | 5 | 3 |
| Example 12 | R-12 | 48.20 | Y-1 | 21.2 | I1 | 0.37 | M1 | 0.1 | H1 | 3.34 | J1 | 26.79 | 5 | 4 | 3 |
| Example 13 | R-13 | 48.20 | Y-1 | 21.2 | I1 | 0.37 | M1 | 0.1 | H1 | 3.34 | J1 | 26.79 | 5 | 4 | 3 |
| Example 14 | R-14 | 48.20 | Y-1 | 21.2 | I1 | 0.37 | M1 | 0.1 | H1 | 3.34 | J1 | 26.79 | 5 | 4 | 3 |
| Example 15 | R-15 | 48.20 | Y-1 | 21.2 | I1 | 0.37 | M1 | 0.1 | H1 | 3.34 | J1 | 26.79 | 5 | 4 | 3 |
| Example 16 | R-16 | 48.20 | Y-1 | 21.2 | I1 | 0.37 | M1 | 0.1 | H1 | 3.34 | J1 | 26.79 | 5 | 4 | 3 |
| Example 17 | R-17 | 48.20 | Y-1 | 21.2 | I1 | 0.37 | M1 | 0.1 | H1 | 3.34 | J1 | 26.79 | 5 | 5 | 3 |
| Example 18 | R-18 | 48.20 | Y-1 | 21.2 | I1 | 0.37 | M1 | 0.1 | H1 | 3.34 | J1 | 26.79 | 5 | 5 | 3 |
| Example 19 | R-19 | 48.20 | Y-1 | 21.2 | I1 | 0.37 | M1 | 0.1 | H1 | 3.34 | J1 | 26.79 | 5 | 5 | 3 |
| Comparative example 1 | R-20 | 48.20 | Y-1 | 21.2 | I1 | 0.37 | M1 | 0.1 | H1 | 3.34 | J1 | 26.79 | 2 | 4 | 2 |
| Example 20 | R-1001 | 48.20 | Y-1 | 21.2 | I1 | 0.37 | M1 | 0.1 | H1 | 3.34 | J1 | 26.79 | 5 | 5 | 3 |
| Example 21 | R-1002 | 48.20 | Y-1 | 21.2 | I1 | 0.37 | M1 | 0.1 | H1 | 3.34 | J1 | 26.79 | 5 | 5 | 3 |

TABLE 5

| | Pigment dispersion liquid 1 | | Pigment dispersion liquid 2 | | Photopolymerization initiator | | Polymerizable compound | | Surfactant | | Solvent | | Performance evaluation | | |
|---|---|---|---|---|---|---|---|---|---|---|---|---|---|---|---|
| | Type | Part by mass | Type | Part by mass | Type | Part by mass | Type | Part by mass | Type | Part by mass | Type | Part by mass | Adhesiveness | Developability | Storage stability |
| Example 22 | R-1 | 48.20 | Y-1 | 21.2 | I1 | 0.37 | M1 | 0.1 | H1 | 3.34 | J1 | 26.79 | 4 | 4 | 2 |
| Example 23 | R-1 | 48.20 | Y-1 | 21.2 | I1 | 0.37 | M1 | 0.1 | H1 | 3.34 | J1 | 26.79 | 5 | 5 | 2 |
| Example 24 | R-1 | 48.20 | Y-1 | 21.2 | I1 | 0.37 | — | 0 | H1 | 3.44 | J1 | 26.79 | 3 | 5 | 3 |
| Example 25 | R-1 | 48.20 | Y-1 | 21.2 | I1 | 0.37 | M1 | 0.0075 | H1 | 3.43 | J1 | 26.79 | 4 | 5 | 3 |
| Example 26 | R-1 | 48.20 | Y-1 | 21.2 | I1 | 0.37 | M1 | 0.037 | H1 | 3.40 | J1 | 26.79 | 4 | 5 | 3 |
| Comparative example 2 | R-1 | 48.20 | Y-1 | 21.2 | I1 | 0.37 | M1 | 2.55 | H1 | 0.79 | J1 | 26.79 | 5 | 2 | 3 |
| Example 27 | R-1 | 48.20 | Y-1 | 21.2 | I1 | 0.37 | M3 | 0.1 | H1 | 3.34 | J1 | 26.79 | 4 | 5 | 3 |
| Example 28 | R-1 | 48.20 | Y-1 | 21.2 | I1 | 0.37 | M4 | 0.1 | H1 | 3.34 | J1 | 26.79 | 4 | 4 | 3 |
| Example 29 | R-1 | 48.20 | Y-1 | 21.2 | I1 | 0.37 | M5 | 0.1 | H1 | 3.34 | J1 | 26.79 | 4 | 5 | 3 |
| Example 30 | R-1 | 48.20 | Y-1 | 21.2 | I1 | 0.37 | M1/M3 = 3/1 | 0.1 | H1 | 3.34 | J1 | 26.79 | 5 | 5 | 3 |
| Example 31 | R-1 | 48.20 | Y-1 | 21.2 | I1 | 0.37 | M1/M4 = 3/1 | 0.1 | H1 | 3.34 | J1 | 26.79 | 5 | 4 | 3 |
| Example 32 | R-1 | 48.20 | Y-1 | 21.2 | I1 | 0.37 | M1/M5 = 3/1 | 0.1 | H1 | 3.34 | J1 | 26.79 | 5 | 5 | 3 |
| Example 33 | R-1 | 48.20 | Y-1 | 21.2 | I2 | 0.37 | M3 | 0.1 | H1 | 3.34 | J1 | 26.79 | 5 | 5 | 3 |
| Example 34 | R-1 | 48.20 | Y-1 | 21.2 | I3 | 0.37 | M3 | 0.1 | H1 | 3.34 | J1 | 26.79 | 5 | 5 | 3 |
| Example 35 | R-1 | 48.20 | Y-1 | 21.2 | I4 | 0.37 | M3 | 0.1 | H1 | 3.34 | J1 | 26.79 | 5 | 5 | 3 |
| Example 36 | R-1 | 48.20 | Y-1 | 21.2 | I5 | 0.37 | M3 | 0.1 | H1 | 3.34 | J1 | 26.79 | 5 | 5 | 3 |
| Example 37 | R-1 | 48.20 | Y-1 | 21.2 | I1/I6 = 1/1 | 0.37 | M3 | 0.1 | H1 | 3.34 | J1 | 26.79 | 5 | 5 | 3 |
| Example 38 | R-1 | 48.20 | Y-1 | 21.2 | I1 | 0.37 | M1 | 0.1 | H1 | 3.34 | J1/J2 = 1/1 | 26.79 | 5 | 4 | 3 |
| Example 39 | R-1 | 48.20 | Y-1 | 21.2 | I1 | 0.37 | M1 | 0.1 | H1 | 3.34 | J1/J3 = 1/1 | 26.79 | 5 | 4 | 3 |
| Example 40 | R-1 | 48.20 | Y-1 | 21.2 | I1 | 0.37 | M1 | 0.1 | H1 | 3.34 | J1/J4 = 1/1 | 26.79 | 5 | 4 | 3 |
| Example 41 | B-1 | 71.30 | — | — | I1 | 0.37 | M1 | 0.1 | H1 | 3.24 | J1 | 24.99 | 5 | 5 | 3 |
| Example 42 | G-1 | 65.00 | — | — | I1 | 0.37 | M1 | 0.3 | H1 | 3.34 | J1 | 30.99 | 5 | 5 | 3 |
| Example 43 | G-2 | 68.00 | — | — | I1 | 0.37 | M1 | 0.3 | H1 | 3.34 | J1 | 27.99 | 5 | 5 | 3 |
| Example 44 | G-3 | 68.00 | — | — | I1 | 0.37 | M1 | 0.4 | H1 | 3.34 | J1 | 27.89 | 5 | 5 | 3 |

TABLE 5-continued

| | Pigment dispersion liquid 1 | | Pigment dispersion liquid 2 | | Photopoly-merization initiator | | Polymerizable compound | | Surfactant | | Solvent | | Performance evaluation | | |
|---|---|---|---|---|---|---|---|---|---|---|---|---|---|---|---|
| | Type | Part by mass | Type | Part by mass | Type | Part by mass | Type | Part by mass | Type | Part by mass | Type | Part by mass | Adhesive-ness | Develop-ability | Storage stability |
| Example 45 | Bk-1 | 65.00 | — | — | I1 | 0.37 | M1 | 0.8 | H1 | 3.34 | J1 | 30.49 | 5 | 5 | 3 |
| Example 46 | IR-1 | 65.00 | — | — | I1 | 0.37 | M1 | 0.8 | H1 | 3.34 | J1 | 30.49 | 5 | 5 | 3 |
| Example 47 | IR-2 | 65.00 | — | — | I1 | 0.37 | M1 | 0.8 | H1 | 3.34 | J1 | 30.49 | 5 | 5 | 3 |
| Example 48 | IR-3 | 65.00 | — | — | I1 | 0.37 | M1 | 0.8 | H1 | 3.34 | J1 | 30.49 | 5 | 5 | 3 |

From the results shown in Tables 4 and 5, the curable composition according to the embodiment of the present disclosure has excellent developability and adhesiveness of a cured product to be obtained.

In addition, as shown in Examples 1, 20, and 21, the same result was obtained in a case where the specific block copolymer was produced by using various polymerization methods.

Details of the abbreviations shown in Table 4 or Table 5 other than those described above are shown below.

I2: oxime-based polymerization initiator, IRGACURE OXE-03 (manufactured by BASF)

I3: oxime-based polymerization initiator, IRGACURE OXE-04 (manufactured by BASF)

I4: compound shown below

I5: oxime-based polymerization initiator, ADEKA ARKLS NCI-831 (manufactured by ADEKA Corporation, containing a nitro group)

I6: 2-benzyl-2-dimethylamino-1-(4-morpholinophenyl)-1-butanone, IRGACURE 369 (manufactured by BASF)

M1: compound shown below, in which a+b+c=3

M2: compound shown below, in which a+b+c=4

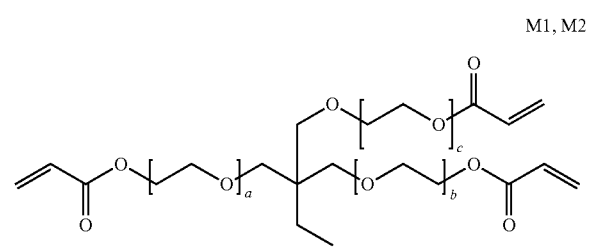

M1, M2

M3: KAYARAD DPHA (mixture of dipentaerythritol hexaacrylate and dipentaerythritol pentaacrylate, manufactured by Nippon Kayaku Co., Ltd.)

M4: UA-7200 (urethane acrylate, manufactured by Shin-Nakamura Chemical Co., Ltd.)

M5: compound shown below

H1: fluorine-based surfactant, MEGAFACE F-781F (manufactured by DIC Corporation)

J3: cyclopentanone

J4: propylene glycol monomethyl ether (PGME)

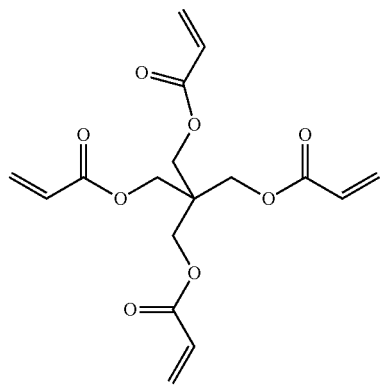

M5

Examples 101 to 144

Any one of a Green composition, a Blue composition, or a Red composition was applied by a spin coating method so that the film thickness after film formation was 1.0 μm, considering that the color did not overlap with the above-described curable composition. For example, the color of the curable compositions of Examples 1 to 40 is red, the color of the curable composition of Example 41 is blue, and the color of the curable compositions of Examples 42 to 44 is green.

Next, the coating film was heated using a hot plate at 100° C. for 2 minutes. Next, using an i-ray stepper exposure device FPA-3000 i5+(manufactured by Canon Inc.), exposure was performed with light having an exposure dose of 1,000 mJ/cm² through a mask having a dot pattern of 2 m square. Next, puddle development was performed at 23° C. for 60 seconds using a tetramethylammonium hydroxide (TMAH) 0.3 mass % aqueous solution. Next, the coating film was rinsed by spin showering and was cleaned with pure water. Next, by heating at 200° C. for 5 minutes using a hot plate, the remaining two of the Green composition, the Blue composition, and the Red composition were sequentially patterned on the pattern of the infrared cut filter in the same manner to form red, green, and blue colored patterns (Bayer pattern).

The Bayer pattern refers to a pattern, as disclosed in the specification of U.S. Pat. No. 3,971,065A, in which a 2×2 array of color filter element having one Red element, two Green elements, and one Blue element is repeated.

Regarding the obtained solid image pickup element, images were acquired to evaluate the imaging performance. In a case where any of the compositions obtained in Examples 1 to 44 was used, the image could be clearly recognized even in a low-illuminance environment.

The Red composition, the Green composition, the Blue composition, and the composition for forming an infrared transmitting filter used in Examples 101 to 144 are as follows.

—Red Composition—

The following components were mixed and stirred, and the obtained mixture was filtered through a nylon filter (manufactured by Nihon Pall Corporation) having a pore size of 0.45 μm to prepare a Red composition.

Red pigment dispersion liquid: 51.7 parts by mass
Resin 4 (40 mass % PGMEA solution): 0.6 parts by mass
Polymerizable compound 4: 0.6 parts by mass
Photopolymerization initiator 1: 0.3 parts by mass
Surfactant 1: 4.2 parts by mass
PGMEA: 42.6 parts by mass —Green Composition—

The following components were mixed and stirred, and the obtained mixture was filtered through a nylon filter (manufactured by Nihon Pall Corporation) having a pore size of 0.45 μm to prepare a Green composition.

Green pigment dispersion liquid: 73.7 parts by mass
Resin A (40 mass % PGMEA solution): 0.3 parts by mass
Polymerizable compound 1: 1.2 parts by mass
Photopolymerization initiator 1: 0.6 parts by mass
Surfactant 1: 4.2 parts by mass
Ultraviolet absorber (UV-503, manufactured by Daito Chemical Co., Ltd.): 0.5 parts by mass
PGMEA: 19.5 parts by mass —Blue Composition—

The following components were mixed and stirred, and the obtained mixture was filtered through a nylon filter (manufactured by Nihon Pall Corporation) having a pore size of 0.45 μm to prepare a Blue composition.

Blue pigment dispersion liquid: 44.9 parts by mass
Resin A (40 mass % PGMEA solution): 2.1 parts by mass
Polymerizable compound 1: 1.5 parts by mass
Polymerizable compound 4: 0.7 parts by mass
Photopolymerization initiator 1: 0.8 parts by mass
Surfactant 1: 4.2 parts by mass
PGMEA: 45.8 parts by mass Raw materials used in the Red composition, the Green composition, and the Blue composition are as follows.

Red Pigment Dispersion Liquid

A mixed solution consisting of 9.6 parts by mass of C. I. Pigment Red 254, 4.3 parts by mass of C. I. Pigment Yellow 139, 6.8 parts by mass of a dispersant (Disperbyk-161, manufactured by BYK Chemie), and 79.3 parts by mass of PGMEA was mixed and dispersed using a beads mill (zirconia beads; diameter: 0.3 mm) for 3 hours to prepare a pigment dispersion liquid. Next, using a high-pressure disperser NANO-3000-10 (manufactured by Nippon BEE Chemical Co., Ltd.) equipped with a pressure reducing mechanism, the pigment dispersion liquid was further dispersed under a pressure of 2,000 kg/cm$^3$ at a flow rate of 500 g/min. This dispersion treatment was repeated 10 times. As a result, a Red pigment dispersion liquid was obtained.

Green Pigment Dispersion Liquid

A mixed solution consisting of 6.4 parts by mass of C. I. Pigment Green 36, 5.3 parts by mass of C. I. Pigment Yellow 150, 5.2 parts by mass of a dispersant (Disperbyk-161, manufactured by BYK Chemie), and 83.1 parts by mass of PGMEA was mixed and dispersed using a beads mill (zirconia beads; diameter: 0.3 mm) for 3 hours to prepare a pigment dispersion liquid. Next, using a high-pressure disperser NANO-3000-10 (manufactured by Nippon BEE Chemical Co., Ltd.) equipped with a pressure reducing mechanism, the pigment dispersion liquid was further dispersed under a pressure of 2,000 kg/cm$^3$ at a flow rate of 500 g/min. This dispersion treatment was repeated 10 times. As a result, a Green pigment dispersion liquid was obtained.

Blue Pigment Dispersion Liquid

A mixed solution consisting of 9.7 parts by mass of C. I. Pigment Blue 15:6, 2.4 parts by mass of C. I. Pigment Violet 23, 5.5 parts by mass of a dispersant (Disperbyk-161, manufactured by BYK Chemie), and 82.4 parts of PGMEA was mixed and dispersed using a beads mill (zirconia beads; diameter: 0.3 mm) for 3 hours to prepare a pigment dispersion liquid. Next, using a high-pressure disperser NANO-3000-10 (manufactured by Nippon BEE Chemical Co., Ltd.) equipped with a pressure reducing mechanism, the pigment dispersion liquid was further dispersed under a pressure of 2,000 kg/cm$^3$ at a flow rate of 500 g/min. This dispersion treatment was repeated 10 times. As a result, a Blue pigment dispersion liquid was obtained.

Polymerizable compound 1: KAYARAD DPHA (mixture of dipentaerythritol hexaacrylate and dipentaerythritol pentaacrylate, manufactured by Nippon Kayaku Co., Ltd.)

Polymerizable compound 4: following structure

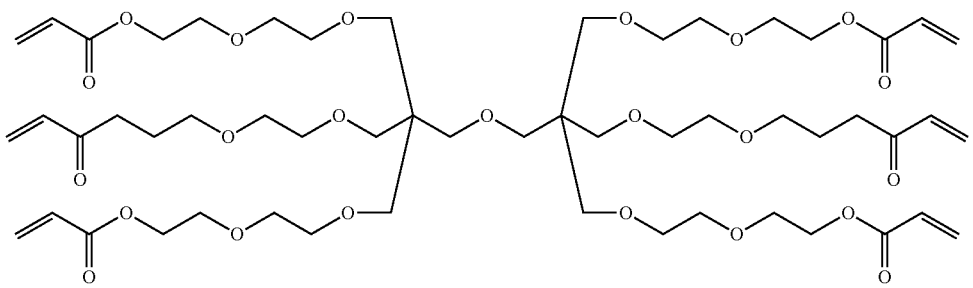 [SMILES: C=CC(=O)CCCOCCOCC(COCCOCCOC(=O)C=C)(COCCOCCOC(=O)C=C)COCC(COCCOCCCC(=O)C=C)(COCCOCCOC(=O)C=C)COCCOCCOC(=O)C=C]

Resin 4: following structure (acid value: 70 mgKOH/g, Mw=11,000; a ratio in a constitutional unit is a molar ratio)

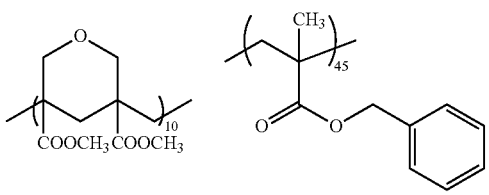

-continued

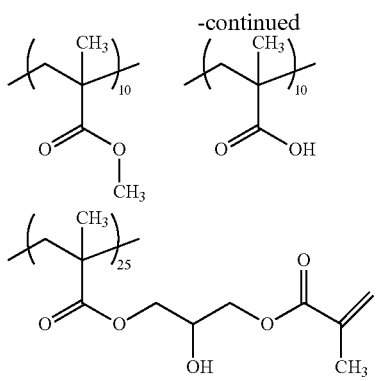

Photopolymerization initiator 1: IRGACURE-OXE01 (1-[4-(phenylthio)]-1,2-octanedione-2-(O-benzoyloxime), manufactured by BASF)

Surfactant 1: 1 mass % PGMEA solution of the following mixture (Mw: 14,000; in the following formula, the unit of % (62% and 38%) indicating the proportion of a constitutional unit is mass %)

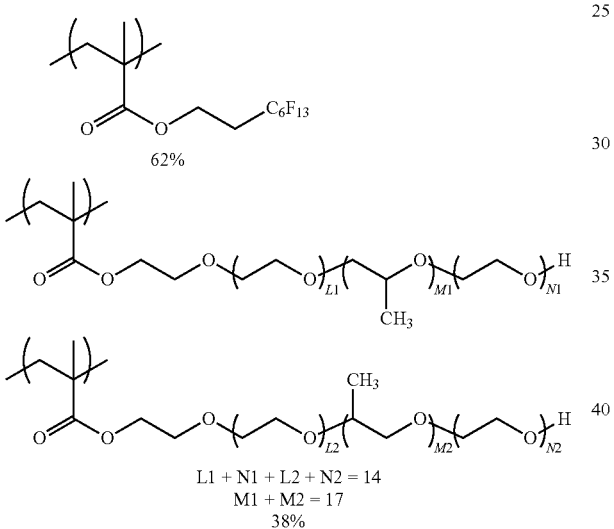

The disclosure of Japanese Patent Application No. 2019-061005 filed on Mar. 27, 2019 and the disclosure of Japanese Patent Application No. 2020-008312 filed on Jan. 22, 2020 are incorporated in the present specification by reference.

All documents, patent applications, and technical standards described in the present specification are incorporated herein by reference to the same extent as in a case of being specifically and individually noted that individual documents, patent applications, and technical standards are incorporated by reference.

What is claimed is:

1. A curable composition comprising:
a block copolymer including a block A which has a constitutional unit having an ethylenically unsaturated group in a side chain;
a pigment; and
a photopolymerization initiator,
wherein a content of a polymerizable compound is 15 mass % or less with respect to a total solid content of the curable composition,
wherein the constitutional unit having an ethylenically unsaturated group in a side chain in the block A includes a constitutional unit represented by Formula (1),
wherein the block copolymer further includes a block B which has a constitutional unit having a steric repulsive group in a side chain, and
wherein the steric repulsive group is a group having 20 carbon atoms to 200 carbon atoms,

in Formula (1), $R^1$ represents a hydrogen atom, a halogen atom, or an alkyl group, $X^1$ and $X^2$ each independently represent a single bond or a divalent linking group, $L^1$ represents a polyether chain, a polyester chain, a polyamide chain, a polyimide chain, a polyimine chain, a polyurethane chain, or a resin chain in which two or more of these resin chains are combined, and $Z^1$ represents an ethylenically unsaturated group.

2. The curable composition according to claim 1, wherein the pigment is a pigment having a maximal absorption wavelength in a wavelength range of 400 nm to 2,000 nm.

3. The curable composition according to claim 1, wherein the pigment is a pigment having a maximal absorption wavelength in a wavelength range of 400 nrn to 700 nm.

4. The curable composition according to claim 1, wherein the pigment includes a red pigment.

5. The curable composition according to claim 1, wherein a content of the block A is 40 mass % to 95 mass % with respect to a total mass of the block copolymer.

6. The curable composition according to claim 1, wherein a content of the constitutional unit represented by Formula (1) is 0.1 mass % to 50 mass % with respect to a total mass of the block A.

7. The curable composition according to claim 1, wherein the ethylenically unsaturated group in the constitutional unit having an ethylenically unsaturated group in a side chain is an acryloxy group.

8. The curable composition according to claim 1, wherein the block B includes an acrylic resin chain.

9. The curable composition according to claim 1, wherein a weight-average molecular weight of the block copolymer is 8,000 to 30,000.

10. The curable composition according to claim 1, wherein an acid value of the block copolymer is 20 mgKOH/g to 200 mgKOH/g.

11. The curable composition according to claim 1, wherein an ethylenically unsaturated bonding value of the block copolymer is 0.1 mmol/g to 1.0 mmol/g.

12. A cured product obtained by curing the curable composition according to claim 1.

13. A color filter comprising:
the cured product according to claim 12.

14. A solid-state imaging element comprising:
the color filter according to claim 13.

15. An image display device comprising:
the color filter according to claim 13.

* * * * *